US011833611B2

(12) United States Patent
Sakamoto et al.

(10) Patent No.: US 11,833,611 B2
(45) Date of Patent: Dec. 5, 2023

(54) LASER MACHINING DEVICE

(71) Applicant: HAMAMATSU PHOTONICS K.K., Hamamatsu (JP)

(72) Inventors: Takeshi Sakamoto, Hamamatsu (JP); Junji Okuma, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 22 days.

(21) Appl. No.: 17/289,011

(22) PCT Filed: Oct. 30, 2019

(86) PCT No.: PCT/JP2019/042616
§ 371 (c)(1),
(2) Date: Apr. 27, 2021

(87) PCT Pub. No.: WO2020/090909
PCT Pub. Date: May 7, 2020

(65) Prior Publication Data
US 2021/0402516 A1 Dec. 30, 2021

(30) Foreign Application Priority Data
Oct. 30, 2018 (JP) .................... 2018-204114

(51) Int. Cl.
*B23K 26/08* (2014.01)
*B23K 26/351* (2014.01)
(Continued)

(52) U.S. Cl.
CPC ...... *B23K 26/0823* (2013.01); *B23K 26/0604* (2013.01); *B23K 26/0853* (2013.01);
(Continued)

(58) Field of Classification Search
CPC ............ B23K 26/0604; B23K 26/0622; B23K 26/0876; B23K 37/0235; B23K 26/0006
See application file for complete search history.

(56) References Cited

U.S. PATENT DOCUMENTS 7,981,770 B2    7/2011  Kaneko
8,604,381 B1 *  12/2013 Shin ................. B23K 26/0093
                                                219/121.64
(Continued)

FOREIGN PATENT DOCUMENTS

CN    1491144 A    4/2004
CN    1902023 A    1/2007
(Continued)

OTHER PUBLICATIONS

International Preliminary Reporton Patentability dated May 14, 2021 for PCT/JP2019/042584.
(Continued)

*Primary Examiner* — Thien S Tran
(74) *Attorney, Agent, or Firm* — Faegre Drinker Biddle & Reath LLP

(57) ABSTRACT

A laser processing apparatus includes a support portion, a laser processing head, a vertical movement mechanism, a horizontal movement mechanism, and a controller. The controller controls starting and stopping of emission of a laser light from the laser processing head based on rotation information in a state where a focusing point is positioned at a position along a circumferential edge of an effective region in a target, while rotating the support portion, to perform a circumferential edge process for forming a modified region along the circumferential edge of the effective region in the target.

14 Claims, 42 Drawing Sheets

(51) Int. Cl.
B23K 26/06 (2014.01)
B23K 101/40 (2006.01)

(52) U.S. Cl.
CPC ........ B23K 26/0884 (2013.01); B23K 26/351 (2015.10); *B23K 2101/40* (2018.08)

(56) References Cited

U.S. PATENT DOCUMENTS

| | | | |
|---|---|---|---|
| 8,730,568 B2 | 5/2014 | Tong et al. | |
| 9,071,037 B2 | 6/2015 | Gu et al. | |
| 9,878,397 B2 | 1/2018 | Hirata et al. | |
| 10,388,526 B1 | 4/2019 | Seddon et al. | |
| 2011/0139759 A1* | 6/2011 | Millman, Jr. | B23K 26/0823 |
| | | | 219/121.72 |
| 2012/0091107 A1 | 4/2012 | Sugiura | |
| 2012/0100785 A1* | 4/2012 | Ishimasa | H01L 21/02021 |
| | | | 451/41 |
| 2013/0248500 A1 | 9/2013 | Shreter et al. | |
| 2017/0120374 A1 | 5/2017 | Hendricks et al. | |
| 2018/0076043 A1* | 3/2018 | Ito | B23K 26/0823 |
| 2018/0076060 A1 | 3/2018 | Oh et al. | |
| 2018/0154572 A1 | 6/2018 | Richter et al. | |
| 2018/0254223 A1 | 9/2018 | Hirata et al. | |
| 2019/0001433 A1* | 1/2019 | Yamamoto | B23K 26/0006 |
| 2019/0039185 A1* | 2/2019 | Nayuki | B23K 26/0821 |

FOREIGN PATENT DOCUMENTS

| | | |
|---|---|---|
| CN | 101024260 A | 8/2007 |
| CN | 101251725 A | 8/2008 |
| CN | 101297050 A | 10/2008 |
| CN | 101878090 A | 11/2010 |
| CN | 101965242 A | 2/2011 |
| CN | 102574245 A | 7/2012 |
| CN | 102665999 A | 9/2012 |
| CN | 102990230 A | 3/2013 |
| CN | 104439696 A | 3/2015 |
| CN | 104641286 A | 5/2015 |
| CN | 104768698 A | 7/2015 |
| CN | 105189025 A | 12/2015 |
| CN | 105324207 A | 2/2016 |
| CN | 105689888 A | 6/2016 |
| CN | 107123588 A | 9/2017 |
| CN | 107452678 A | 12/2017 |
| CN | 107863293 A | 3/2018 |
| CN | 107995996 A | 5/2018 |
| DE | 102013223637 A1 | 5/2015 |
| DE | 102014204347 A1 | 9/2015 |
| JP | H06-007979 A | 1/1994 |
| JP | H10-258376 A | 9/1998 |
| JP | 2002-131559 A | 5/2002 |
| JP | 2004-111606 A | 4/2004 |
| JP | 2004-111946 A | 4/2004 |
| JP | 2005-294656 A | 10/2005 |
| JP | 2006-167804 A | 6/2006 |
| JP | 2006-315033 A | 11/2006 |
| JP | 2007-165848 A | 6/2007 |
| JP | 2007-180565 A | 7/2007 |
| JP | 2007-229773 A | 9/2007 |
| JP | 2008-087026 A | 4/2008 |
| JP | 2009-172668 A | 8/2009 |
| JP | 2010-000542 A | 1/2010 |
| JP | 2010-082644 A | 4/2010 |
| JP | 2010-153590 A | 7/2010 |
| JP | 2010-167433 A | 8/2010 |
| JP | 2011-056576 A | 3/2011 |
| JP | 2011-167718 A | 9/2011 |
| JP | 2011167718 A * | 9/2011 |
| JP | 2012-130952 A | 7/2012 |
| JP | 2013-049161 A | 3/2013 |
| JP | 2013-055084 A | 3/2013 |
| JP | 2013-141701 A | 7/2013 |
| JP | 2014-033163 A | 2/2014 |
| JP | 5456510 B2 | 4/2014 |
| JP | 2014-091642 A | 5/2014 |
| JP | 2015-012015 A | 1/2015 |
| JP | 2015-074003 A | 4/2015 |
| JP | 2015-536896 A | 12/2015 |
| JP | 2016-025188 A | 2/2016 |
| JP | 2016-032828 A | 3/2016 |
| JP | 2016-043558 A | 4/2016 |
| JP | 2016-513016 A | 5/2016 |
| JP | 2016-168606 A | 9/2016 |
| JP | 6064519 B2 | 1/2017 |
| JP | 2017-034200 A | 2/2017 |
| JP | 2017-056469 A | 3/2017 |
| JP | 2017-064746 A | 4/2017 |
| JP | 2017-071074 A | 4/2017 |
| JP | 6127526 B2 | 5/2017 |
| JP | 2017-131942 A | 8/2017 |
| JP | 2017-131944 A | 8/2017 |
| JP | 2017-526161 A | 9/2017 |
| JP | 2017-528322 A | 9/2017 |
| JP | 2017-204574 A | 11/2017 |
| JP | 6241174 B2 | 12/2017 |
| JP | 2018-098464 A | 6/2018 |
| JP | 2018-133484 A | 8/2018 |
| JP | 2018-147928 A | 9/2018 |
| JP | 7133633 B2 | 8/2022 |
| JP | 7157816 A | 10/2022 |
| KR | 20050078187 A | 8/2005 |
| KR | 1020180073306 A | 7/2018 |
| TW | 201214566 A | 4/2012 |
| TW | 201703912 A | 2/2017 |
| TW | 201718155 A | 6/2017 |
| TW | 201735171 A | 10/2017 |
| TW | 201838001 A | 10/2018 |
| WO | WO 2005/102638 A1 | 11/2005 |
| WO | WO-2011/030802 A1 | 3/2011 |
| WO | WO-2014/075995 A2 | 5/2014 |
| WO | WO-2014/121261 A1 | 8/2014 |
| WO | WO-2015/052218 A1 | 4/2015 |
| WO | WO-2016/005455 A1 | 1/2016 |
| WO | WO-2016/083610 A2 | 6/2016 |
| WO | WO-2017/030039 A1 | 2/2017 |
| WO | WO 2019/176589 A1 | 9/2019 |
| WO | WO 2020/054504 A1 | 3/2020 |
| WO | WO 2020/084909 A1 | 4/2020 |
| WO | WO 2020/129730 A1 | 6/2020 |

OTHER PUBLICATIONS

International Preliminary Reporton Patentability dated May 14, 2021 for PCT/JP2019/042600.
International Preliminary Reporton Patentability dated May 14, 2021 for PCT/JP2019/042602.
International Preliminary Reporton Patentability dated May 14, 2021 for PCT/JP2019/042610.
International Preliminary Reporton Patentability dated May 14, 2021 for PCT/JP2019/042616.
International Preliminary Reporton Patentability dated May 14, 2021 for PCT/JP2019/042627.
International Preliminary Reporton Patentability dated May 14, 2021 for PCT/JP2019/042662.
International Preliminary Reporton Patentability dated May 14, 2021 for PCT/JP2019/042635.
International Preliminary Reporton Patentability dated May 14, 2021 for PCT/JP2019/042589.

* cited by examiner

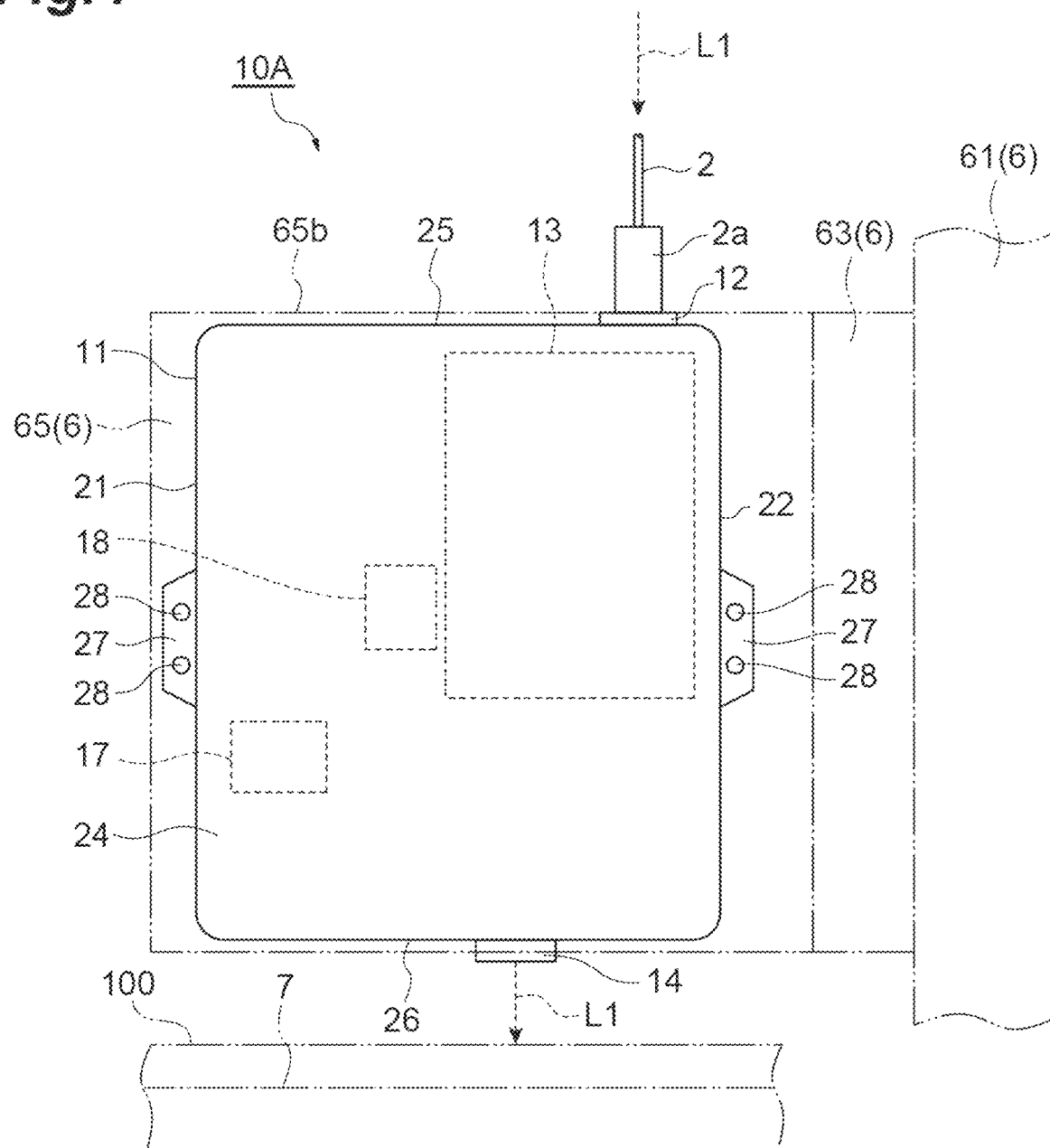
Fig.4
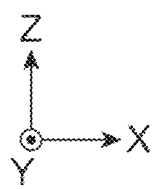

Fig.33
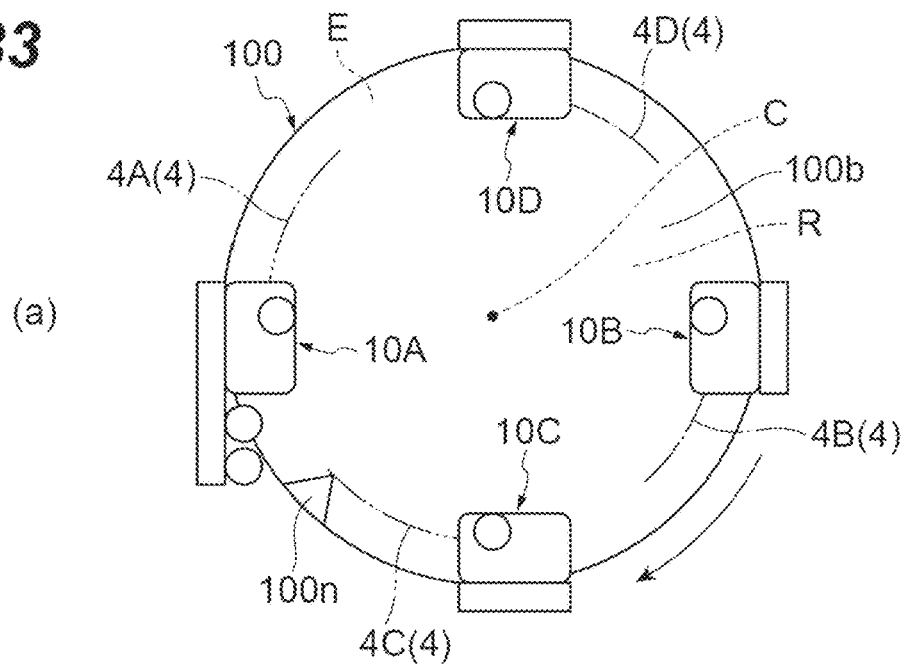
(a)
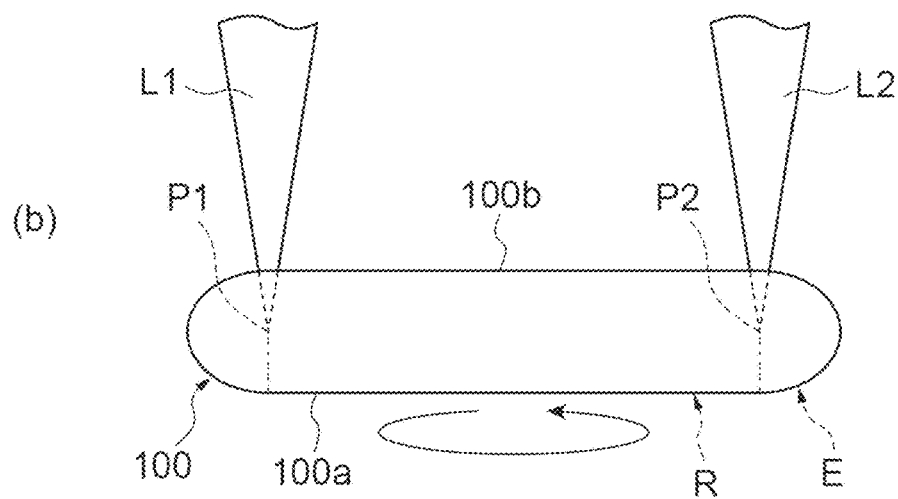
(b)
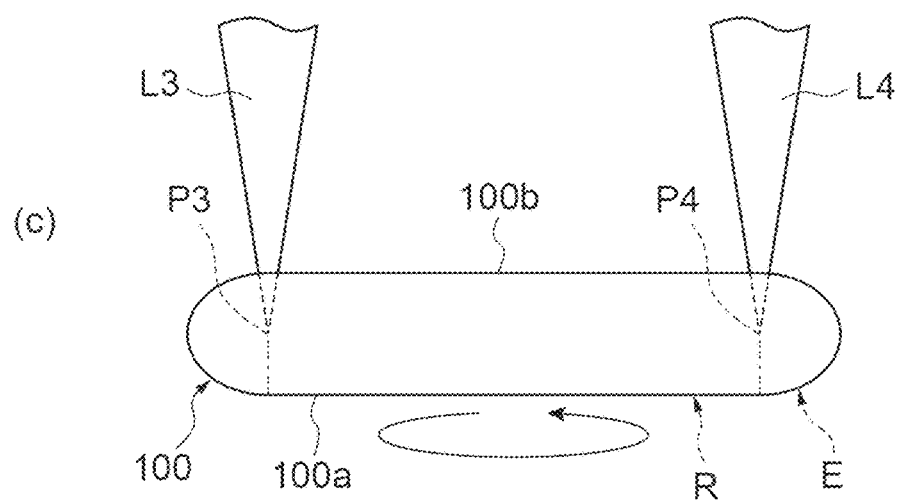
(c)

LASER MACHINING DEVICE

TECHNICAL FIELD

One aspect of the present invention relates to a laser processing apparatus.

BACKGROUND ART

Patent Literature 1 describes a laser processing apparatus including a holding mechanism for holding a workpiece and a laser irradiation mechanism for irradiating the workpiece held by the holding mechanism with a laser light. In the laser processing apparatus described in Patent Literature 1, the laser irradiation mechanism including a condensing lens is fixed to a base, and the holding mechanism moves the workpiece in a direction orthogonal to the optical axis of the condensing lens.

CITATION LIST

Patent Literature

Patent Literature 1: Japanese Patent No. 5456510

SUMMARY OF INVENTION

Technical Problem

For example, the manufacture of semiconductor devices such as image sensors may include trimming processing such as removal of an unnecessary portion of a target. A blade dicer is typically used in such trimming processing, in which case, cracks or the like starting from chipping may occur in the target, whereby accurate trimming processing may be difficult to achieve.

Thus, an object of one aspect of the present invention is to provide a laser processing apparatus capable of accurately performing trimming processing.

Solution to Problem

A laser processing apparatus according to one aspect of the present invention includes: a support portion on which a target is placed, the support portion being rotatable about an axis along a vertical direction; a laser processing head configured to irradiate the target placed on the support portion with a laser light, to form a modified region in the target; a vertical movement mechanism configured to move at least one of the support portion and the laser processing head to move a focusing point of the laser light along the vertical direction; a horizontal movement mechanism configured to move at least one of the support portion and the laser processing head to move the focusing point along a horizontal direction; and a controller configured to control, based on rotation information on a rotation amount of the support portion, rotation of the support portion, emission of the laser light from the laser processing head, and movement of the focusing point. The controller performs a circumferential edge process in which starting and stopping of the emission of the laser light from the laser processing head is controlled based on the rotation information with the focusing point positioned at a position along a circumferential edge of an effective region in the target while rotating the support portion, to form the modified region along the circumferential edge of the effective region in the target, the circumferential edge process being a process in trimming processing.

In the circumferential edge process performed by this laser processing apparatus, the emission of the laser light is started and stopped using the rotation information on the rotation amount of the support portion. With this configuration, when the modified region is formed along the circumferential edge of the effective region in the target, the modified region can be accurately controlled so as not to be formed in an overlapping manner (that is, so as not to emit laser lights redundantly onto the same portion). The trimming processing can be accurately performed.

In the laser processing apparatus according to one aspect of the present invention, in the circumferential edge process, the emission of the laser light from the laser processing head may start after the horizontal movement mechanism has been driven to position the focusing point at a position on an inner side of an outer edge of the target.

In the laser processing apparatus according to one aspect of the present invention, the circumferential edge process may include a process of achieving a state where the emission of the laser light is stopped at least when the support portion makes a single turn after the emission of the laser light has started.

In the laser processing apparatus according to one aspect of the present invention, the controller may be configured to be capable of having information on a position of the circumferential edge of the effective region in the target set.

In the laser processing apparatus according to one aspect of the present invention, in the circumferential edge process, the emission of the laser light from the laser processing head may be started and stopped in a state where a rotation speed of the support portion is constant. Thus, a constant pitch between a plurality of modified spots (interval between adjacent modified spots) included in the modified region formed by the circumferential edge process can be achieved.

In the laser processing apparatus according to one aspect of the present invention, the circumferential edge process may include a first orbit process in which the laser light is emitted with the focusing point of the laser light positioned at a predetermined position in the vertical direction while rotating the support portion, and the emission of the laser light stops when the support portion makes a single turn after the emission of the laser light has started, to form the modified region in an annular shape along the circumferential edge of the effective region. With the first orbit process, modified regions in an annular shape can be each formed along a single turn along the circumferential edge without overlapping each other, at a predetermined position in the vertical direction of the target, along the circumferential edge of the effective region.

In the laser processing apparatus according to one aspect of the present invention, the first orbit process may include at least one of a first process of forming the modified region in an annular shape along a circumferential edge of the effective region on an opposite side of a laser light incident side in the vertical direction, and a second process of forming the modified region in an annular shape along a circumferential edge of the effective region on the laser light incident side in the vertical direction. With this configuration, at least one of one side and the other side of the effective region in the vertical direction, cracks extending from the modified region can reach the outer surface of the target, and thus cracks exposed on the outer surface can be reliably formed.

In the laser processing apparatus according to one aspect of the present invention, the circumferential edge process may include a helix process in which the focusing point is moved in the vertical direction while rotating the support portion, to form the modified region in a helical shape along a circumferential edge between one side and another side of the effective region in the vertical direction. As a result, the modified region of a helical shape is formed along the circumferential edge without overlapping between one side and the other side of the effective region in the vertical direction, whereby the trimming processing can be efficiently performed.

In the laser processing apparatus according to one aspect of the present invention, the laser processing head may include a plurality of the laser processing heads, the circumferential edge process may include a second orbit process of irradiating the target with the laser light from each of the plurality of laser processing heads while rotating the support portion, to form the modified region in an annular shape along the circumferential edge of the effective region, and in the second orbit process, the focusing points of the plurality of laser lights may be positioned at a same position in the vertical direction, and starting and stopping of emission of the laser lights from the plurality of laser processing heads may be controlled to avoid overlapping of a plurality of the modified regions formed by the emission of the plurality of laser lights. As a result, the annular modified region can be efficiently formed by using the plurality of laser processing heads.

In the laser processing apparatus according to one aspect of the present invention, the laser processing head may include a plurality of the laser processing heads, the plurality of laser processing heads may at least include a first laser processing head configured to irradiate the target with a first laser light and a second laser processing head configured to irradiate the target with a second laser light, the circumferential edge process may include: a process of emitting the first laser light with a first focusing point of the first laser light positioned at a first position in the vertical direction while rotating the support portion, and of stopping the emission of the first laser light when the support portion makes a single turn after the emission of the first laser light has started, to form the modified region in an annular shape along the circumferential edge of the effective region; and a process of emitting the second laser light with a second focusing point of the second laser light positioned at a second position, more on a laser light incident surface side than the first position, in the vertical direction while rotating the support portion, and stopping the emission of the second laser light when the support portion makes a single turn after the emission of the second laser light has started, to form the modified region in an annular shape along the circumferential edge of the effective region, the second focusing point of the second laser light may be separated from the first focusing point of the first laser light, by a predetermined angle in a forward direction in a rotation direction of the support portion, and the emission of the second laser light may start after the support portion has rotated by the predetermined angle after the emission of the first laser light has started. As a result, when the annular modified regions are formed at a plurality of different positions in the vertical direction, the existence of the modified regions on the laser light incident side can be prevented from adversely affecting the formation of the modified region on the side opposite to the laser light incident side.

In the laser processing apparatus according to one aspect of the present invention, the controller may perform a removal process of irradiating a removal region in the target more on an outer side than the effective region with the laser light and moving the focusing point of the laser light without rotating the support portion, to form the modified region in the removal region. With this process, the removal region can be easily separated and removed.

In the laser processing apparatus according to one aspect of the present invention, the controller may perform a removal process of irradiating a removal region in the target more on an outer side than the effective region with the laser light and moving the focusing point of the laser light while rotating the support portion, to form the modified region in the removal region. With this process, the removal region can be subdivided and removed.

In the laser processing apparatus according to one aspect of the present invention, in the removal process, the emission of the laser light from the laser processing head may be started and stopped in a state where a movement speed of the focusing point of the laser light is constant. Thus, a constant pitch between a plurality of modified spots included in the modified region formed by the removal process can be achieved.

In the laser processing apparatus according to one aspect of the present invention, in the removal process, the focusing point of the laser light may be moved in a direction away from or toward a center of the target. In this case, the separation or subdivision of the removal region described above can be specifically implemented.

Advantageous Effects of Invention

According to one aspect of the present invention, a laser processing apparatus capable of accurately performing trimming processing can be provided.

BRIEF DESCRIPTION OF DRAWINGS

FIG. 4 is a side view of the laser processing head illustrated in FIG. 3.

FIG. 33(a) is a plan view of the target continuing from FIG. 32(b). FIG. 33(b) is a side view of the target illustrated in FIG. 33(a). FIG. 33(c) is another side view of the target illustrated in FIG. 33(a).

DESCRIPTION OF EMBODIMENTS

Hereinafter, embodiments will be described in detail with reference to the drawings. The same elements in the figures will be denoted by the same reference signs, and overlapping descriptions will be omitted.

First of all, the basic configuration, operation, effects, and a modification example of a laser processing apparatus will be described.

[Configuration of Laser Processing Apparatus]

Figure 1:
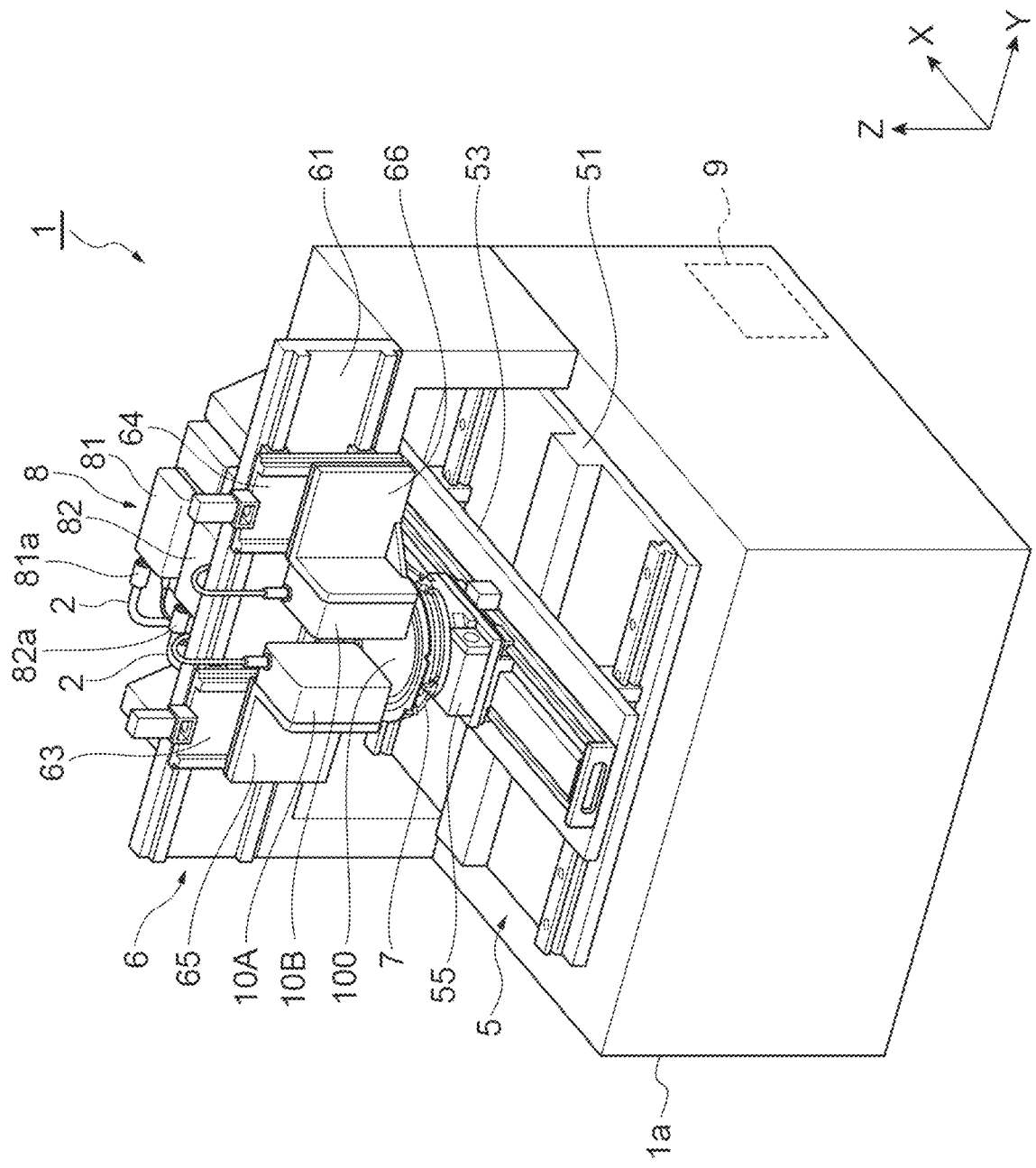
FIG. 1 is a perspective view of a laser processing apparatus of an embodiment.

As illustrated in FIG. 1, a laser processing apparatus 1 includes a plurality of movement mechanisms 5 and 6, a support portion 7, a pair of laser processing heads 10A and 10B (a first laser processing head and a second laser processing head), a light source unit 8, and a controller 9. Hereinafter, a first direction is referred to as an X direction, a second direction orthogonal to the first direction is referred to as a Y direction, and a third direction orthogonal to the first direction and the second direction is referred to as a Z direction. In the present embodiment, the X direction and the Y direction are horizontal directions, and the Z direction is a vertical direction.

The movement mechanism 5 includes a fixed portion 51, a moving portion 53, and an attachment portion 55. The fixed portion 51 is attached to a device frame 1a. The moving portion 53 is attached to a rail provided on the fixed portion 51, and can move along the Y direction. The attachment portion 55 is attached to a rail provided on the moving portion 53, and can move along the X direction.

The movement mechanism 6 includes a fixed portion 61, a pair of moving portions (a first moving portion and a second moving portion) 63 and 64, and a pair of attachment portions (a first attachment portion and a second attachment portion) 65 and 66. The fixed portion 61 is attached to the device frame 1a. The pair of moving portions 63 and 64 are each attached to a rail provided on the fixed portion 61, and can each independently move along the Y direction. The attachment portion 65 is attached to a rail provided on the moving portion 63, and can move along the Z direction. The attachment portion 66 is attached to a rail provided on the moving portion 64, and can move along the Z direction. Thus, the pair of attachment portions 65 and 66 can respectively move along the Y direction and the Z direction relative to the device frame 1a. The moving portions 63 and 64 respectively form first and second horizontal movement mechanisms (horizontal movement mechanism), respectively. The attachment portions 65 and 66 respectively form first and second vertical movement mechanisms (vertical movement mechanism).

The support portion 7 is attached to a rotation shaft provided to the attachment portion 55 of the movement mechanism 5, and can rotate about an axis parallel to the Z direction. Thus, the support portion 7 can move along each of the X direction and the Y direction, and can rotate about the axis parallel to the Z direction. The support portion 7 supports a target 100. The target 100 is, for example, a wafer.

Figure 2:
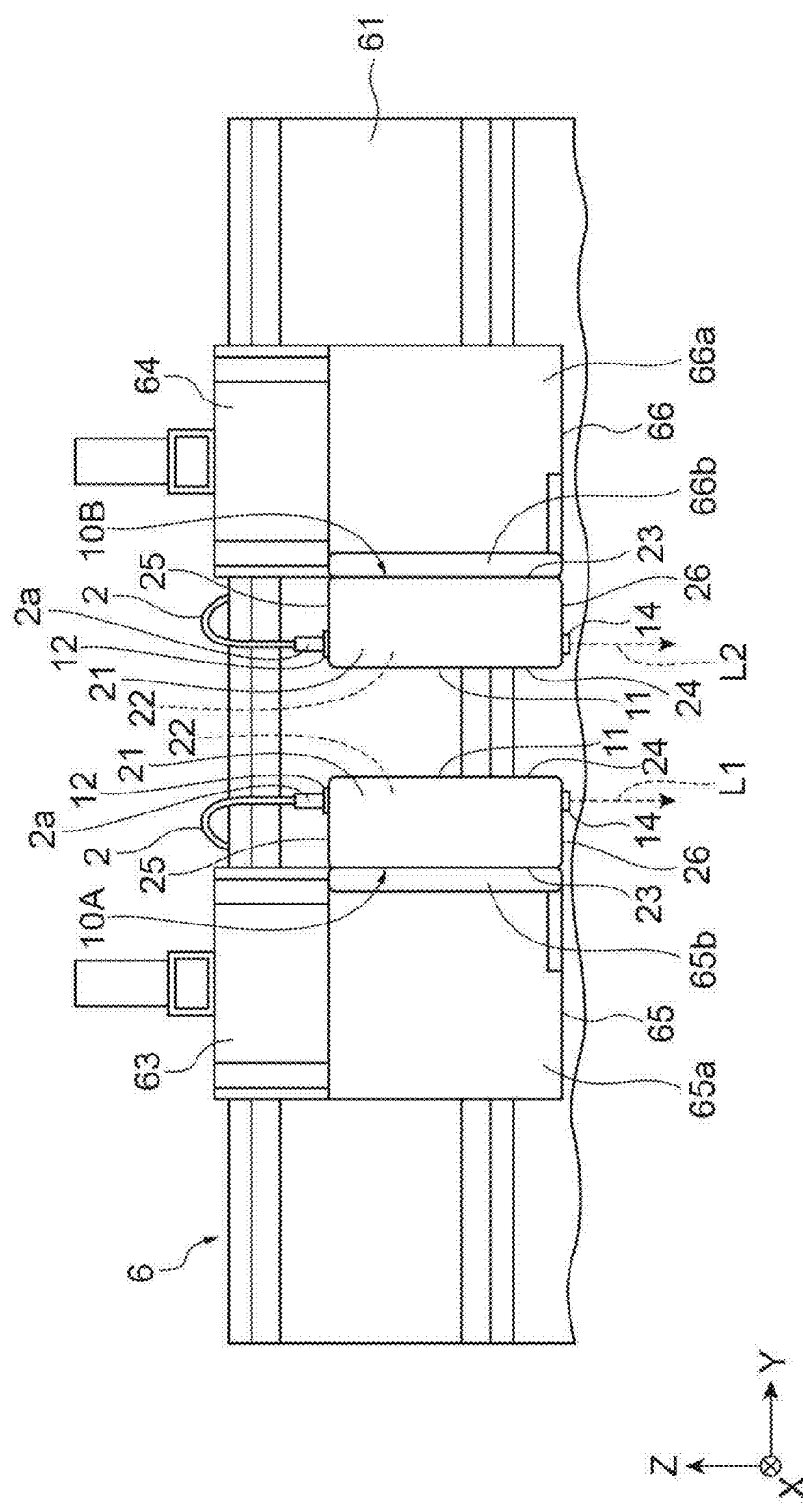
FIG. 2 is a front view of a portion of the laser processing apparatus illustrated in FIG. 1.

As illustrated in FIGS. 1 and 2, the laser processing head 10A is attached to the attachment portion 65 of the movement mechanism 6. The laser processing head 10A irradiates the target 100, supported by the support portion 7, with a laser light L1 (also referred to as "first laser light L1"), while facing the support portion 7 in the Z direction. The laser processing head 10B is attached to the attachment portion 66 of the movement mechanism 6. The laser processing head 10B irradiates the target 100, supported by the support portion 7, with a laser light L2 (also referred to as "second laser light L2"), while facing the support portion 7 in the Z direction.

The light source unit 8 includes a pair of light sources 81 and 82. The light source 81 outputs the laser light L1. The laser light L1 is emitted from an emission portion 81*a* of the light source 81, and is guided to the laser processing head 10A by an optical fiber 2. The light source 82 outputs the laser light L2. The laser light L2 is emitted from an emission portion 82*a* of the light source 82, and is guided to the laser processing head 10B by another optical fiber 2.

The controller 9 controls each part of the laser processing apparatus 1 (such as the plurality of movement mechanisms 5 and 6, the pair of laser processing heads 10A and 10B, and the light source unit 8). The controller 9 is configured as a computer device including a processor, a memory, a storage, a communication device, and the like. In the controller 9, software (program) loaded onto the memory or the like is performed by the processor, and reading and writing of data from and to the memory and storage, and communication by the communication device are controlled by the processor. Thus, the controller 9 implements various functions.

An example of processing by the laser processing apparatus 1 configured as described above will be described. This example processing is an example in which a modified region is formed inside the target 100 along each of a plurality of lines set to form a grid pattern for cutting the target 100, which is a wafer, into a plurality of chips.

First of all, the movement mechanism 5 moves the support portion 7, supporting the target 100, along each of the X direction and the Y direction to make the support portion 7 face the pair of laser processing heads 10A and 10B in the Z direction. Then, the movement mechanism 5 rotates the support portion 7 about the axis parallel to the Z direction to align the plurality of lines extending in one direction on the target 100 with the X direction.

Subsequently, the movement mechanism 6 moves the laser processing head 10A along the Y direction to position the focusing point of the laser light L1 on one line extending in one direction. Furthermore, the movement mechanism 6 moves the laser processing head 10B along the Y direction to position the focusing point of the laser light L2 on another one of the lines extending in one direction. Then, the movement mechanism 6 moves the laser processing head 10A along the Z direction to position the focusing point of the laser light L1 inside the target 100. Furthermore, the movement mechanism 6 moves the laser processing head 10B along the Z direction to position the focusing point of the laser light L2 inside the target 100.

Then, the light source 81 outputs the laser light L1 and the laser processing head 10A irradiates the target 100 with the laser light L1, whereas the light source 82 outputs the laser light L2 and the laser processing head 10B irradiates the target 100 with the laser light L2. At the same time, the movement mechanism 5 moves the support portion 7 along the X direction to relatively move the focusing point of the laser light L1 along one line extending in one direction, and to relatively move the focusing point of the laser light L2 along another line extending in one direction. In this manner, the laser processing apparatus 1 forms the modified region inside the target 100 along each of the plurality of lines extending in one direction on the target 100.

Subsequently, the movement mechanism 5 rotates the support portion 7 about an axis parallel to the Z direction so that a plurality of lines extending in the other direction orthogonal to one direction of the target 100 are aligned with the X direction.

Subsequently, the movement mechanism 6 moves the laser processing head 10A along the Y direction to position the focusing point of the laser light L1 on one line extending in the other direction. On the other hand, the movement mechanism 6 moves the laser processing head 10B along the Y direction to position the focusing point of the laser light L2 on another line extending in the other direction. Then, the movement mechanism 6 moves the laser processing head 10A along the Z direction to position the focusing point of the laser light L1 inside the target 100. Furthermore, the movement mechanism 6 moves the laser processing head 10B along the Z direction to position the focusing point of the laser light L2 inside the target 100.

Then, the light source 81 outputs the laser light L1 and the laser processing head 10A irradiates the target 100 with the laser light L1, whereas the light source 82 outputs the laser light L2 and the laser processing head 10B irradiates the target 100 with the laser light L2. At the same time, the movement mechanism 5 moves the support portion 7 along the X direction to relatively move the focusing point of the laser light L1 along one extending in the other direction, and to relatively move the focusing point of the laser light L2 along another line extending in the other direction. In this manner, the laser processing apparatus 1 forms the modified region inside the target 100 along each of the plurality of lines extending in the other direction on the target 100 orthogonal to the one direction.

In one example processing described above, the light source 81 outputs the laser light L1 that transmits through the target 100 by pulse oscillation, and the light source 82 outputs the laser light L2 that transmits through the target 100 by pulse oscillation. When such laser lights are focused inside the target 100, the laser lights are mainly absorbed at the portion corresponding to the focusing points of the laser lights, whereby the modified region is formed inside the target 100. The modified region is a region in which the density, refractive index, mechanical strength, and other physical characteristics are different from those of the surrounding non-modified regions. Examples of the modified region include a melting treatment region, a crack region, a dielectric breakdown region, a refractive index change region, and the like.

When the target 100 is irradiated with the laser light output using the pulse oscillation and the focusing point of the laser light is relatively moved along the line set on the target 100, a plurality of modified spots are formed in an aligned manner along the line. One modified spot is formed by irradiation with one pulse laser light. A line of modified region is a collection of a plurality of modified spots aligned. Adjacent modified spots may be connected to each other or separated from each other depending on the relative moving speed of the focusing point of the laser light with respect to the target 100 and the repetition frequency of the laser light.

[Configuration of Laser Processing Head]

Figure 3:
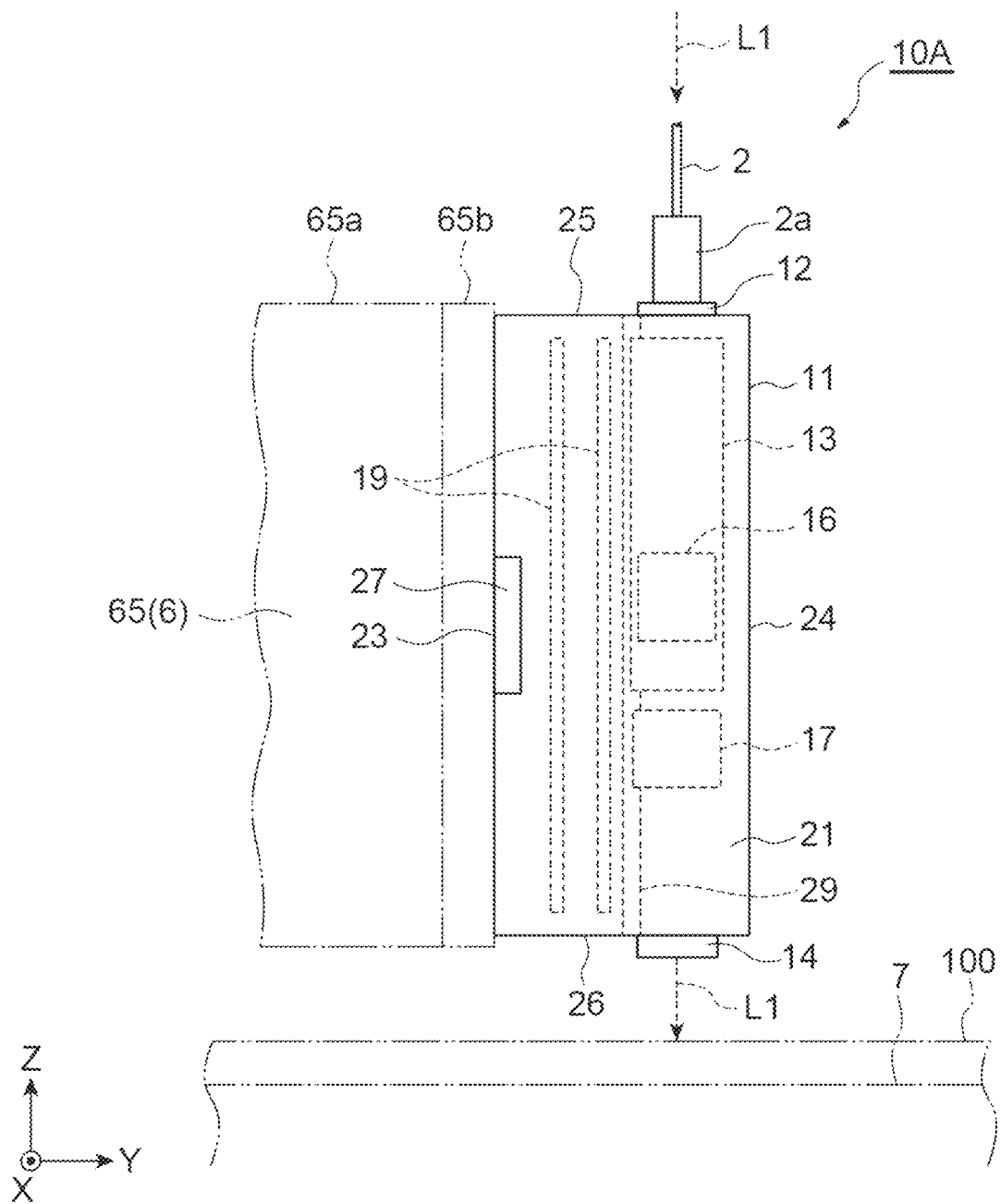
FIG. 3 is a front view of a laser processing head of the laser processing apparatus illustrated in FIG. 1.

As illustrated in FIGS. 3 and 4, the laser processing head 10A includes a housing 11, an entrance portion 12, an adjustment unit 13, and a condensing unit 14.

The housing 11 has a first wall portion 21, a second wall portion 22, a third wall portion 23, a fourth wall portion 24, a fifth wall portion 25, and a sixth wall portion 26. The first wall portion 21 and the second wall portion 22 face each other in the X direction. The third wall portion 23 and the fourth wall portion 24 face each other in the Y direction. The fifth wall portion 25 and the sixth wall portion 26 face each other in the Z direction.

The distance between the third wall portion 23 and the fourth wall portion 24 is shorter than the distance between the first wall portion 21 and the second wall portion 22. The distance between the first wall portion 21 and the second wall portion 22 is shorter than the distance between the fifth wall portion 25 and the sixth wall portion 26. The distance between the first wall portion 21 and the second wall portion 22 may the same as the distance between the fifth wall portion 25 and the sixth wall portion 26, or may be longer than the distance between the fifth wall portion 25 and the sixth wall portion 26.

In the laser processing head 10A, the first wall portion 21 is located on the fixed portion 61 side of the movement mechanism 6, and the second wall portion 22 is located on side opposite to the fixed portion 61. The third wall portion 23 is located on the attachment portion 65 side of the movement mechanism 6, and the fourth wall portion 24 is located on the side opposite to the attachment portion 65 which is the laser processing head 10B side (see FIG. 2). The fifth wall portion 25 is located on the side opposite to the support portion 7, and the sixth wall portion 26 is located on the support portion 7 side.

The housing 11 is configured to be attached to the attachment portion 65, with the third wall portion 23 arranged on the attachment portion 65 side of the movement mechanism 6. The specific configuration is as follows. The attachment portion 65 includes a base plate 65a and an attachment plate 65b. The base plate 65a is attached to a rail provided on the moving portion 63 (see FIG. 2). The attachment plate 65b stands at an end portion of the base plate 65a on the laser processing head 10B side (see FIG. 2). The housing 11 is attached to the attachment portion 65 by screwing bolts 28 to the attachment plate 65b via supports 27 in a state where the third wall portion 23 is in contact with the attachment plate 65b. The supports 27 are respectively provided to the first wall portion 21 and the second wall portion 22. The housing 11 is detachably attached to the attachment portion 65.

The entrance portion 12 is attached to the fifth wall portion 25. The laser light L1 enters the housing 11 through the entrance portion 12. The entrance portion 12 is offset toward the second wall portion 22 side (one wall portion side) in the X direction, and is offset toward the fourth wall portion 24 side in the Y direction. Specifically, the distance between the entrance portion 12 and the second wall portion 22 in the X direction is shorter than the distance between the entrance portion 12 and the first wall portion 21 in the X direction, and the distance between the entrance portion 12 and the fourth wall portion 24 in the Y direction is shorter than the distance between the entrance portion 12 and the third wall portion 23 in the X direction.

The entrance portion 12 is configured to be connectable with a connection end portion 2a of the optical fiber 2. The connection end portion 2a of the optical fiber 2 is provided with a collimator lens that collimates the laser light L1 emitted from an emission end of the fiber, but is not provided with an isolator that suppresses the return light. The isolator is provided at an intermediate portion of the fiber more on the light source 81 side than the connection end portion 2a. This leads to downsizing of the connection end portion 2a, and of the entrance portion 12. The isolator may be provided at the connection end portion 2a of the optical fiber 2.

The adjustment unit 13 is arranged in the housing 11. The adjustment unit 13 adjusts the laser light L1 entered through the entrance portion 12. Each configuration of the adjustment unit 13 is attached to an optical base 29 provided in the housing 11. The optical base 29 is attached to the housing 11 so as to partition the area inside the housing 11 into a region on the third wall portion 23 side and a region on the fourth wall portion 24 side. The optical base 29 is integrated with the housing 11. The configurations of the adjustment unit 13 are attached to the optical base 29 on the fourth wall portion 24 side, and will be described in detail later.

The condensing unit 14 is arranged in the sixth wall portion 26. Specifically, the condensing unit 14 is arranged in the sixth wall portion 26 while being inserted into a hole 26a formed in the sixth wall portion 26. The condensing unit 14 condenses the laser light L1 adjusted by the adjustment unit 13 and emits it to the outside of the housing 11. The condensing unit 14 is offset toward the second wall portion 22 (one wall portion side) in the X direction, and is offset toward the fourth wall portion 24 in the Y direction. Specifically, the distance between the condensing unit 14 and the second wall portion 22 in the X direction is shorter than the distance between the condensing unit 14 and the first wall portion 21 in the X direction, and the distance between the condensing unit 14 and the fourth wall portion 24 in the Y direction is shorter than the distance between the condensing unit 14 and the third wall portion 23 in the X direction.

Figure 5:
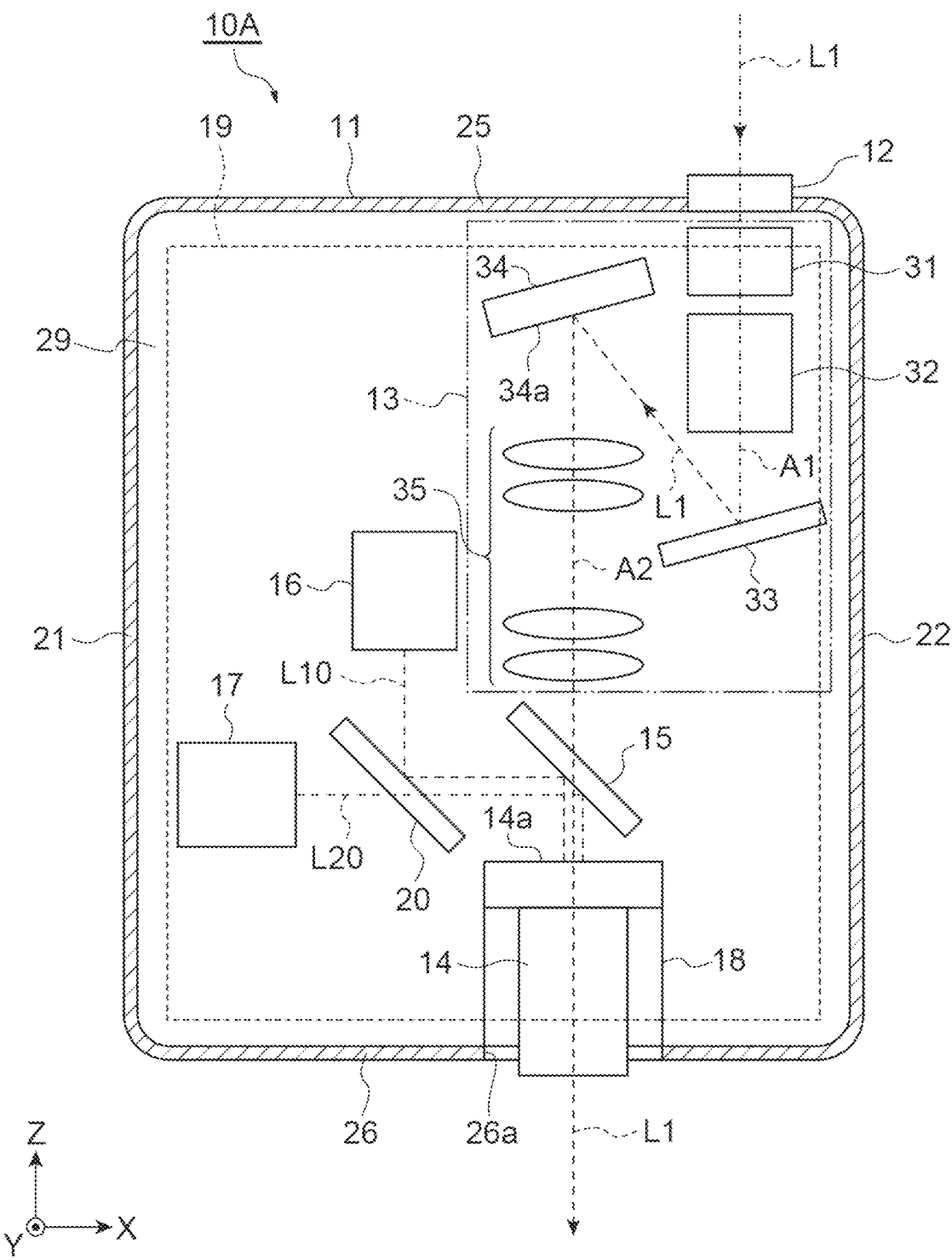
FIG. 5 is a diagram illustrating a configuration of an optical system of the laser processing head illustrated in FIG. 3.

As illustrated in FIG. 5, the adjustment unit 13 includes an attenuator 31, a beam expander 32, and a mirror 33. The entrance portion 12, as well as the attenuator 31, the beam expander 32, and the mirror 33 of the adjustment unit 13 are arranged on a straight line (first straight line) A1 extending along the Z direction. The attenuator 31 and the beam expander 32 are arranged between the entrance portion 12 and the mirror 33 on the straight line A1. The attenuator 31 adjusts the output of the laser light L1 that has entered through the entrance portion 12. The beam expander 32 expands the diameter of the laser light L1 the output of which has been adjusted by the attenuator 31. The mirror 33 reflects the laser light L1 the diameter of which has been expanded by the beam expander 32.

The adjustment unit 13 further includes a reflective spatial light modulator 34 and an imaging optical system 35. The reflective spatial light modulator 34 and the imaging optical system 35 of the adjustment unit 13 as well as the condensing unit 14 are arranged on a straight line (second straight line) A2 extending along the Z direction. The reflective spatial light modulator 34 modulates the laser light L1 reflected by the mirror 33. The reflective spatial light modulator 34 is, for example, a spatial light modulator (SLM) of a reflective liquid crystal (Liquid Crystal on Silicon (LCOS)). The imaging optical system 35 serves as a bilateral telecentric optical system in which a reflecting surface 34a of the reflective spatial light modulator 34 and an entrance pupil surface 14a of the condensing unit 14 are in an imaging relationship. The imaging optical system 35 includes three or more lenses.

The straight line A1 and the straight line A2 are located on a plane orthogonal to the Y direction. The straight line A1 is located on the second wall portion 22 side (one wall portion side) with respect to the straight line A2. In the laser processing head 10A, the laser light L1 enters the housing 11 through the entrance portion 12, travels on the straight line A1, is sequentially reflected by the mirror 33 and the reflective spatial light modulator 34, and then travels on the straight line A2 to be emitted to the outside of the housing 11 through the condensing unit 14. The order of arrangement of the attenuator 31 and the beam expander 32 may be reversed. The attenuator 31 may be arranged between the mirror 33 and the reflective spatial light modulator 34. The adjustment unit 13 may further include other optical components (for example, a steering mirror arranged in front of the beam expander 32 or the like).

The laser processing head 10A further includes a dichroic mirror 15, a measurement unit 16, a monitoring unit 17, a driving unit 18, and a circuit unit 19.

The dichroic mirror 15 is arranged between the imaging optical system 35 and the condensing unit 14 on the straight line A2. That is, the dichroic mirror 15 is arranged between the adjustment unit 13 and the condensing unit 14 in the housing 11. The dichroic mirror 15 is attached to the optical base 29 on the fourth wall portion 24 side. The dichroic mirror 15 transmits the laser light L1. From the sake of suppressing astigmatism, the dichroic mirror 15 may be, for example, a cube type or a two-plate type arranged in a twisted relationship.

The measurement unit 16 is arranged in the housing 11 on the first wall portion 21 side (opposite to one wall portion side) with respect to the adjustment unit 13. The measurement unit 16 is attached to the optical base 29 on the fourth wall portion 24 side. The measurement unit 16 outputs measurement light L10 for measuring the distance between the surface of the target 100 (for example, the surface on the side where the laser light L1 is incident) and the condensing unit 14, and detects the measurement light L10 reflected by the surface of the target 100 via the condensing unit 14. Thus, the surface of the target 100 is irradiated with the measurement light L10 output from the measurement unit 16, via the condensing unit 14, and then, the measurement light L10 reflected by the surface of the target 100 is detected by the measurement unit 16 via the condensing unit 14.

More specifically, the measurement light L10 output from the measurement unit 16 is sequentially reflected by a beam splitter 20 and the dichroic mirror 15 attached to the optical base 29 on the fourth wall portion 24 side, and then is emitted to the outside of the housing 11 from the condensing unit 14. The measurement light L10 reflected on the surface of the target 100 enters the housing 11 from the condensing unit 14 and is sequentially reflected by the dichroic mirror 15 and the beam splitter 20, to be incident on and detected by the measurement unit 16.

The monitoring unit 17 is arranged in the housing 11 on the first wall portion 21 side (opposite to one wall portion side) with respect to the adjustment unit 13. The monitoring unit 17 is attached to the optical base 29 on the fourth wall portion 24 side. The monitoring unit 17 outputs monitoring light L20 for monitoring the surface of the target 100 (for example, the surface on the side where the laser light L1 is incident), and detects the monitoring light L20 reflected by the surface of the target 100, via the condensing unit 14. Thus, the surface of the target 100 is irradiated with the monitoring light L20 output from the monitoring unit 17, via the condensing unit 14, and then, the monitoring light L20 reflected by the surface of the target 100 is detected by the monitoring unit 17 via the condensing unit 14.

More specifically, the monitoring light L20 output from the monitoring unit 17 transmits through the beam splitter 20 and is reflected by the dichroic mirror 15, to be emitted to the outside of the housing 11 from the condensing unit 14. The monitoring light L20 reflected by the surface of the target 100 enters the housing 11 through the condensing unit 14, and is reflected by the dichroic mirror 15 to be transmitted through the beam splitter 20 and to be incident on and detected by the monitoring unit 17. Wavelengths of the laser light L1, the measurement light L10, and the monitoring light L20 are different from each other (at least their center wavelengths are shifted from each other).

The driving unit 18 is attached to the optical base 29 on the fourth wall portion 24 side. It is attached to the sixth wall portion 26 of the housing 11. The driving unit 18 moves the condensing unit 14, arranged on the sixth wall portion 26, along the Z direction using, for example, driving force of a piezoelectric element.

The circuit unit 19 is arranged on the third wall portion 23 side with respect to the optical base 29, in the housing 11. Specifically, in the housing 11, the circuit unit 19 is arranged on the third wall portion 23 side with respect to the adjustment unit 13, the measurement unit 16, and the monitoring unit 17. The circuit unit 19 is, for example, a plurality of circuit boards. The circuit unit 19 processes a signal output from the measurement unit 16 and a signal input to the reflective spatial light modulator 34. The circuit unit 19 controls the driving unit 18 based on the signal output from the measurement unit 16. As an example, the circuit unit 19 controls the driving unit 18 to maintain a constant distance between the surface of the target 100 and the condensing unit 14 (to maintain a constant distance between the surface of the target 100 and the focusing point of the laser light L1) based on the signal output from the measurement unit 16. The housing 11 is provided with a connector (not illustrated) to which wiring for electrically connecting the circuit unit 19 to the controller 9 (see FIG. 1) or the like is connected.

Similar to the laser processing head 10A, the laser processing head 10B includes the housing 11, the entrance portion 12, the adjustment unit 13, the condensing unit 14, the dichroic mirror 15, the measurement unit 16, the monitoring unit 17, the driving unit 18, and the circuit unit 19. Note that, as illustrated in FIG. 2, the configurations of the laser processing head 10B are in a plane-symmetrical relationship with the configurations of the laser processing head 10A, about a virtual plane that passes through the midpoint between the pair of attachment portions 65 and 66 and is orthogonal to the Y direction.

For example, the housing (first housing) 11 of the laser processing head 10A is attached to the attachment portion 65 with the fourth wall portion 24 positioned on the laser processing head 10B side with respect to the third wall portion 23, and with the sixth wall portion 26 positioned on the support portion 7 side with respect to the fifth wall portion 25. On the other hand, the housing (second housing) 11 of the laser processing head 10B is attached to the attachment portion 66 with the fourth wall portion 24 positioned on the laser processing head 10A side with respect to the third wall portion 23, and with the sixth wall portion 26 positioned on the support portion 7 side with respect to the fifth wall portion 25.

The housing 11 of the laser processing head 10B is configured to be attached to the attachment portion 66 with the third wall portion 23 arranged on the attachment portion 66 side. The specific configuration is as follows. The attachment portion 66 includes a base plate 66a and an attachment plate 66b. The base plate 66a is attached to a rail provided on the moving portion 63. The attachment plate 66b stands at an end portion of the base plate 66a on the laser processing head 10A side. The housing 11 of the laser processing head 10B is attached to the attachment portion 66 with the third wall portion 23 being in contact with the attachment plate 66b. The housing 11 of the laser processing head 10B is detachably attached to the attachment portion 66.

[Operation and Effect]

The laser processing head 10A has no light source, for outputting the laser light L1, provided in the housing 11. Thus, the housing 11 can be downsized. In the housing 11, the distance between the third wall portion 23 and the fourth wall portion 24 is shorter than the distance between the first wall portion 21 and the second wall portion 22, and the condensing unit 14 arranged on the sixth wall portion 26 is offset toward the fourth wall portion 24 in the Y direction. With this configuration, when the housing 11 moves along a direction orthogonal to the optical axis of the condensing unit 14, even if another configuration (the laser processing head 10B, for example) exists on the fourth wall portion 24 side, the condensing unit 14 can be brought near the other configuration. Therefore, the laser processing head 10A is suitable for moving the condensing unit 14 along the direction orthogonal to its optical axis.

In the laser processing head 10A, the entrance portion 12 is provided in the fifth wall portion 25 and is offset toward the fourth wall portion 24 in the Y direction. With this configuration, another configuration (the circuit unit 19 for example) can be arranged in a region, of a region in the housing 11, on the third wall portion 23 side with respect to the adjustment unit 13, or such a region can be used for the other like purposes. Thus, the region can be effectively used.

In the laser processing head 10A, the condensing unit 14 is offset toward the second wall portion 22 in the X direction. With this configuration, when the housing 11 moves along a direction orthogonal to the optical axis of the condensing unit 14, for example, even if another configuration exists on the second wall portion 22 side, the condensing unit 14 can be brought near the other configuration.

In the laser processing head 10A, the entrance portion 12 is provided in the fifth wall portion 25 and is offset toward the second wall portion 22 in the X direction. With this configuration, another configuration (the measurement unit 16 and the monitoring unit 17 for example) can be arranged in a region, of a region in the housing 11, on the first wall portion 21 side with respect to the adjustment unit 13, or such a region can be used for the other like purposes. Thus, the region can be effectively used.

In the laser processing head 10A, the measurement unit 16 and the monitoring unit 17 are arranged in the region, of the region in the housing 11, on the first wall portion 21 side with respect to the adjustment unit 13. The circuit unit 19 is arranged in the region in the housing 11, on the third wall portion 23 side with respect to the adjustment unit 13. The dichroic mirror 15 is arranged between the adjustment unit 13 and the condensing unit 14 in the housing 11. With this configuration, the region inside the housing 11 can be effectively used. Furthermore, in the laser processing apparatus 1, processing can be performed based on a result of measuring the distance between the surface of the target 100 and the condensing unit 14. Furthermore, in the laser processing apparatus 1, processing can be performed based on a result of monitoring the surface of the target 100.

In the laser processing head 10A, the circuit unit 19 controls the driving unit 18 based on the signal output from the measurement unit 16. With this configuration, the position of the focusing point of the laser light L1 can be adjusted based on a result of measuring the distance between the surface of the target 100 and the condensing unit 14.

Furthermore, in the laser processing head 10A, the entrance portion 12 as well as the attenuator 31, the beam expander 32, and the mirror 33 of the adjustment unit 13 are arranged on the straight line A1 extending along the Z direction. Furthermore, the reflective spatial light modulator 34, the imaging optical system 35, and the condensing unit 14 of the adjustment unit 13 as well as the condensing unit 14 are arranged on the straight line A2 extending along the Z direction. With this configuration, the adjustment unit 13 including the attenuator 31, the beam expander 32, the reflective spatial light modulator 34, and the imaging optical system 35 can be compactly configured.

In the laser processing head 10A, the straight line A1 is positioned on the second wall portion 22 side with respect to the straight line A2. With this configuration, when other optical systems using the condensing unit 14 (the measurement unit 16 and the monitoring unit 17 for example) are configured in the region, of the region in the housing 11, on the first wall portion 21 side with respect to the adjustment unit 13, the degree of freedom in configuration of the other optical systems can be improved.

The above actions and effects are similarly provided by the laser processing head 10B.

In the laser processing apparatus 1, the condensing unit 14 of the laser processing head 10A is offset toward the laser processing head 10B in the housing 11 of the laser processing head 10A, and the condensing unit 14 of the laser processing head 10B is offset toward the laser processing head 10A in the housing 11 of the laser processing head 10B. With this configuration, when the pair of laser processing heads 10A and 10B move along the Y direction, the condensing unit 14 of the laser processing head 10A and the condensing unit 14 of the laser processing head 10B can be brought close to each other. Therefore, with the laser processing apparatus 1, the target 100 can be efficiently processed.

In the laser processing apparatus 1, the pair of attachment portions 65 and 66 respectively move along the Y direction and the Z direction. With this configuration, the target 100 can be processed more efficiently.

In the laser processing apparatus 1, the support portion 7 moves along each of the X direction and the Y direction, and rotates about the axis parallel to the Z direction. With this configuration, the target 100 can be processed more efficiently.

Modification Examples

Figure 6:
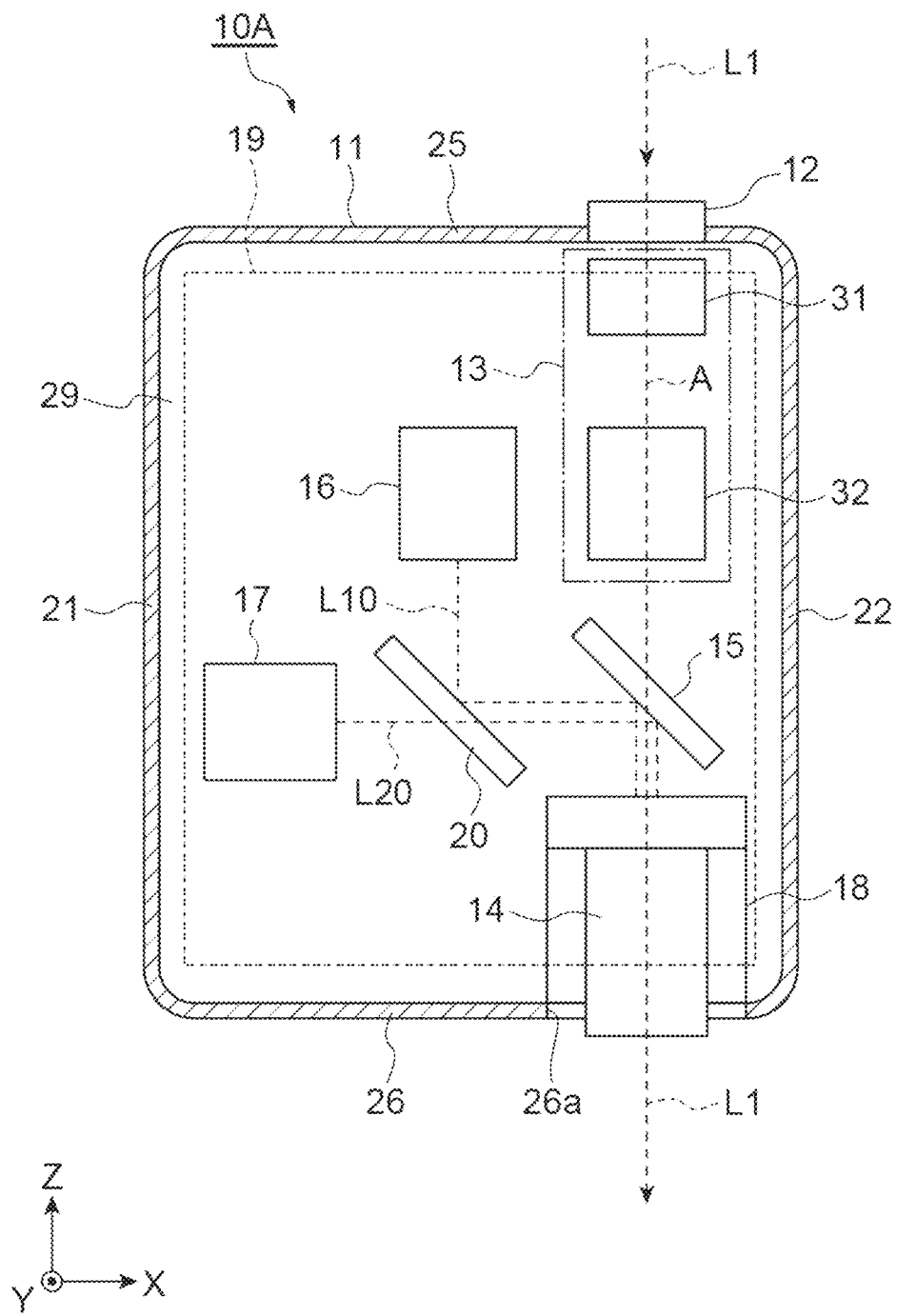
FIG. 6 is a diagram illustrating a configuration of an optical system of a laser processing head of a modification example.

For example, as illustrated in FIG. 6, the entrance portion 12, the adjustment unit 13, and the condensing unit 14 may be arranged on a straight line A extending along the Z direction. With this configuration, the adjustment unit 13 can be configured compactly. In this case, the adjustment unit 13 may not include the reflective spatial light modulator 34 and the imaging optical system 35. Further, the adjustment unit 13 may include the attenuator 31 and the beam expander 32. With this configuration, the adjustment unit 13 including the attenuator 31 and the beam expander 32 can be compactly configured. The order of arrangement of the attenuator 31 and the beam expander 32 may be reversed.

The housing 11 may have any configuration to be attached to the attachment portion 65 (or the attachment portion 66) with at least one of the first wall portion 21, the second wall portion 22, the third wall portion 23, and the fifth wall portion 25 arranged on the attachment portion 65 (or the attachment portion 66) side of the laser processing apparatus 1. The condensing unit 14 may have any configuration as long as it is at least offset toward the fourth wall portion 24 in the Y direction. With such configurations, when the housing 11 moves along the Y direction, for example, even if another configuration exists on the fourth wall portion 24 side, the condensing unit 14 can be brought near the other configuration. When the housing 11 moves along the Z direction, the condensing unit 14 can be brought close to the target 100, for example.

The condensing unit 14 may be offset toward the first wall portion 21 in the X direction. With this configuration, when the housing 11 moves along a direction orthogonal to the optical axis of the condensing unit 14, even if another configuration exists on the first wall portion 21 side, for example, the condensing unit 14 can be brought near the other configuration. In this case, the entrance portion 12 may be offset toward the first wall portion 21 in the X direction. With this configuration, another configuration (the measurement unit 16 and the monitoring unit 17 for example) can be arranged in a region, of a region in the housing 11, on the second wall portion 22 side with respect to the adjustment unit 13, or such a region can be used for the other like purposes. Thus, the region can be effectively used.

Figure 7:
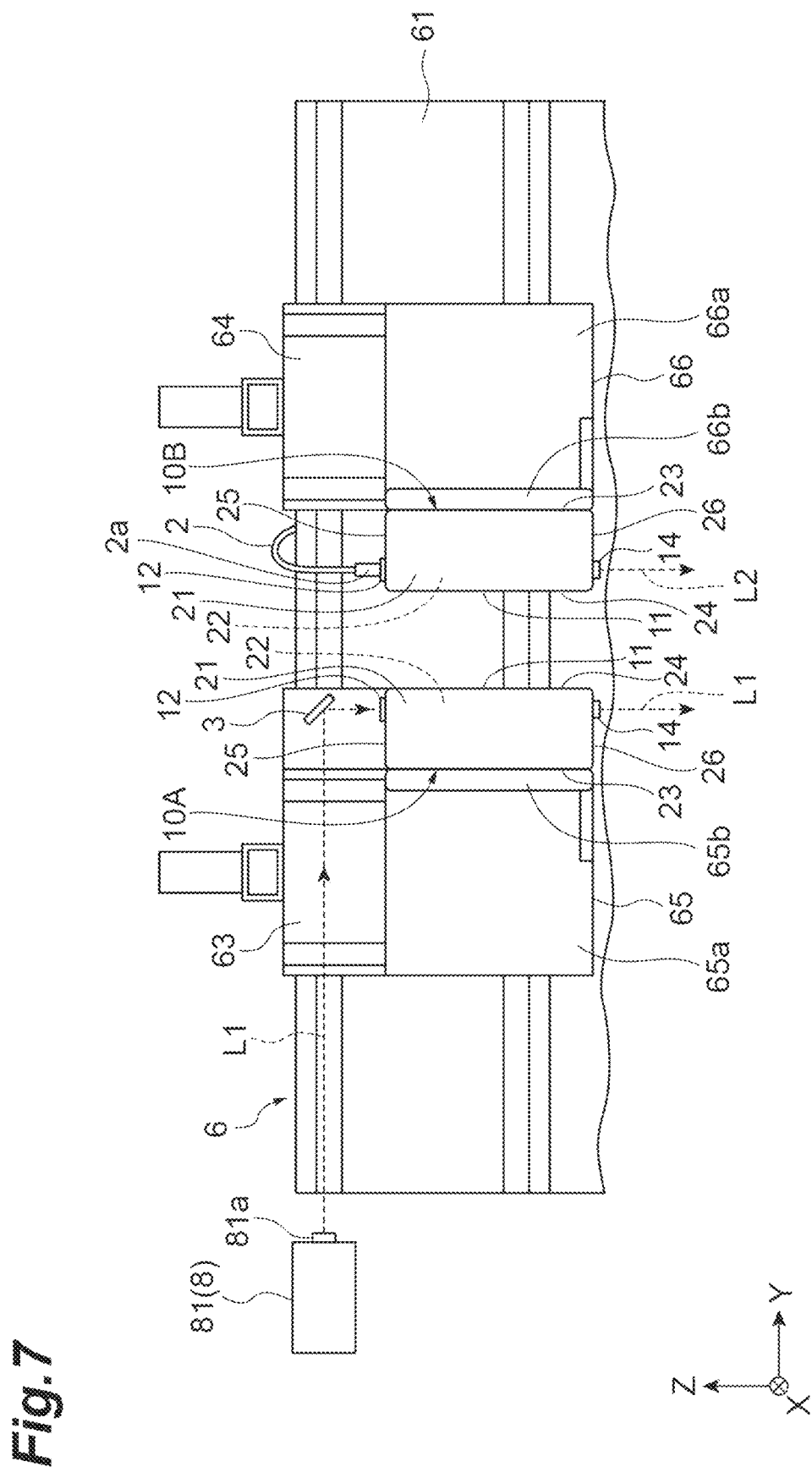
FIG. 7 is a front view of a portion of the laser processing apparatus of the modification example.

Further, at least one of the guiding of the laser light L1 from the emission portion 81a of the light source unit 8 to the entrance portion 12 of the laser processing head 10A and guiding of the laser light L2 from the emission portion 82a of the light source unit 8 to the entrance portion 12 of the laser processing head 10B may be implemented by a mirror. FIG. 7 is a front view of a portion of the laser processing apparatus 1 in which the laser light L1 is guided by a mirror. In the configuration illustrated in FIG. 7, a mirror 3 that reflects the laser light L1 is attached to the moving portion 63 of the movement mechanism 6, to face the emission portion 81a of the light source unit 8 in the Y direction and face the entrance portion 12 of the laser processing head 10A in the Z direction.

With the configuration illustrated in FIG. 7, the state where the mirror 3 faces the emission portion 81a of the light source unit 8 in the Y direction is maintained, even when the moving portion 63 of the movement mechanism 6 moves along the Y direction. Furthermore, the state where the mirror 3 faces the entrance portion 12 of the laser processing head 10A in the Z direction is maintained, even when the attachment portion 65 of the movement mechanism 6 moves along the Z direction. Thus, the laser light L1 emitted from the emission portion 81a of the light source unit 8 can reliably enter the entrance portion 12 of the laser processing head 10A, regardless of the position of the laser processing head 10A. Furthermore, a light source such as a high output ultrashort pulse laser, guiding for which using the optical fiber 2 is otherwise difficult, can be used.

Furthermore, with the configuration illustrated in FIG. 7, the mirror 3 may be attached to the moving portion 63 of the movement mechanism 6 to have at least one of angle and position adjustable. With this configuration, the laser light L1 emitted from the emission portion 81a of the light source unit 8 can reliably enter the entrance portion 12 of the laser processing head 10A.

Furthermore, the light source unit 8 may include a single light source. In this case, the light source unit 8 may be configured to emit a part of a laser light, output from one light source, from the emission portion 81a and emit the remaining part of the laser light from an emission portion 82b.

Furthermore, the laser processing apparatus 1 may include one laser processing head 10A. Also in the laser processing apparatus 1 including one laser processing head 10A, when the housing 11 moves along the Y direction orthogonal to the optical axis of the condensing unit 14, even if another configuration exists on the fourth wall portion 24 side, for example, the condensing unit 14 can be brought near the other configuration. Thus, also with the laser processing apparatus 1 including one laser processing head 10A, the target 100 can be efficiently processed. Furthermore, in the laser processing apparatus 1 including one laser processing head 10A, when the attachment portion 65 moves along the Z direction, the target 100 can be processed more efficiently. Furthermore, in the laser processing apparatus 1 provided with one laser processing head 10A, when the support portion 7 moves along the X direction and rotates about the axis parallel to the Z direction, the target 100 can be processed more efficiently.

Figure 8:
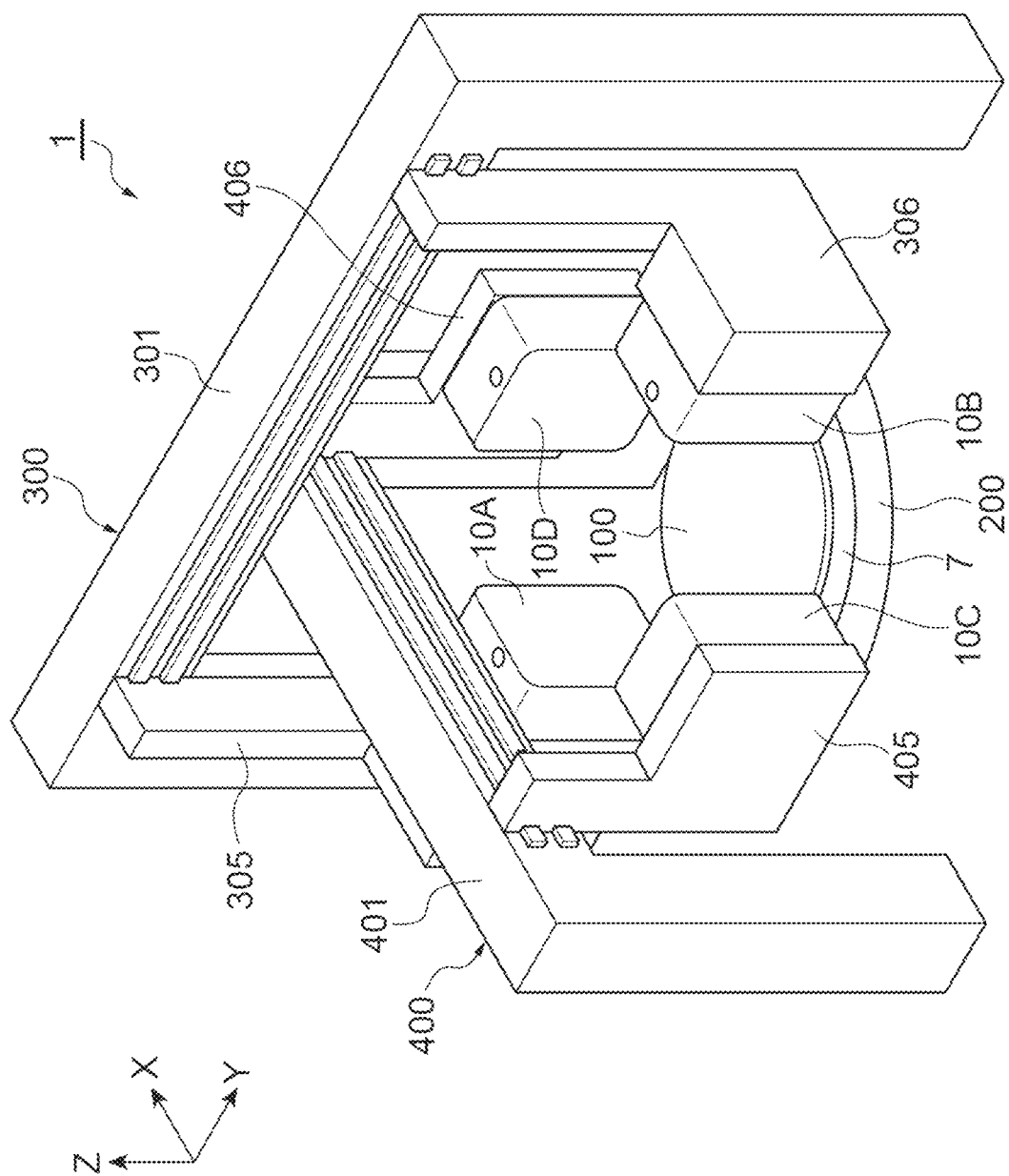
FIG. 8 is a perspective view of the laser processing apparatus of the modification example.

The laser processing apparatus 1 may include three or more laser processing heads. FIG. 8 is a perspective view of a laser processing apparatus 1 including two pairs of laser processing heads. The laser processing apparatus 1 illustrated in FIG. 8 includes a plurality of movement mechanisms 200, 300, and 400, the support portion 7, the pair of laser processing heads 10A and 10B, a pair of laser processing heads 10C and 10D, and a light source unit (not illustrated).

The movement mechanism 200 moves the support portion 7 along the each of the X direction, the Y direction, and the Z direction, and rotates the support portion 7 about an axis parallel to the Z direction.

The movement mechanism 300 includes a fixed portion 301 and a pair of attachment portions (a first attachment portion and a second attachment portion) 305 and 306. The fixed portion 301 is attached to a device frame (not illustrated). The pair of attachment portions 305 and 306 are each attached to a rail provided on the fixed portion 301, and can move in the Y direction independently from each other.

The movement mechanism 400 includes a fixed portion 401 and a pair of attachment portions (a first attachment portion and a second attachment portion) 405 and 406. The fixed portion 401 is attached to a device frame (not illustrated). The pair of attachment portions 405 and 406 are each attached to a rail provided on the fixed portion 401, and can move in the X direction independently from each other. The rail of the fixed portion 401 is arranged to three-dimensionally intersect with the rail of the fixed portion 301.

The laser processing head 10A is attached to the attachment portion 305 of the movement mechanism 300. The laser processing head 10A irradiates the target 100, supported by the support portion 7, with a laser light, while facing the support portion 7 in the Z direction. The laser light emitted from the laser processing head 10A is guided by the optical fiber 2 from the light source unit (not illustrated). The laser processing head 10B is attached to the attachment portion 306 of the movement mechanism 300. The laser processing head 10B irradiates the target 100, supported by the support portion 7, with a laser light, while facing the support portion 7 in the Z direction. The laser light emitted from the laser processing head 10B is guided by the optical fiber 2 from the light source unit (not illustrated).

The laser processing head 10C is attached to the attachment portion 405 of the movement mechanism 400. The laser processing head 10C irradiates the target 100, supported by the support portion 7, with a laser light, while facing the support portion 7 in the Z direction. The laser light emitted from the laser processing head 10C is guided by the optical fiber 2 from the light source unit (not illustrated). The laser processing head 10D is attached to the attachment portion 406 of the movement mechanism 400. The laser processing head 10D irradiates the target 100, supported by the support portion 7, with a laser light, while facing the support portion 7 in the Z direction. The laser light emitted from the laser processing head 10D is guided by the optical fiber 2 from the light source unit (not illustrated).

The configuration of the pair of laser processing heads 10A and 10B in the laser processing apparatus 1 illustrated in FIG. 8 is the same as the configuration of the pair of laser processing heads 10A and 10B in the laser processing apparatus 1 illustrated in FIG. 1. The configuration of the pair of laser processing heads 10C and 10D in the laser processing apparatus 1 illustrated in FIG. 8 is the same as the configuration of the pair of laser processing heads 10A and 10B as a result of rotating the pair of laser processing heads 10A and 10B, in the laser processing apparatus 1 illustrated in FIG. 1, by 90° about an axis parallel to the Z direction.

For example, the housing (first housing) 11 of the laser processing head 10C is attached to the attachment portion 65 with the fourth wall portion 24 positioned on the laser processing head 10D side with respect to the third wall portion 23, and with the sixth wall portion 26 positioned on the support portion 7 side with respect to the fifth wall portion 25. The condensing unit 14 of the laser processing head 10C is offset toward the fourth wall portion 24 (that is, toward the laser processing head 10D) in the Y direction.

The housing (second housing) 11 of the laser processing head 10D is attached to the attachment portion 66 with the fourth wall portion 24 positioned on the laser processing head 10C side with respect to the third wall portion 23, and with the sixth wall portion 26 positioned on the support portion 7 side with respect to the fifth wall portion 25. The condensing unit 14 of the laser processing head 10D is offset toward the fourth wall portion 24 (that is, toward the laser processing head 10C) in the Y direction.

With the above configuration, in the laser processing apparatus 1 illustrated in FIG. 8, when the pair of laser processing heads 10A and 10B each move along the Y direction, the condensing unit 14 of the laser processing head 10A and the condensing unit 14 of the laser processing head 10B can be brought close to each other. Furthermore, when the pair of laser processing heads 10C and 10D each move along the X direction, the condensing unit 14 of the laser processing head 10C and the condensing unit 14 of the laser processing head 10D can be brought close to each other.

The laser processing head and the laser processing apparatus are not limited to those for forming the modified region in the target 100, and thus may be those for implementing other types of laser processing.

Next, each embodiment will be described. Hereinafter, the description already given for the above-described embodiment will not be redundantly given.

First Embodiment

Figure 9:
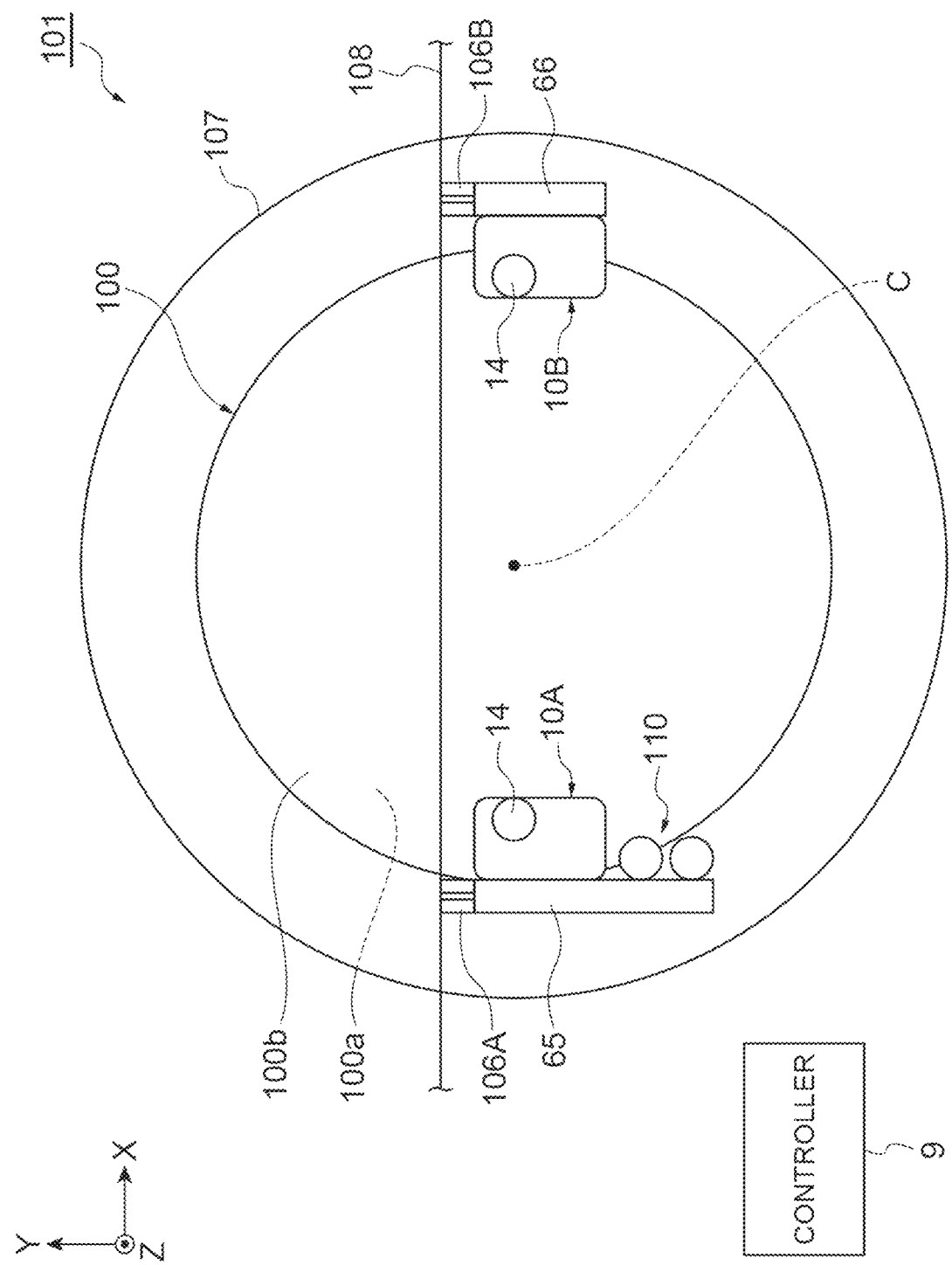
FIG. 9 is a plan view of a schematic configuration of a laser processing apparatus according to a first embodiment.

The laser processing apparatus 101 according to the first embodiment illustrated in FIG. 9 is a device that performs trimming processing and peeling processing on the target 100 to obtain (manufacture) a semiconductor device. The laser processing apparatus 101 includes a stage 107, first and second laser processing heads 10A and 10B, first and second Z-axis rails 106A and 106B, an X-axis rail 108, an alignment camera 110, and a controller 9.

The trimming processing is processing for removing an unnecessary portion of the target 100. The peeling processing is processing for peeling a part of the target 100. The target 100 includes, for example, a semiconductor wafer formed in a disk-shape. The target is not particularly limited, and may be formed of various materials and may have various shapes. A functional element (not illustrated) is formed on a front surface 100a of the target 100. Examples of the functional element include, a light receiving element such as a photodiode, a light emitting element such as a laser diode, a circuit element such as a memory, and the like. In the following description, the X direction corresponds to the Y direction of the above laser processing apparatus 1 (see FIG. 1) and the Y direction corresponds to the X direction of the above laser processing apparatus 1 (see FIG. 1).

As illustrated in FIGS. 10(a) and 10(b), an effective region R and a removal region E are set in the target 100. The effective region R is the part corresponding to the semiconductor device to be obtained. This effective region R is a disk-shaped portion including a center portion in the target 100 as viewed in a thickness direction. The removal region E is a region outside the effective region R in the target 100. The removal region E is a portion in the target 100 other than the effective region R. This removal region E is an annular portion surrounding the effective region R. The removal region E includes a circumferential edge portion (bevel portion of the outer edge) in the target 100 as viewed in the thickness direction.

A virtual plane M1 is set in the target 100. The virtual plane M1 is a plane facing a back surface 100b, which is a laser light incident surface of the target 100. The virtual plane M1 is a plane parallel to the back surface 100b, and has a circular shape, for example. The virtual plane M1 is set in the effective region R. The virtual plane M1 is a virtual region, and is not limited to a flat plane, and may be a curved plane or a three-dimensional plane. The effective region R, the removal region E, and the virtual plane M1 can be set by the controller 9. The effective region R, the removal region E, and the virtual plane M1 may be designated by coordinates.

The stage 107 is a support portion on which the target 100 is placed. The stage 107 has the same configuration as the above support portion 7 (see FIG. 1). The target 100 is placed on the stage 107 of the present embodiment, with the back surface 100b of the target 100 facing upward, that is, the laser incident surface side (with the front surface 100a facing down toward the stage 107). The stage 107 has a rotation axis C provided at the center thereof. The rotation axis C is an axis extending along the Z direction. The stage 107 can rotate about the rotation axis C. The stage 107 is drivingly rotated by driving force of a known driving device such as a motor.

The first laser processing head 10A irradiates the target 100 placed on the stage 107 with the first laser light L1 along the Z direction to form a first modified region in the target 100. The first laser processing head 10A is attached to the first Z-axis rail 106A and the X-axis rail 108. The first laser processing head 10A can be moved linearly in the Z direction along the first Z-axis rail 106A, by driving force of a known driving device such as a motor. The first laser processing head 10A can be moved linearly in the X direction along the X-axis rail 108, by driving force of a known driving device such as a motor.

In the first laser processing head 10A, start and stop (ON/OFF) of the emission (output) of the first laser light L1 can be switched in the following manner. When a laser oscillator includes a solid-state laser, high speed switching between start and stop of the emission of the first laser light L1 can be implemented, through switching between ON and OFF of a Q switch provided in an oscillator (such as acousto-optic modulator (AOM) and electro-optic modulator (EOM)). When the laser oscillator includes a fiber laser, high speed switching between start and stop of the emission of the first laser light L1 can be implemented, through switching between ON and OFF of the output of a semiconductor laser forming a seed laser and an amplifier (excitation) laser. When the laser oscillator uses an external modulation element, high speed switching between ON and OFF of emission of the first laser light L1 is implemented, through switching between ON and OFF of the external modulation element (such as AOM or EOM) provided outside the oscillator. In the first laser processing head 10A, the optical path of the first laser light L1 may be opened and closed using a mechanical mechanism such as a shutter, so that unintentional emission of the first laser light L1 can be prevented. Such switching similarly applies to other laser processing heads.

The first laser processing head 10A includes a ranging sensor. The ranging sensor emits a distance measurement laser light to the laser light incident surface of the target 100, and detects the distance measurement light reflected by the laser light incident surface to detect displacement data on the laser light incident surface of the target 100. When the ranging sensor is a sensor having an axis different from that of the first laser light L1, a sensor employing as a triangular distance measuring method, a laser confocal method, a white confocal method, a spectral interference method, an astigmatism method, or the like may be used. When the ranging sensor is a sensor coaxial with the first laser light L1, a sensor employing an astigmatism method or the like can be used. The circuit unit 19 (see FIG. 3) of the first laser processing head 10A is driven by the driving unit 18 (see FIG. 5) to make the condensing unit 14 follow the laser light incident surface, based on the displacement data acquired by the ranging sensor. With this configuration, the condensing unit 14 moves along the Z direction based on the displacement data so that a constant distance between the laser light incident surface of the target 100 and a first focusing point of the first laser light L1, is maintained. Such a raging sensor and the control therefor similarly applied to other laser processing heads.

The second laser processing head 10B irradiates the target 100 placed on the stage 107 with the second laser light L2 along the Z direction to form a second modified region in the target 100. The second laser processing head 10B is attached to the second Z-axis rail 106B and the X-axis rail 108. The second laser processing head 10B can be moved linearly in the Z direction along the second Z-axis rail 106B, by driving force of a known driving device such as a motor. The second laser processing head 10B can be moved linearly in the X direction along the X-axis rail 108, by driving force of a known driving device such as a motor. The internal structures of the first laser processing head 10A and the second laser processing head are mirror symmetrical with each other about the rotation axis C.

The first Z-axis rail 106A is a rail extending along the Z direction. The first Z-axis rail 106A is attached to the first laser processing head 10A via the attachment portion 65. The first laser processing head 10A moves on the first Z-axis rail 106A along the Z direction so that the first focusing point of the first laser light L1 moves along the Z direction. The first Z-axis rail 106A corresponds to the rail of the above movement mechanism 6 (see FIG. 1) or the above movement mechanism 300 (see FIG. 8). The first Z-axis rail 106A serves as a first vertical movement mechanism (vertical movement mechanism).

The second Z-axis rail 106B is a rail extending along the Z direction. The second Z-axis rail 106B is attached to the second laser processing head 10B via the attachment portion 66. The second laser processing head 10B moves on the second Z-axis rail 106B along the Z direction so that a second focusing point of the second laser light L2 moves along the Z direction. The second Z-axis rail 106B corresponds to the rail of the above movement mechanism 6 (see FIG. 1) or the above movement mechanism 300 (see FIG. 8). The second Z-axis rail 106B serves as a second vertical movement mechanism (vertical movement mechanism).

The X-axis rail 108 is a rail extending along the X direction. The X-axis rail 108 is attached to each of the first and the second Z-axis rails 106A and 106B. The first laser processing head 10A moves on the X-axis rail 108 along the X direction so that the first focusing point of the first laser light L1 moves along the X direction. The second laser processing head 10B moves on the X-axis rail 108 along the X direction so that the second focusing point of the second laser light L2 moves along the X direction. The first and the second laser processing heads 10A and 10B move on the X-axis rail 108 to make the first and the second focusing points pass through or near the rotation axis C. The X-axis rail 108 corresponds to the rail of the above movement mechanism 6 (see FIG. 1) or the above movement mechanism 300 (see FIG. 8). The X-axis rail 108 serves as the first and the second horizontal movement mechanisms (horizontal movement mechanism).

The alignment camera 110 is a camera that captures images used for various adjustments. The alignment camera 110 captures an image of the target 100. The alignment camera 110 is attached to the attachment portion 65 to which the first laser processing head 10A is attached, and operates in synchronization with the first laser processing head 10A.

The controller 9 is configured as a computer device including a processor, a memory, a storage, a communication device, and the like. In the controller 9, software (program) loaded onto the memory or the like is performed by the processor, and reading and writing of data from and to the memory and storage, and communication by the communication device are controlled by the processor. Thus, the controller 9 implements various functions.

The controller 9 controls rotation of the stage 107, emission of the first and the second laser lights L1 and L2 from the first and the second laser processing heads 10A and 10B, and movement of the first and the second focusing points. The controller 9 can perform various controls based on rotation information (hereinafter, also referred to as "θ information") on the rotation amount of the stage 107. The θ information may be acquired from a driving amount of the driving device for rotating the stage 107, or may be acquired by a separate sensor or the like. The θ information can be obtained by various known methods. The θ information here is the rotation angle based on a state where the target 100 is positioned at a 0 degree direction position.

The controller 9 controls starting and stopping of the emission of the first and the second laser lights L1 and L2 from the first and the second laser processing heads 10A and 10B based on the θ information in a state where the first and the second focusing points are positioned at positions along the circumferential edge of the effective region R) in the target 100, while rotating the stage 107, to perform a circumferential edge process for forming the modified region along the circumferential edge of the effective region R. The details of the circumferential edge process will be described later.

The controller 9 performs a removal process of forming the modified region in the removal region E, by irradiating the removal region E with the first and the second laser lights L1 and L2 without rotating the stage 107, while moving the first and the second focusing points of the first and the second laser lights L1 and L2. The details of the removal process will be described later.

The controller 9 performs a first peeling process of forming first and second modified regions along the virtual plane M1 in the target 100, by making the first and the second laser lights L1 and L2 emitted from the first and the second laser processing heads 10A and 10B, respectively, and controlling the movement of the first and the second focusing points in the X direction, while rotating the stage 107. The details of the first peeling process will be described later.

The controller 9 controls at least one of the rotation of the stage 107, the emission of the first and the second laser lights L1 and L2 from the first and the second laser processing heads 10A and 10B, and movement of the first and the second focusing points, to achieve a constant pitch between a plurality of modified spots included in the first and the second modified regions (interval of the modified spots adjacent to each other in the processing proceeding direction).

The controller 9 acquires a reference position (0 degree direction position) of the target 100 in the rotation direction and the diameter of the target 100 from the image captured by the alignment camera 110. The controller 9 controls the movement of the first and the second laser processing heads 10A and 10B so that only the first laser processing head 10A can move to a position on the rotation axis C of the stage 107 along the X-axis rail 108 (to prevent the second laser processing head 10B from moving to the position on the rotation axis C of the stage 107 along the X-axis rail 108).

Next, an example of a method of obtaining (manufacturing) a semiconductor device by performing the trimming processing and the peeling processing on the target 100 using the laser processing apparatus 101 will be described below.

First of all, the target 100 is placed on the stage 107 with the back surface 100*b* facing the laser incident surface side. The front surface 100*a* side of the target 100 on which the functional element is mounted is protected with a support substrate or a tape material adhered thereon.

Figure 11:
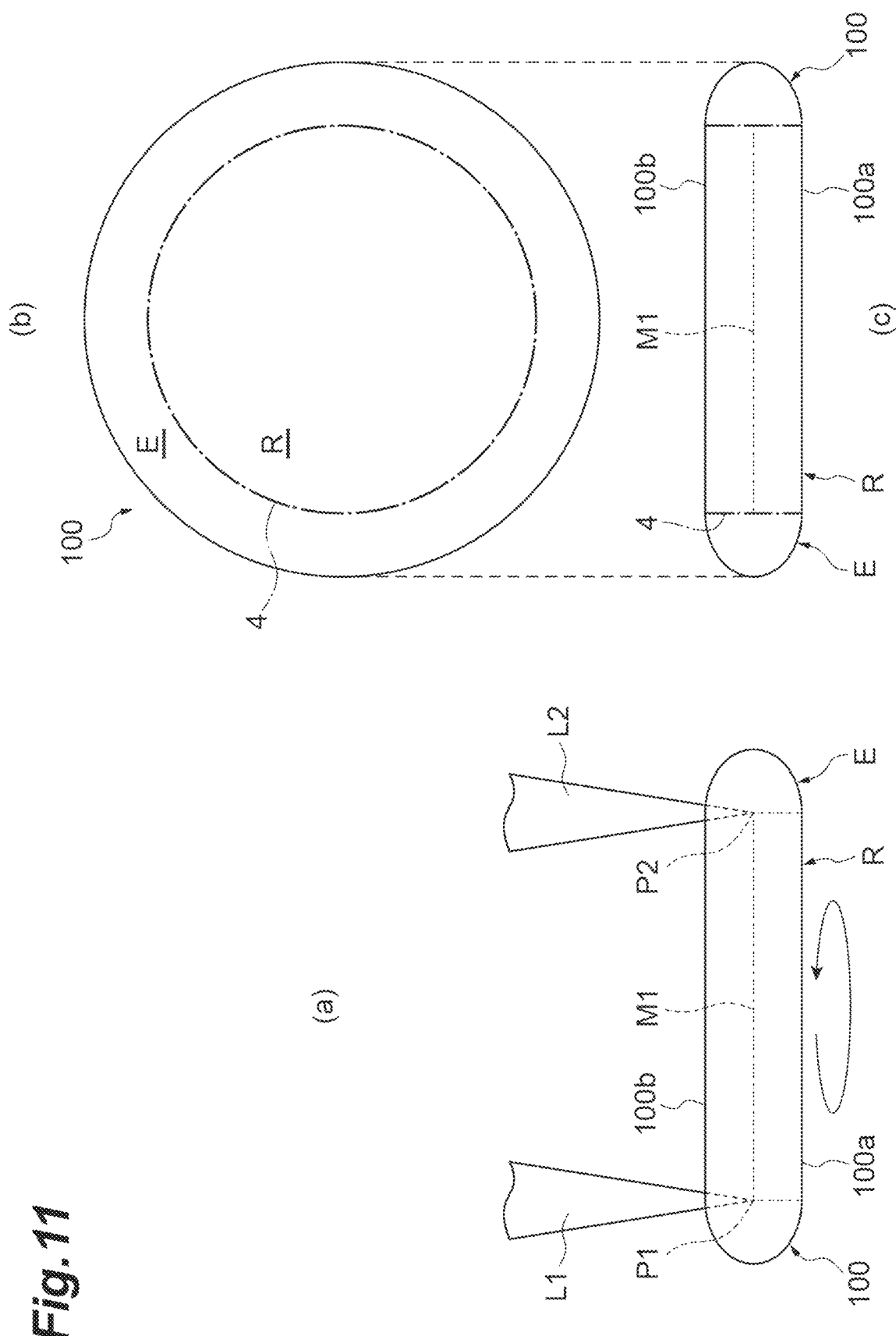
FIG. 11(a) is a side view of a target illustrating trimming processing according to a first embodiment.
FIG. 11(b) is a plan view of the target continuing from FIG. 11(a).
FIG. 11(c) is a side view of the target illustrated in FIG. 11(b).

Then, the trimming processing is implemented. In the trimming processing, the controller 9 performs the circumferential edge process. Specifically, as illustrated in FIG. 11(*a*), starting and stopping of the emission of the first and the second laser lights L1 and L2 in the first and the second laser processing heads 10A and 10B based on the θ information in a state where the first and the second focusing points P1 and P2 are positioned at positions along the circumferential edge of the effective region R) in the target 100, while rotating the stage 107 at a constant rotation speed. In this process, the first and the second focusing points P1 and P2 do not move. As a result, the modified region 4 is formed along the circumferential edge of the effective region R, as illustrated in FIGS. 11(*b*) and 11(*c*). The modified region 4 formed includes the modified spots and cracks extending from the modified spots.

Figure 12:
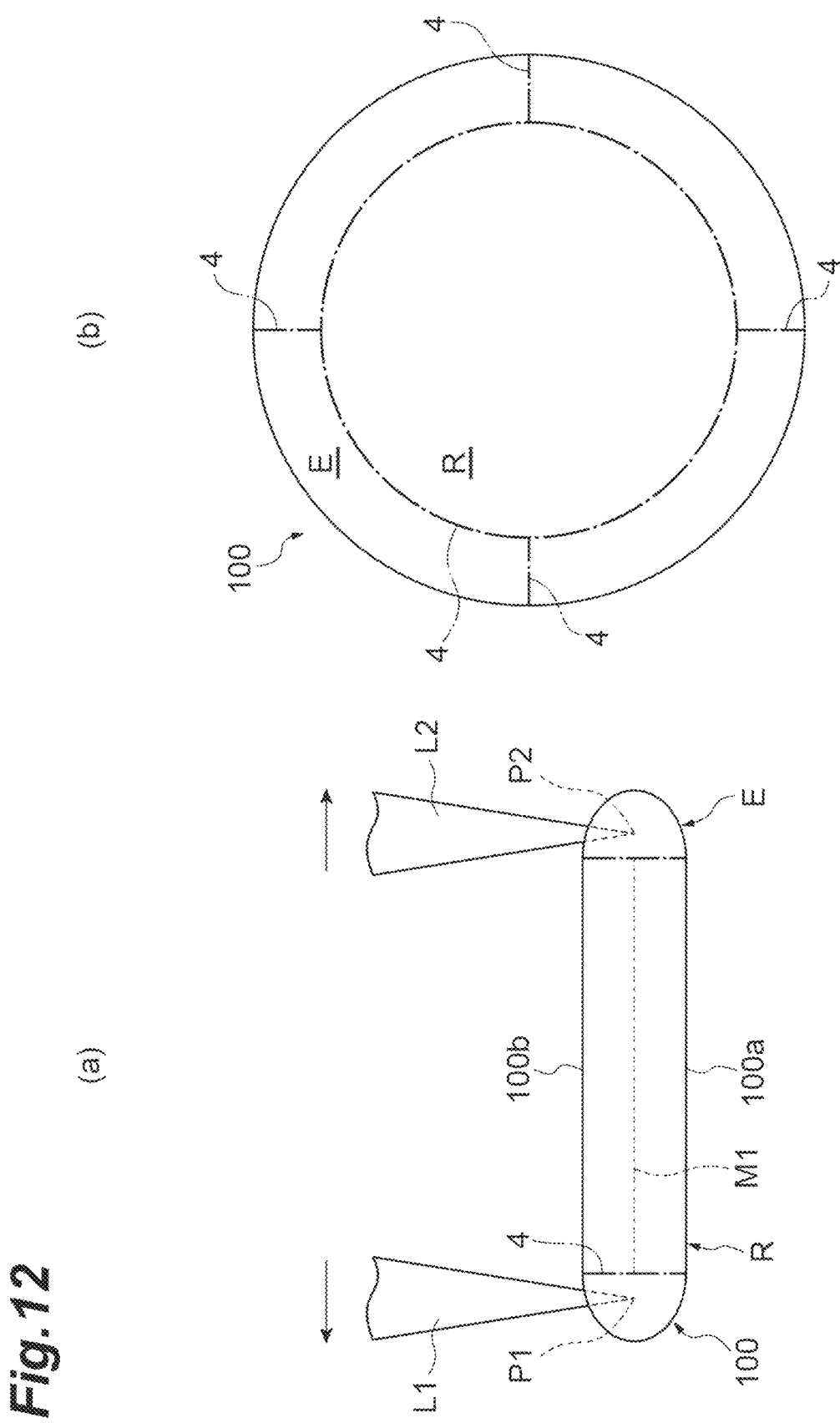
FIG. 12(a) is a side view of the target continuing from FIG. 11(b).
FIG. 12(b) is a plan view of the target continuing from FIG. 12(a).

In the trimming processing, the controller 9 performs the removal process. Specifically, as illustrated in FIG. 12(*a*), the removal region E is irradiated with the first and the second laser lights L1 and L2 without rotating the stage 107. In this process, the first and the second laser processing heads 10A and 10B move in directions away from each other along the X-axis rail 108, and the first and the second focusing points P1 and P2 of the first and the second laser lights L1 and L2 move in directions away from the center of the target 100. The removal region E is irradiated with the first and the second laser lights L1 and L2 after rotating the stage 107 by 90 degrees. Meanwhile, the first and the second laser processing heads 10A and 10B move in directions away from each other along the X-axis rail 108, and the first and the second focusing points P1 and P2 of the first and the second laser lights L1 and L2 move in directions away from the center of the target 100.

Figure 13:
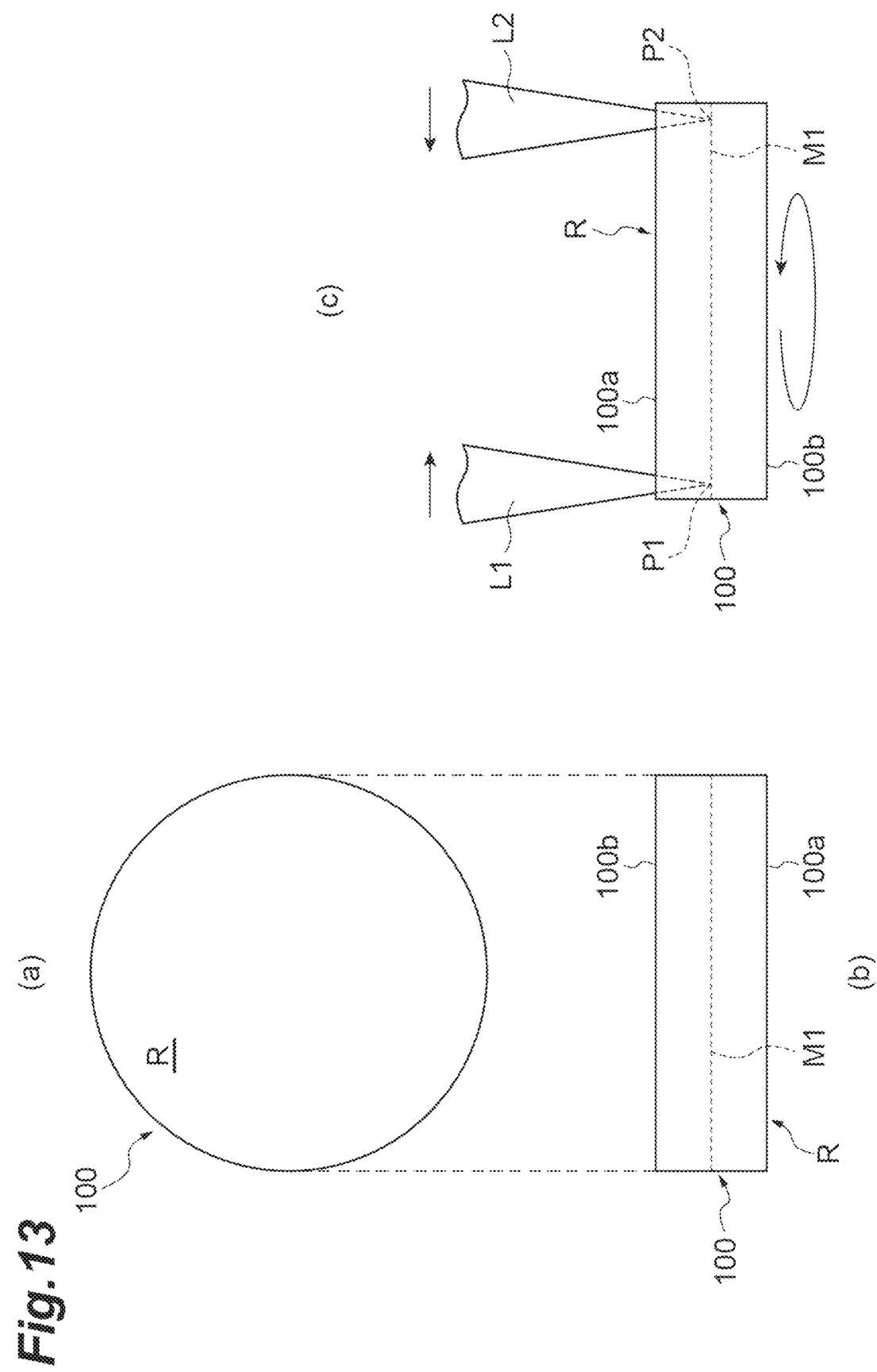
FIG. 13(a) is a plan view of the target continuing from FIG. 12(b).
FIG. 13(b) is a side view of the target illustrated in FIG. 13(a).
FIG. 13(c) is a side view of a target illustrating peeling processing according to the first embodiment.

As a result, as illustrated in FIG. 12(*b*), the modified region 4 is formed along the lines extending to divide the removal region E into four equal parts as viewed in the Z direction. The lines are virtual lines, but may be lines actually drawn. The modified region 4 formed includes the modified spots and cracks extending from the modified spots. The crack may or may not reach at least one of the front surface 100*a* and the back surface 100*b*. Then, as illustrated in FIGS. 13(*a*) and 13(*b*), the removal region E is removed with the modified region 4 serving as a boundary, for example, using a jig or air.

Figure 14:
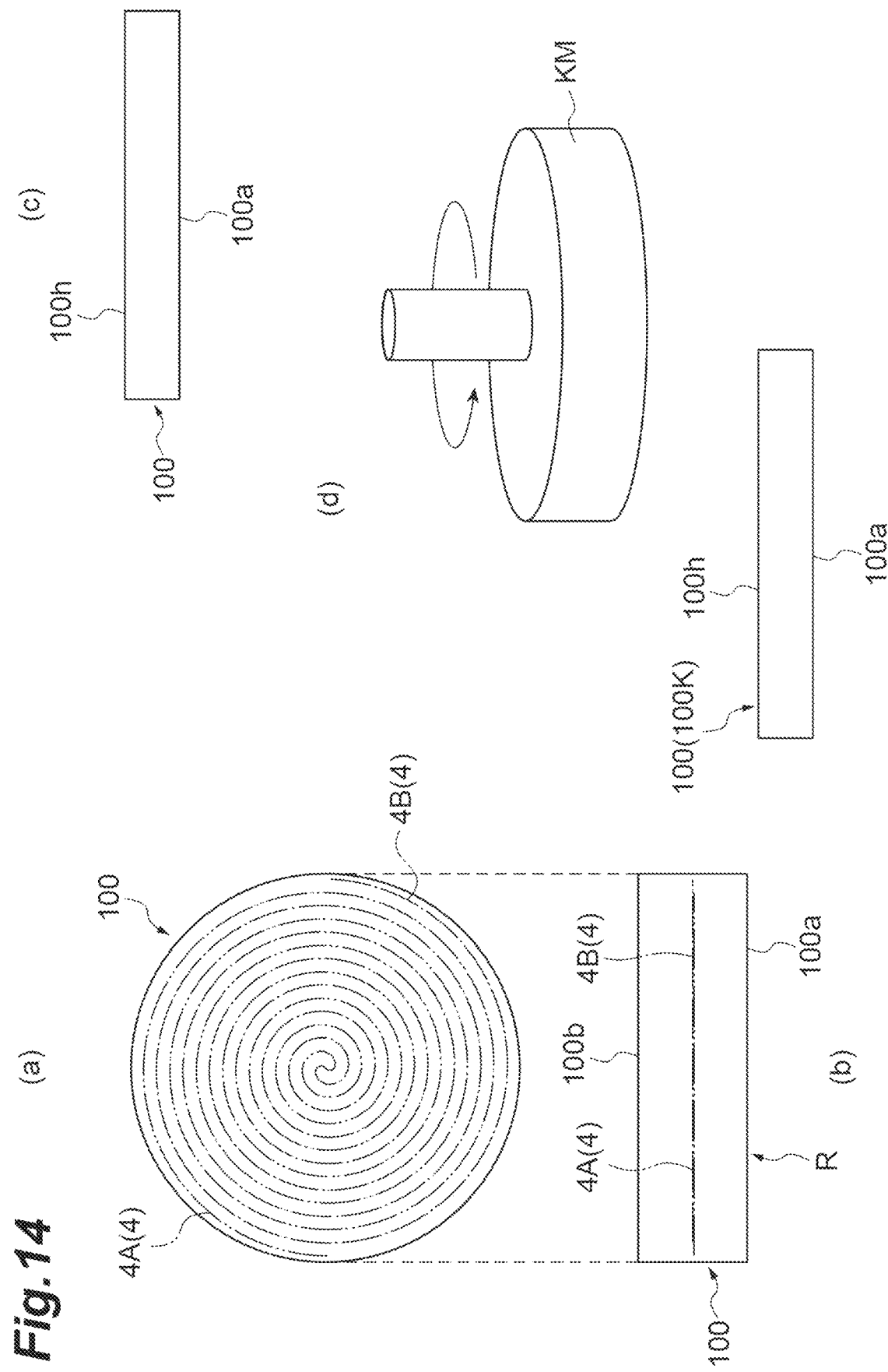
FIG. 14(a) is a plan view of the target continuing from FIG. 13(c).
FIG. 14(b) is a side view of the target illustrated in FIG. 14(a).
FIG. 14(c) is a side view of the target continuing from FIG. 14(a).
FIG. 14(d) is a side view of a target illustrating polishing processing according to the first embodiment.

Then, the peeling processing is performed. In the peeling processing, the controller 9 performs the first peeling process. Specifically, as illustrated in FIG. 13(*c*), the first and the second laser lights L1 and L2 are emitted respectively from the first and the second laser processing heads 10A and 10B while rotating the stage 107 at a constant rotation speed. At the same time, the first and the second laser processing heads 10A and 10B move along the X-axis rail 108 so that the first and the second focusing points P1 and P2 approach each other in the X direction from the outer edge side of the virtual plane M1. As a result, as illustrated in FIGS. 14(*a*) and 14(*b*), first and second modified regions 4A and 4B of a spiral shape (involute curve) around the position of the rotation axis C along the virtual plane M1 inside the target 100 are formed. The first and the second modified regions 4A and 4B do not overlap with each other. Hereinafter, the first and the second modified regions 4A and 4B may each be simply referred to as a modified region 4.

Next, as illustrated in FIG. 14(*c*), a part of the target 100 is peeled with the first and the second modified regions 4A and 4B over the virtual plane M1 serving as boundaries, using the suction jig for example. The peeling of the target 100 may be performed on the stage 107, or may be performed after moving the target 100 to an area dedicated for peeling. The target 100 may be peeled by using air blow or a tape material. When the target 100 cannot be peeled by using external stress only, the first and the second modified regions 4A and 4B may be selectively etched with an etching solution (such as KOH or TMAH) that reacts with the target 100. As a result, the target 100 can be easily peeled. As illustrated in FIG. 14(*d*), a peeled surface 100*h* of the target 100 is finished by grinding or polishing with an abrasive KM such as a grindstone. When the target 100 is peeled by etching, the polishing can be simplified. As a result of the above, a semiconductor device 100K is obtained.

Next, the first peeling process of the peeling processing described above will be described in detail.

Figure 15:
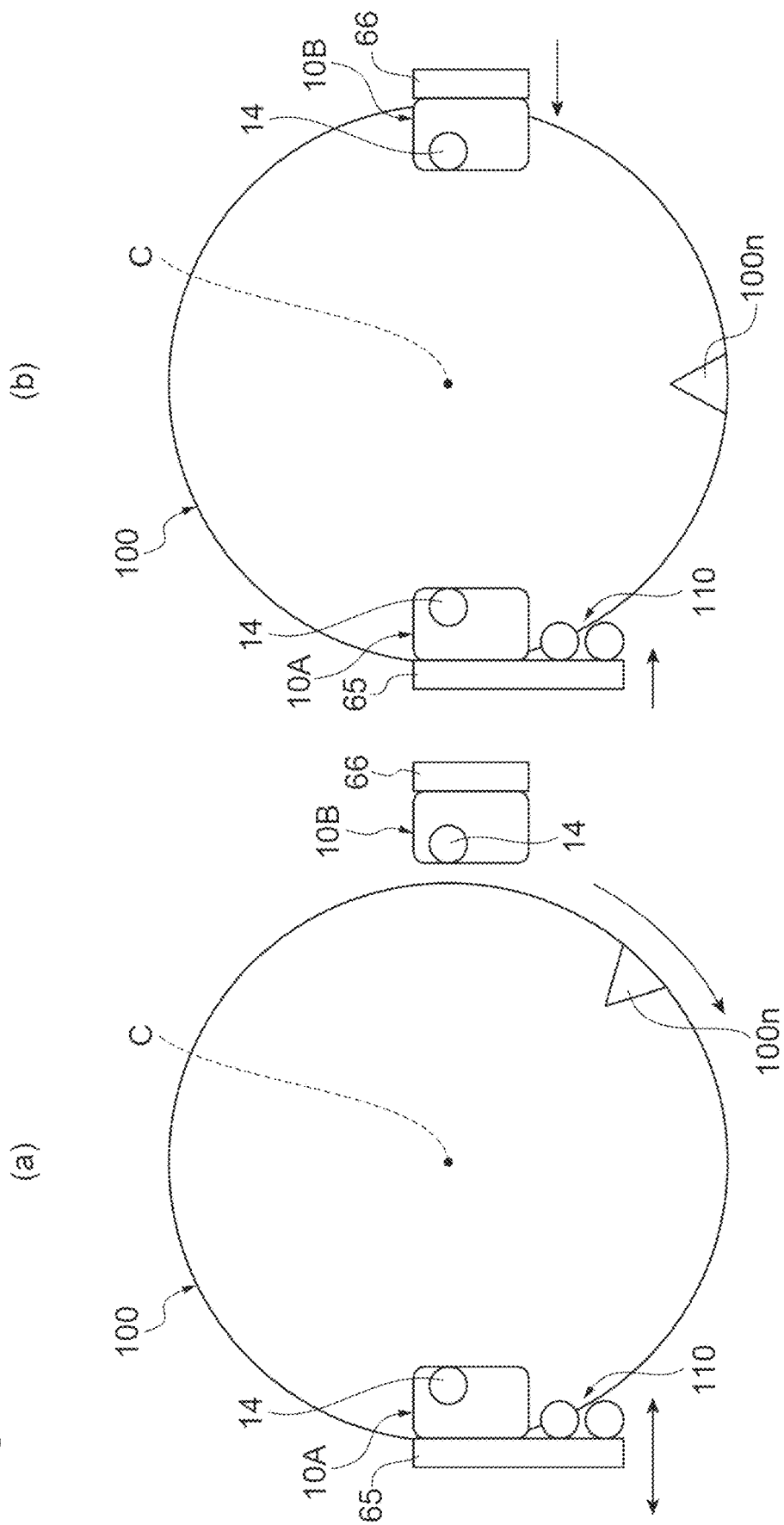
FIG. 15(a) is a plan view of a target illustrating a first peeling process according to the first embodiment.
FIG. 15(b) is a plan view of the target continuing from FIG. 15(a).

First of all, as illustrated in FIG. 15(a), the stage 107 is rotated and the first laser processing head 10A on which the alignment camera 110 is attached is moved along the X-axis rail 108 and the first Z-axis rail 106A, to make the alignment camera 110 positioned immediately above the alignment target 100n of the target 100, and make the alignment camera 110 focused on the alignment target 100n. This alignment target 100n is a notch. The alignment target 100n is not particularly limited, and may be an orientation flat of the target 100 or a pattern of the functional element.

The alignment camera 110 captured an image. The 0 degree direction position of the target 100 is acquired based on the image captured by the alignment camera 110. The 0 degree direction position is a reference position of the target 100 in the rotation direction (hereinafter, also referred to as "θ direction") about the rotation axis C of the stage 107. For example, the alignment target 100n has a fixed relation in the θ direction relative to the 0 degree direction position, and thus the 0 degree direction position can be acquired by obtaining the position of the alignment target 100n from the captured image. The diameter of the target 100 is acquired based on the image captured by the alignment camera 110. The diameter of the target 100 may be set by an input from the user.

Then, as illustrated in FIG. 15(b), the stage 107 is rotated to position the target 100 at the 0 degree direction position. The first and the second laser processing heads 10A and 10B are moved along the X-axis rail 108 to position the first and the second focusing points P1 and P2 at predetermined peeling start positions in the X direction. The first and the second laser processing heads 10A and 10B are moved along the Z-axis rail to position the first and the second focusing points P1 and P2 on the virtual plane M1 in the Z direction. For example, the predetermined peeling start position is a predetermined position in an outer circumferential portion of the target 100.

Then, the rotation of the stage 107 starts. The ranging sensor starts following the back surface 100b. Before the following by the ranging sensor, the positions of the first and the second focusing points P1 and P2 are confirmed to be within a measurable range of the ranging sensor in advance. The first and the second laser processing heads 10A and 10B start emitting the first and the second laser lights L1 and L2 when a constant rotation speed (constant speed) of the stage 107 is achieved.

Figure 16:
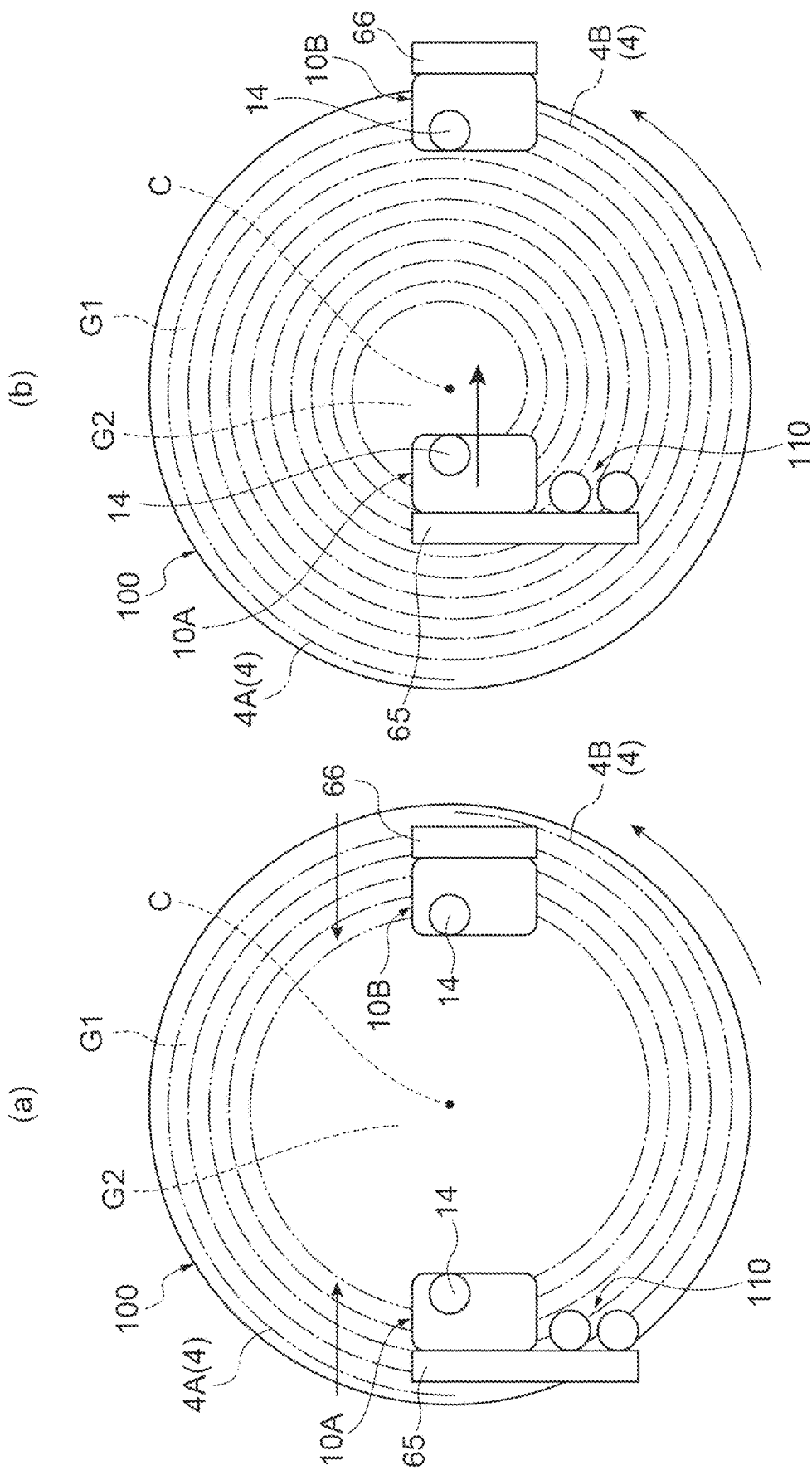
FIG. 16(a) is a plan view of the target continuing from FIG. 15(b).
FIG. 16(b) is a plan view of the target continuing from FIG. 16(a).

As illustrated in FIG. 16(a), the first and the second laser processing heads 10A and 10B move along the X-axis rail 108 so that the first and the second focusing points P1 and P2 approach each other in the X direction, in a first region G1 on the outer circumferential side far from the rotation axis C in the target 100 when viewed in the Z direction. In this process, the first and the second focusing points P1 and P2 are each moved in the X direction, while maintaining a constant distance between the rotation axis C and the first focusing point P1 and the rotation axis C and the second focusing point P2.

Next, as illustrated in FIG. 16(b), before the first and the second laser processing heads 10A and 10B come into contact with each other, only the first laser processing head 10A moves along the X-axis rail 108 so that only the first focusing point P1 approaches the position of the rotation axis C, in a second region G2 on the inner side close to the rotation axis C of the target 100 as viewed in the Z direction. In this process, emission of the second laser light L2 from the second laser processing head 10B is stopped. When an IR camera for monitoring is attached to the second laser processing head 10B, evaluation regarding whether the target peeling processing is performed may be implemented based on the result of the monitoring by the IR camera.

If the removal region E is not removed in the trimming processing before the peeling processing, when the second region G2 is processed with only the first laser processing head 10A moved along the X-axis rail 108, the trimming processing may be performed with the second laser processing head 10B. Thus, starting and stopping of the emission of the second laser light L2 in the second laser processing head 10B based on the θ information in a state where the second focusing point P2 is positioned at a position along the circumferential edge of the effective region R in the target 100, while rotating the stage 107, to form the modified region 4 along the circumferential edge of the effective region R.

Figure 17:
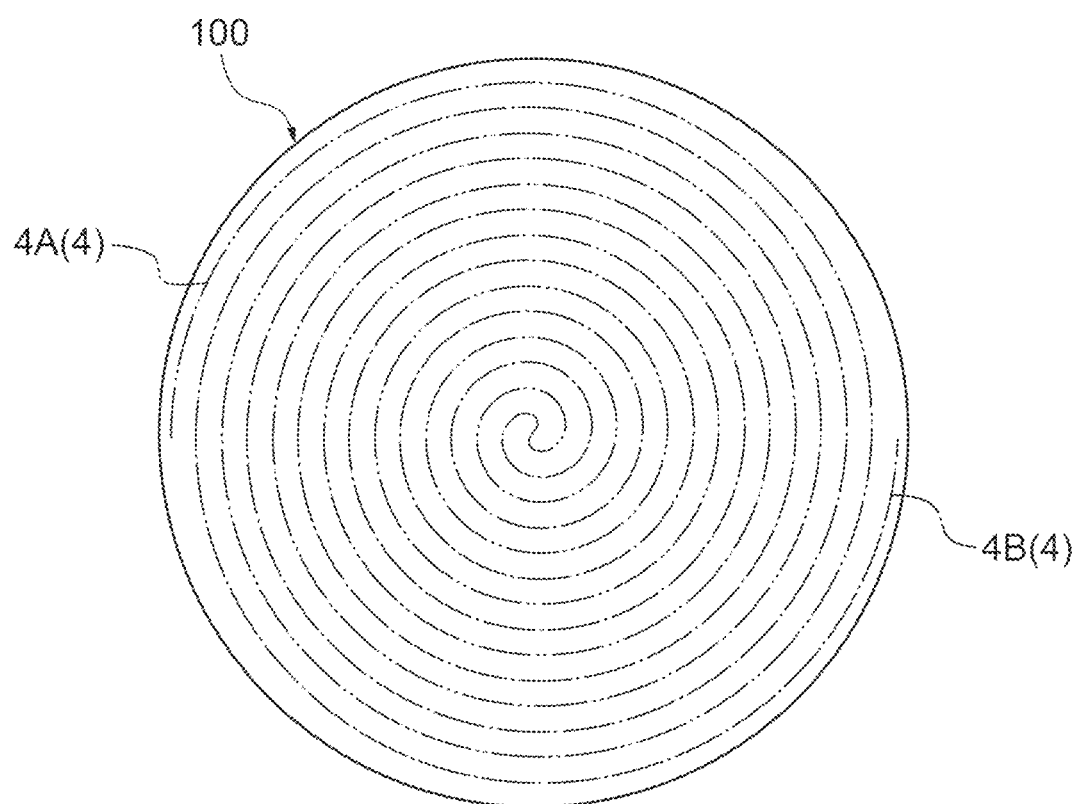
FIG. 17 is a plan view of the target continuing from FIG. 16(b).

When the first focusing point P1 reaches the position of the rotation axis C or the periphery thereof, the emission of the first laser light L1 is stopped, and then the rotation of the stage 107 is stopped. As described above, as illustrated in FIG. 17, the first modified region 4A that is formed in a spiral shape around the position of the rotation axis C as viewed in the Z direction, and the second modified region 4B that is formed in a spiral shape around the position of the rotation axis C as viewed in the Z direction and does not overlap with the first modified region 4A are formed along the virtual plane M1 in the target 100.

As described above, with the laser processing apparatus 101, more modified regions 4 can be formed simultaneously or in parallel, when performing various types of processing on the target 100, whereby better takt time can be achieved. Various processes can be efficiently performed on the target 100.

In the laser processing apparatus 101, the controller 9 performs a first peeling process of forming first and second modified regions 4A and 4B along the virtual plane M1 in the target 100, by making the first and the second laser lights L1 and L2 emitted from the first and the second laser processing heads 10A and 10B, respectively, and controlling the movement of the first and the second focusing points P1 and P2 in the X direction, while rotating the stage 107. In this case, the peeling processing can be efficiently performed, using the first and the second laser processing heads 10A and 10B.

In the first peeling process performed by the laser processing apparatus 101, the first and the second focusing points P1 and P2 are moved in the X direction to approach each other while rotating the stage 107, to form the first modified region 4A that has a spiral shape around the position of the rotation axis C of the stage 107, and to form the second modified region 4B that has a spiral shape around the position of the rotation axis C of the stage 107 and does not overlap with the first modified region 4A. As a result, a part of the target 100 can be peeled with the first and the second modified regions 4A and 4B serving as boundaries. The efficient peeling processing can be specifically implemented.

In the laser processing apparatus 101, the controller 9 controls at least any of rotation of the stage 107, the emission of the first and the second laser lights L1 and L2 from the first and the second laser processing heads 10A and 10B, and the movement of the first and the second focusing points P1 and P2, to achieve a constant pitch between the plurality of first modified spots included in the first modified region 4A and a constant pitch between the plurality of second modified spots included in the second modified region 4B. Thus, with the constant pitches between the plurality of first and second modified spots achieved, processing failure such as separation failure that may occur when the separation is performed using the first and the second modified regions 4A and 4B for example.

In the first peeling process by the laser processing apparatus 101, the first and the second focusing points P1 and P2 are each moved in the X direction, while maintaining a constant distance between the rotation axis C of the stage 107 and the first focusing point P1 and between the rotation axis C of the stage 107 and the second focusing point P2. As a result, the circumferential speed at the position of the first focusing point P1 and the circumferential speed at the position of the second focusing point P2 become equal to each other in the target 100. The peeling processing can be performed with the pitches between the plurality of first and second modified spots set to be constant (become constant, become uniform).

In the laser processing apparatus 101, the controller 9 makes the first and the second laser processing heads 10A and 10B start and stop emitting the first and the second laser lights L1 and L2 in a state where a constant rotation speed (constant speed) of the stage 107 is achieved. Thus, the pitches between the plurality of first and second modified spots can be set to be constant.

In the laser processing apparatus 101, the trimming processing and the peeling processing can be performed with good quality by acquiring the 0 degree direction position before the trimming processing and the peeling processing are performed. The crystal plane of a cleavage plane of the target 100 or the like and the 0 degree direction position (position of the alignment target 100n) are in a fixed relationship. Thus, processing can be performed while taking the crystal plane of the target 100 into consideration (processing suitable for the crystal plane) by acquiring the 0 degree direction position.

Further, in the circumferential edge process performed by the laser processing apparatus 101, the emission of the first and the second laser lights L1 and L2 is started and stopped using the θ information. With this configuration, when the modified region 4 is formed along the circumferential edge of the effective region R of the target 100, the modified region 4 can be accurately controlled so as not to be formed in an overlapping manner (that is, so as not to emit the first and the second laser lights L1 and L2 redundantly onto the same portion). The trimming processing can be accurately performed.

In the circumferential edge process performed by the laser processing apparatus 101, the first and the second laser processing heads 10A and 10B start and stop emitting each of the first and the second laser lights L1 and L2 in a state where a constant rotation speed (constant speed) of the stage 107 is achieved. Thus, a constant pitch between a plurality of modified spots included in the modified region 4 formed by the circumferential edge process can be achieved.

In the laser processing apparatus 101, the controller 9 performs the removal process of forming the modified region 4 in the removal region E, by irradiating the removal region E with the first and the second laser lights L1 and L2 while moving the first and the second focusing points P1 and P2, without rotating the stage 107. With this process, the removal region E can be easily separated and removed.

In the removal process performed by the laser processing apparatus 101, the first and the second focusing points P1 and P2 move in a direction away from the center of the target 100. In this case, the separation of the removal region described above can be specifically implemented. Note that in the removal process, the first and the second focusing points P1 and P2 may move in a direction toward the center of the target 100.

Figure 18:
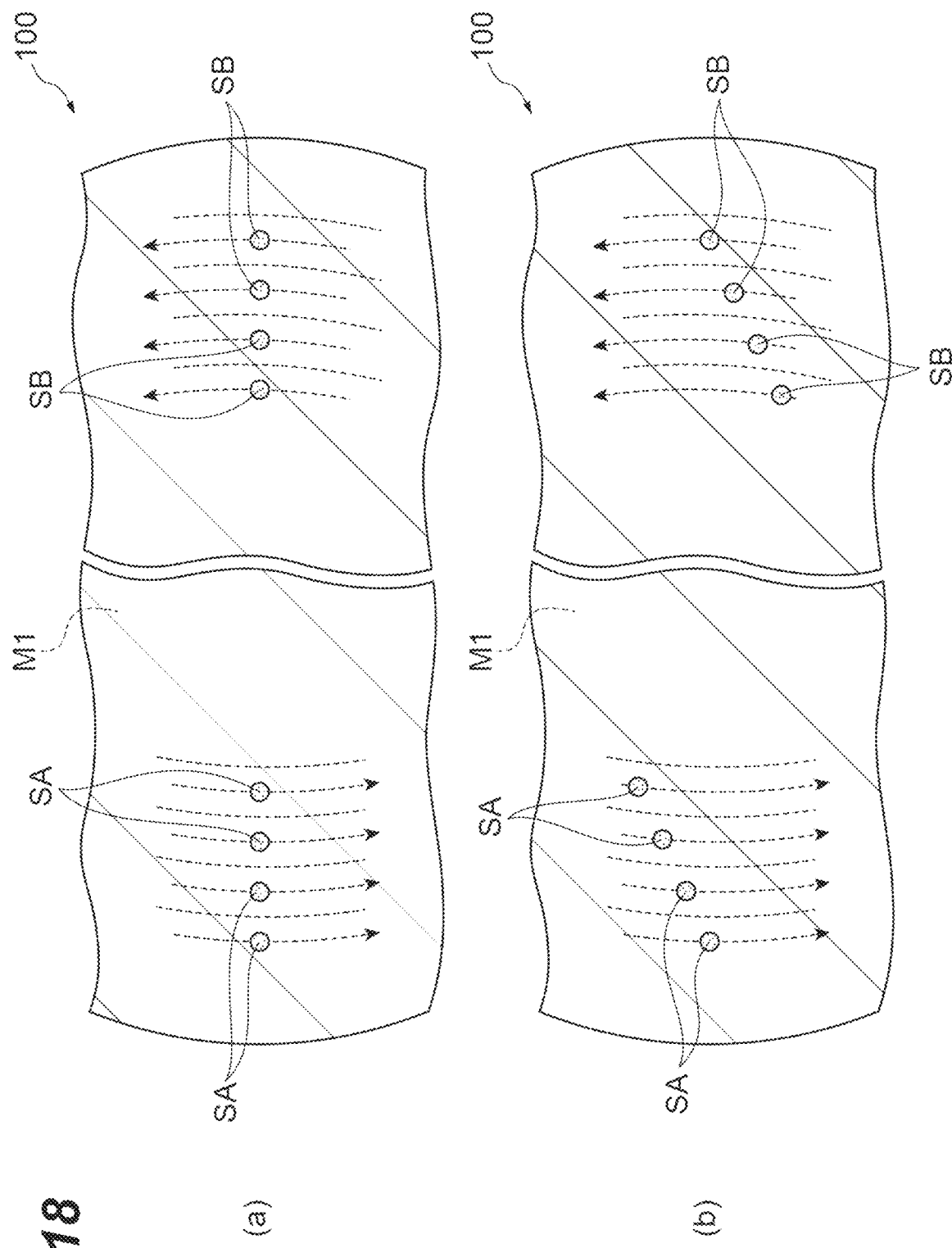
FIG. 18(a) is a diagram illustrating an example of a case where first and second laser lights are branched.
FIG. 18(b) is a diagram illustrating another example of a case where the first and the second laser lights are branched.

FIG. 18(a) is a diagram illustrating an example of a case where the first and the second laser lights L1 and L2 are branched. FIG. 18(b) is a diagram illustrating another example of a case where the first and the second laser lights L1 and L2 are branched. FIGS. 18(a) and 18(b) are cross-sectional view of the target 100 illustrating an example of a case where the modified region 4 is formed in the virtual plane M1 is formed in the peeling processing. A broken line arrow in the figure indicates the processing proceeding direction (a direction in which the first and the second laser lights L1 and L2 emitted advances, scanning direction).

As illustrated in FIGS. 18(a) and 18(b), the first laser light L1 is branched into a plurality of branched first laser lights, and a plurality of first modified spots (modified spots) SA may be formed on the virtual plane M1 due to the focusing of the plurality of branched first laser lights. The second laser light L2 is branched into a plurality of branched second laser lights, and a plurality of second modified spots (modified spots) SB may be formed on the virtual plane M1 due to the focusing of the plurality of branched second laser lights. The branching of the first and the second laser lights L1 and L2 can be implemented by using, for example, the reflective spatial light modulator 34 (see FIG. 5).

In particular, as illustrated in FIG. 18(a), the first laser light L1 may be branched to form, on the virtual plane M1, the first modified spots SA arranged in a single row along the orthogonal direction orthogonal direction to the processing proceeding direction. The second laser light L2 may be branched to form, on the virtual plane M1, the second modified spots SB arranged in a single row along the orthogonal direction orthogonal direction to the processing proceeding direction. Alternatively, as illustrated in FIG. 18(b), the first laser light L1 may be branched to form, on the virtual plane M1, the first modified spots SA arranged in a single row along a direction inclined with respect to the orthogonal direction. The second laser light L2 may be branched to form, on the virtual plane M1, the second modified spots SB arranged in a single row along a direction inclined with respect to the orthogonal direction orthogonal direction. Such branching of the first and the second laser lights L1 and L2 may be applied to any laser light emitted for the peeling processing.

In the present embodiment, in the trimming processing, the first laser light L1 may be branched to form a plurality of focusing points in the Z direction, so that a plurality of modified spots are simultaneously formed in the Z direction. The branching of the first laser light L1 can be implemented by using, for example, the reflective spatial light modulator 34 (see FIG. 5). Such branching of the first laser light L1 may be applied to any laser light emitted for the trimming processing.

In the present embodiment, the number of laser processing heads may be one or more than three. When there is a single laser processing head, this one laser processing head may sequentially perform operations similar to those performed by the first and the second laser processing heads 10A and 10B. When there are three or more laser processing heads, some of the laser processing heads may perform an operation that is similar to that performed by the first laser processing head 10A, and the remaining laser processing heads may perform an operation that is similar to that performed by the second laser processing head 10B.

In the present embodiment, only the peeling processing may be performed, or only the trimming processing may be performed. When only the peeling processing is performed, the process can be the same regardless of the position in the target 100 in the θ direction. Thus, the step of acquiring the 0 degree direction position from the image captured by the alignment camera 110 and the step of positioning the target 100 at the 0 degree direction position by rotating the stage 107 may not be included. For the same reason, the alignment camera 110 may be omitted when only the peeling processing is performed.

In the first peeling process of the present embodiment, while rotating the stage 107, the first and the second focusing points P1 and P2 are moved in the X direction (moved from the outer side toward the inner side) to approach each other, but the first and the second focusing points P1 and P2 may move in the X direction to be separated from each other (from the inner side toward the outer side).

In the present embodiment, when the ranging sensor is a sensor having a different axis, a process of separately performing following of the laser light incident surface by the ranging sensor to acquire displacement data of the laser light incident surface (what is called trace process) may be performed. In the present embodiment, various adjustments (calibration) such as output adjustment for the laser processing described above may be performed in the first and the second laser processing heads 10A and 10B before the laser processing described above is performed.

In the present embodiment, in the peeling processing, control us performed to achieve a constant pitch between the first and the second modified spots SA and SB, but variation (fluctuation) of the pitch is tolerable as long as the target 100 can be peeled.

In the present embodiment, the first and the second laser processing heads 10A and 10B move to move the first and the second focusing points P1 and P2, but the present invention is not limited to this. At least one of the stage 107 and the first laser processing head 10A may move to move the first focusing point P1 along the vertical direction. At least one of the stage 107 and the second laser processing head 10B may move to move the second focusing point P2 along the vertical direction. At least one of the stage 107 and the first laser processing head 10A may move to move the first focusing point P1 along the horizontal direction. At least one of the stage 107 and the second laser processing head 10B may move to move the second focusing point P2 along the horizontal direction.

Second Embodiment

Next, a laser processing apparatus according to a second embodiment will be described. In the description of the second embodiment, the points different from those in the first embodiment will be described, and the description that is given in the first embodiment will not be redundantly given.

In the second embodiment, the circumferential edge process performed by the controller 9 includes a first orbit process and a helix process. In the first orbit process, the first and the second laser lights L1 and L2 are emitted, with the first and the second focusing points P1 and P2 of the first and the second laser lights L1 and L2 positioned at predetermined positions in the Z direction, while rotating the stage 107, and the emission of the first and the second laser lights L1 and L2 is stopped when the stage 107 makes a single turn (rotation by 360 degrees) after the emission of the first and the second laser lights L1 and L2 has started. Thus, the modified region 4 in an annular shape is formed along the circumferential edge of the effective region R.

The first orbit process includes a first process of forming an annular modified region 41 along the circumferential edge on the front surface 100a side of the effective region R (side opposite to the laser light incident surface side in the Z direction) and a second process of forming an annular modified region 42 along the circumferential edge on the back surface 100b side of the effective region R (the laser light incident surface side in the Z direction). In the helix process, the first and the second focusing points P1 and P2 of the first and the second laser lights L1 and L2 emitted move in the Z direction while rotating the stage 107, to form the modified region 43 of a helical shape along the circumferential edge between the front surface 100a side and the back surface 100b side of the effective region R.

An example of an operation for performing the trimming processing in the laser processing apparatus according to the second embodiment will be described in detail.

Figure 19:
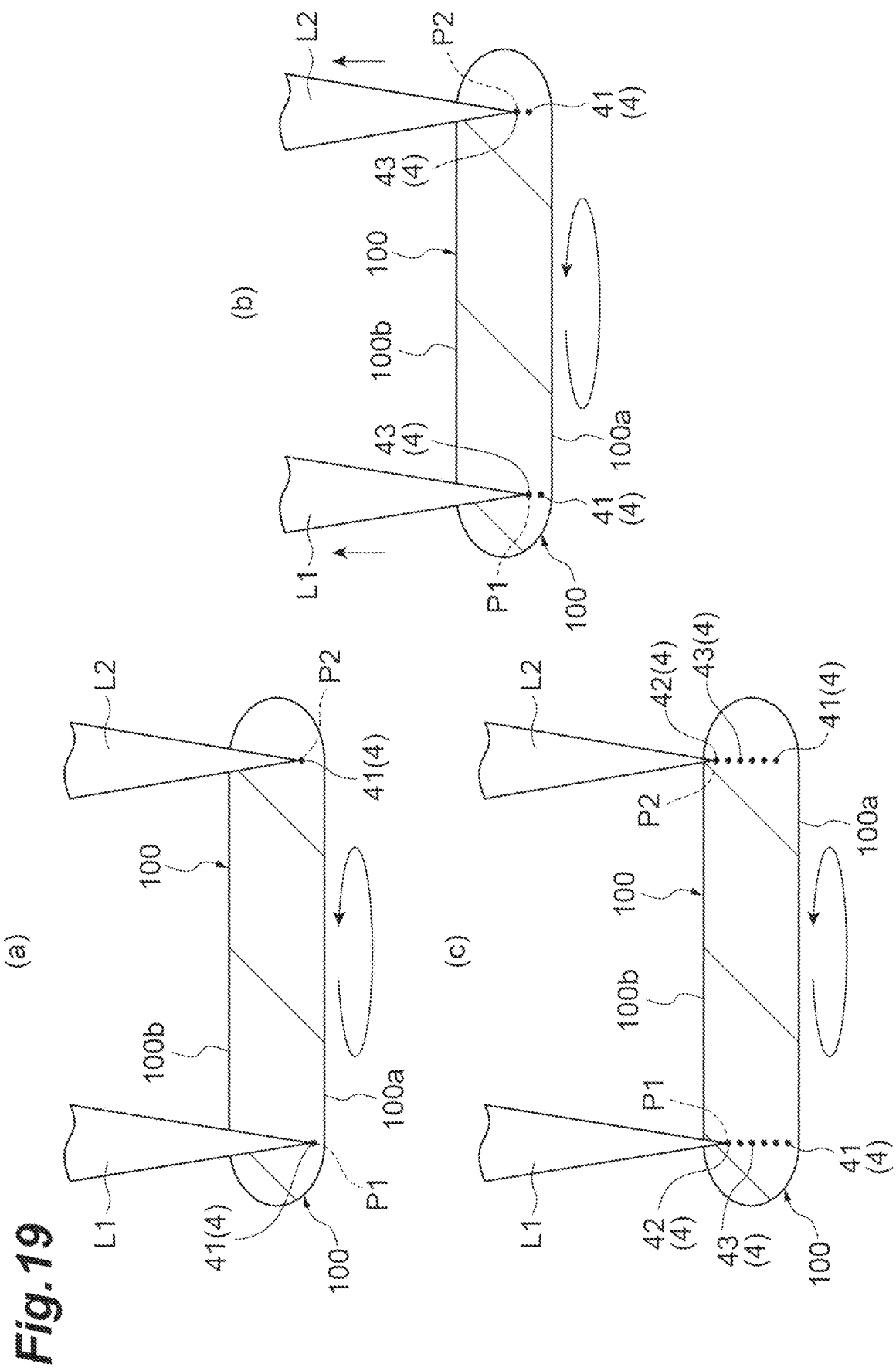
FIG. 19(a) is a side view of a target illustrating trimming processing according to a second embodiment.
FIG. 19(b) is a side view of the target continuing from FIG. 19(a).
FIG. 19(c) is a side view of the target continuing from FIG. 19(b).

First of all, the controller 9 performs the first process of the first orbit process. Specifically, in the first process, as illustrated in FIG. 19(a), the first focusing point P1 is positioned at a position on the front surface 100a side of the effective region R of the target 100, and the second focusing point P2 is positioned at a position separated (shifted) from the first focusing point P1 in the Z direction on the front surface 100a side of the effective region R of the target 100. In this state, the first and the second laser lights L1 and L2 are emitted while the stage 107 rotates at a constant rotation speed. When the stage 107 makes a single turn after the emission of the first and the second laser lights L1 and L2 has started, the emission of the first and the second laser lights L1 and L2 stops. In this process, the first and the second focusing points P1 and P2 do not move. As a result, two rows of the annular modified regions 41 are formed along the circumferential edge on the front surface 100a side of the effective region R.

Next, the controller 9 performs the helix process. Specifically, in the helix process, as illustrated in FIG. 19(b), the first and the second laser lights L1 and L2 are emitted while the stage 107 rotates at a constant rotation speed. At the same time, the first and the second laser processing heads 10A and 10B respectively move along the first and the second Z-axis rails 106A and 106B to move the first and the second focusing points P1 and P2 toward the back surface 100b side at the circumferential edge between the front surface 100a side and the back surface 100b side of the effective region R. In this process, the first and the second focusing points P1 and P2 moves to a position closer to the back surface 100b from a position closer to the front surface 100a at the center of the effective region R in the Z direction. As a result, the modified region 43 of a double helical shape is formed along the circumferential edge between the front surface 100a side and the back surface 100b side of the effective region R.

Next, the controller 9 performs the second process of the first orbit process. Specifically, in the second process, as illustrated in FIG. 19(c), the first focusing point P1 is positioned at a position on the back surface 100b side of the effective region R of the target 100, and the second focusing point P2 is positioned at a position separated (shifted) from the first focusing point P1 in the Z direction on the back surface 100b side of the effective region R of the target 100. In this state, the first and the second laser lights L1 and L2 are emitted while the stage 107 rotates at a constant rotation speed. When the stage 107 makes a single turn after the emission of the first and the second laser lights L1 and L2 has started, the emission of the first and the second laser lights L1 and L2 stops. In this process, the first and the second focusing points P1 and P2 do not move. As a result, two rows of the annular modified regions 42 are formed along the circumferential edge on the back surface 100b side of the effective region R.

Figure 20:
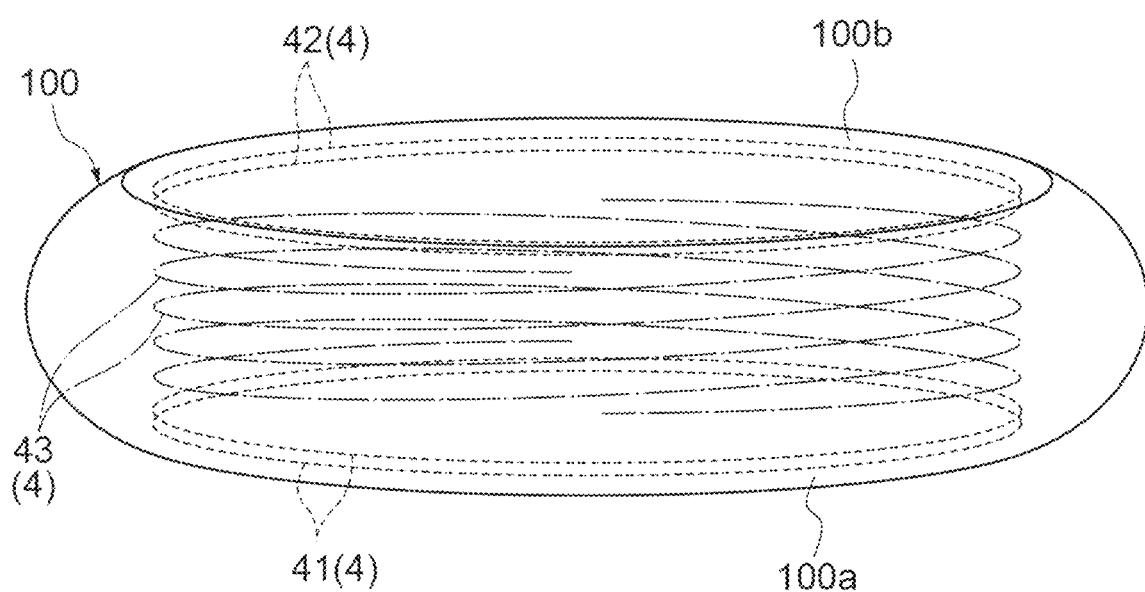
FIG. 20 is a perspective view of the target continuing from FIG. 19(c).

As a result of the above, as illustrated in FIG. 20, the modified region 4 is formed along the circumferential edge of the effective region R of the target 100. The modified regions 41 and 42 on the front surface 100a side and one the back surface 100b side of the circumferential edge of the effective region R have an annular shape. The modified region 43 between the front surface 100a and the back surface 100b side of the circumferential edge of the effective region R has a double helical shape. Cracks extending from the modified regions 41 and 42 on the front surface 100a side and the back surface 100b side of the circumferential edge of the effective region R, extend along the circumferential edge of the effective region R and reach the front surface 100a and the back surface 100b to be exposed.

As described above, also with the laser processing apparatus according to the second embodiment, more modified regions 4 can be formed simultaneously or in parallel, when performing various types of processing on the target 100, whereby better takt time can be achieved. Various processes can be efficiently performed on the target 100. Also with the laser processing apparatus according to the second embodiment, the trimming processing can be accurately performed.

The circumferential edge process performed by the laser processing apparatus according to the second embodiment includes the first orbit process in which the first and the second laser lights L1 and L2 are emitted with the first and the second focusing points P1 and P2 positioned at predetermined positions in the Z direction while rotating the stage 107, and the emission of the first and the second laser lights L1 and L2 is stopped when the support portion makes a single turn after the emission has started. Thus, the modified regions 41 and 42 in an annular shape are formed along the circumferential edge of the effective region R. With the first orbit process, the modified regions 41 and 42 in an annular shape can be each formed along a single turn along the circumferential edge without overlapping each other, at a predetermined position in the Z direction of the target 100, along the circumferential edge of the effective region R.

The first orbit process performed by the laser processing apparatus according to the second embodiment includes a first process of forming an annular modified region 41 along the circumferential edge on the front surface 100a side of the effective region R and a second process of forming an annular modified region 42 along the circumferential edge on the back surface 100b side of the effective region R. As a result, on the front surface 100a side and the back surface 100b side of the effective region R, cracks extending from the modified region 4 reach the front surface 100a and the back surface 100b, whereby cracks (half-cut or full cut) exposed on the front surface 100a and the back surface 100b can be reliably formed.

The circumferential edge process performed by the laser processing apparatus according to the second embodiment includes the helix process in which the first and the second focusing points P1 and P2 move in the Z direction while rotating the stage 107, to form the modified region 43 of a helical shape along the circumferential edge between the front surface 100a side and the back surface 100b side of the effective region R. As a result, the modified region 43 of a helical shape is formed along the circumferential edge without overlapping between the front surface 100a side and the back surface 100b side of the effective region R, whereby the trimming processing can be efficiently performed.

On the front surface 100a side of the target 100, one or three or more rows of the annular modified region 41 may be formed. On the front surface 100a side of the target 100, the annular modified region 41 may not be formed. On the back surface 100b side of the target 100, one or three or more rows of the annular modified region 42 may be formed. On the back surface 100b side of the target 100, the annular modified region 42 may not be formed. The helical modified region 43 may not be formed between the front surface 100a side and the back surface 100b side of the target 100. In some cases, the cracks extending from the modified regions 41 and 43 may not reach at least one of the front surface 100a and the back surface 100b.

Third Embodiment

Next, a laser processing apparatus according to a third embodiment will be described. In the description of the third embodiment, the points different from those in the first embodiment will be described, and the description that is given in the first embodiment will not be redundantly given.

In a first peeling process performed by the controller 9 in the laser processing apparatus of the third embodiment, the modified region 4 is formed in the first region G1 with the stage 107 rotated at a first rotation speed v. The modified region 4 is formed in the second region G2 with the stage 107 rotated at a second rotation speed v' faster than the first rotation speed v. Specifically, the controller 9 controls the rotation speed of the stage 107 to satisfy the following formula. The controller 9 sets the second rotation speed v' to be faster than the first rotation speed v, so that approximately constant pitches of the modified spots of the first and the second modified regions 4A and 4B are achieved.

First rotation speed $v$<second rotation speed $v'$

Figure 21:
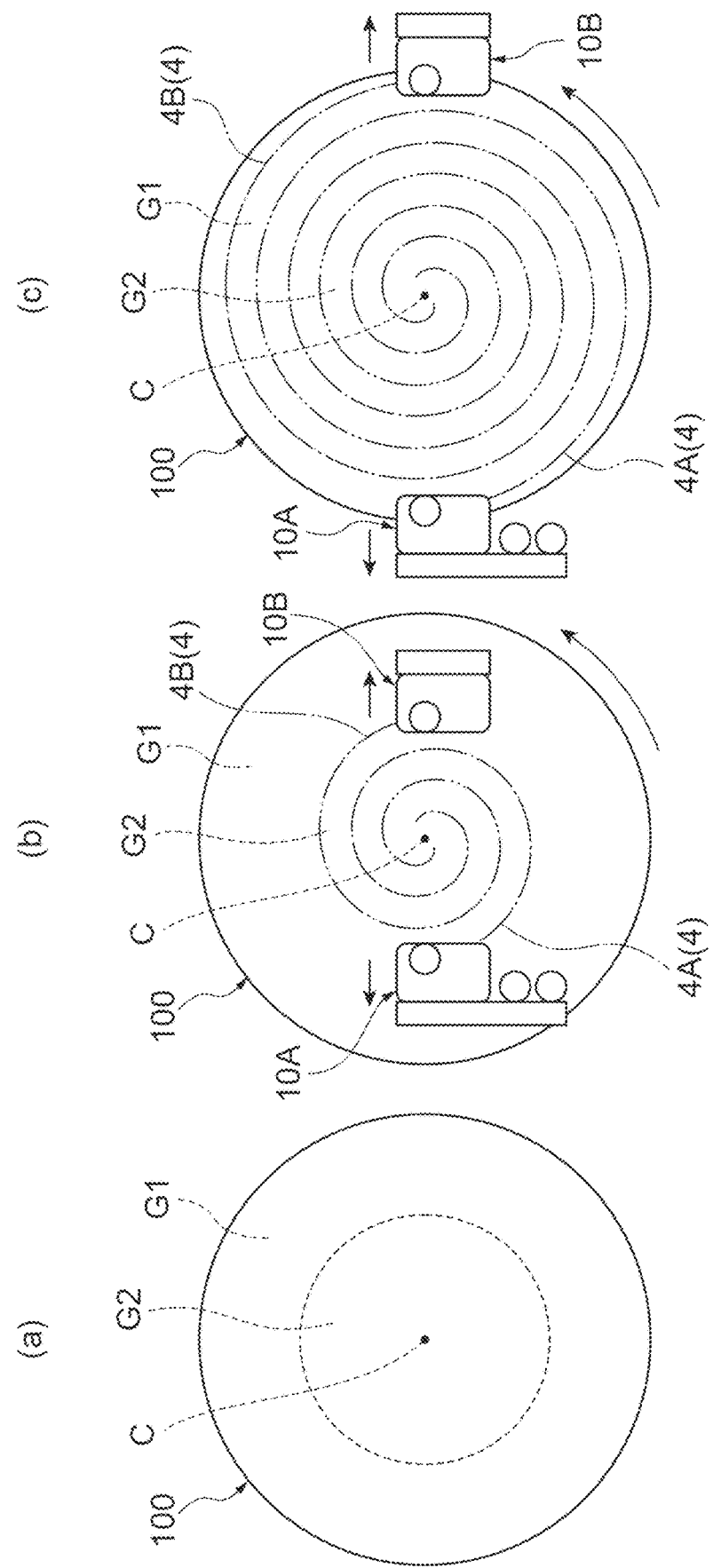
FIG. 21(a) is a plan view of an example of a target.
FIG. 21(b) is a plan view of a target illustrating a first peeling process according to a third embodiment.
FIG. 21(c) is a plan view of the target continuing from FIG. 21(b).

As illustrated in FIG. 21(a), the first region G1 is an annular region on the outer side far from the rotation axis C of the target 100 as viewed in the Z direction. The second region G2 is a circular region on the inner side close to the rotation axis C of the target 100 as viewed in the Z direction. The controller 9 can set the first and the second regions G1 and G2. The first and the second regions G1 and G2 may be designated by coordinates.

The controller 9 sets the processing conditions for the first and the second laser lights L1 and L2 as follows. Specifically, the frequency of the first and the second laser lights L1 and L2 for forming the modified region 4 in the first region G1 is equal to the frequency of the first and the second laser lights L1 and L2 for forming the modified region 4 in the second region G2. The pulse thinning interval of the first and the second laser lights L1 and L2 for forming the modified region 4 in the first region G1 is the same as the pulse thinning interval of the first and the second laser lights L1 and L2 for forming the modified region 4 in the second region G2. When the modified region 4 is formed in the second region G2, the frequency of the first and the second laser lights L1 and L2 may be low and the pulse thinning interval of the first and the second laser lights L1 and L2 may be large, compared with a case where the modified region 4 is formed in the first region G1.

An example of the first peeling process performed by the laser processing apparatus according to the third embodiment will be described in detail.

First of all, the first and the second laser processing heads 10A and 10B are moved along the X-axis rail 108 to position the first and the second focusing points P1 and P2 at predetermined peeling start positions in the X direction. For example, the predetermined peeling start positions are pair of predetermined positions close to each other in the X direction at the center of the second region G2.

Then, the rotation of the stage 107 starts. The first and the second laser processing heads 10A and 10B start emitting the first and the second laser lights L1 and L2 when the constant second rotation speed v' of the stage 107 is achieved. As illustrated in FIG. 21(b), in the second region G2, the first and the second laser processing heads 10A and 10B move along the X-axis rail 108 to make the first and the second focusing points P1 and P2 move away from each other along the X direction in the second region G2.

As illustrated in FIG. 21(c), when the first and the second focusing points P1 and P2 reach the first region G1, the rotation speed of the stage 107 is set to be the constant first rotation speed v, and the first and the second laser processing heads 10A and 10B moves along the X-axis rail 108 to make the first and the second focusing points P1 and P2 continue to move away from each other along the X direction in the first region G1. As described above, the first modified region 4A that is formed in a spiral shape around the position of the rotation axis C as viewed in the Z direction, and the second modified region 4B that is formed in a spiral shape around the position of the rotation axis C as viewed in the Z direction and does not overlap with the first modified region 4A are formed along the virtual plane M1 (see FIG. 10) in the target 100.

As described above, also with the laser processing apparatus according to the third embodiment, more modified regions 4 can be formed simultaneously or in parallel, when performing various types of processing on the target 100, whereby better takt time can be achieved. Various processes can be efficiently performed on the target 100. Also with the laser processing apparatus according to the third embodiment, the trimming processing can be accurately performed.

In the first peeling process performed by the laser processing apparatus according to the third embodiment, the stage 107 rotates at the first rotation speed v for forming the first and the second modified regions 4A and 4B in the first region G1 on the side far from the rotation axis C of the stage 107 in the target 100 as viewed in the Z direction. In the first peeling process, the stage 107 rotates at the second rotation speed v' faster than the first rotation speed v for forming the forming the first and the second modified regions 4A and 4B in the second region G2 on the side closer to the rotation axis C of the stage 107 in the target 100 as viewed in the Z direction. With this configuration, the peeling processing is performed with the circumferential speed at the positions of the first and the second focusing points P1 and P2 in the first region G1 being close to the circumferential speed at the positions of the first and the second focusing points P1 and P2 in the second region G2. The pitches of the first modified spots in the first modified region 4A and of the second modified spots in the second modified region 4B can be a constant pitch.

In the present embodiment, the controller 9 may perform a first peeling process according to the following modification example. Specifically, the formation of the first modified region 4A in the first region G1 and the formation of the second modified region 4B in the second region G2 may be simultaneously implemented. In this process, the rotation speed of the stage 107 may be constant. To achieve an approximately constant pitch of the modified spots in the first and the second modified regions 4A and 4B, the frequency of the first laser light L1 may be set to be higher than the frequency of the second laser light L2, the pulses of the second laser light L2 may be thinned without thinning the pulses of the first laser light L1, or the thinning amount of the pulses of the first laser light L1 may be smaller than the thinning amount of the pulses of the second laser light L2. Pulse thinning can be implemented by EOM or AOM.

Specifically, in the first peeling process according to such a modification example, the first and the second laser processing heads 10A and 10B are moved along the X-axis rail 108 to position the first and the second focusing points P1 and P2 at predetermined peeling start positions in the X direction. For example, the predetermined peeling start position of the first focusing point P1 is a predetermined position on the inner edge side of the first region G1. For example, the predetermined peeling start position of the second focusing point P2 is a predetermined position positioned at the center of the second region G2.

Then, the rotation of the stage 107 starts. The first and the second laser processing heads 10A and 10B start emitting the first and the second laser lights L1 and L2 when a constant rotation speed of the stage 107 is achieved. In this process, the frequency of the first laser light L1 is set to the higher than the frequency of the second laser light L2. Alternatively, the pulse thinning may be performed on the second laser light L2 without performing the pulse thinning on the first laser light L1. Alternatively, the pulse thinning is performed on the second laser light L2 in an amount smaller than that of the pulse thinning on the first laser light L1.

Figure 22:
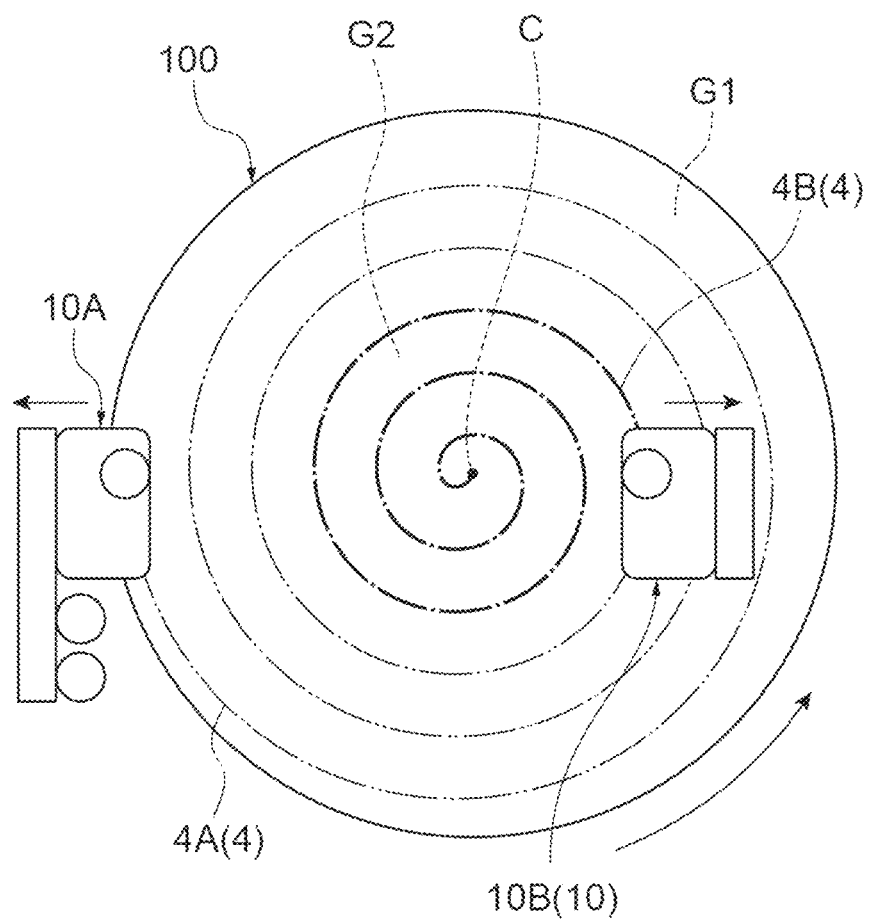
FIG. 22 is a plan view of a target illustrating a first peeling process according to a modification example.

The first and the second laser processing heads 10A and 10B move along the X-axis rail 108 to make the first and the second focusing points P1 and P2 move away from each other along the X direction. When the first focusing point P1 reaches the outer edge side of the first region G1, the emission of the first laser light L1 stops. When the second focusing point P reaches the outer edge side of the second region G2, the emission of the second laser light L2 stops. With the above process, as illustrated in FIG. 22, the first modified region 4A in a spiral shape around the position of the rotation axis C as viewed in the Z direction is formed in the first region G1, and the second modified region 4B in a spiral shape around the position of the rotation axis C as viewed in the Z direction is formed in the second region G2.

Also with the first peeling process according to the modification example, the peeling processing can be performed with the pitches of the modified spots in the first and the second modified regions 4A and 4B set to be constant. Furthermore, a single continuous modified region 4 can be formed by connecting the first modified region 4A with the second modified region 4B. Specifically, in the first peeling process, the first and the second focusing points P1 and P2 are each moved in the X direction while rotating the stage 107, so that the first modified region 4A in a spiral shape around the position of the rotation axis C can be formed, and the second modified region 4B that has a spiral shape around the position of the rotation axis C and is continuously connected with the first modified region 4A can be formed. Also in this case, the efficient peeling processing can be specifically implemented.

Fourth Embodiment

Next, a laser processing apparatus according to a fourth embodiment will be described. In the description of the fourth embodiment, the points different from those in the first embodiment will be described, and the description that is given in the first embodiment will not be redundantly given.

Figure 23:
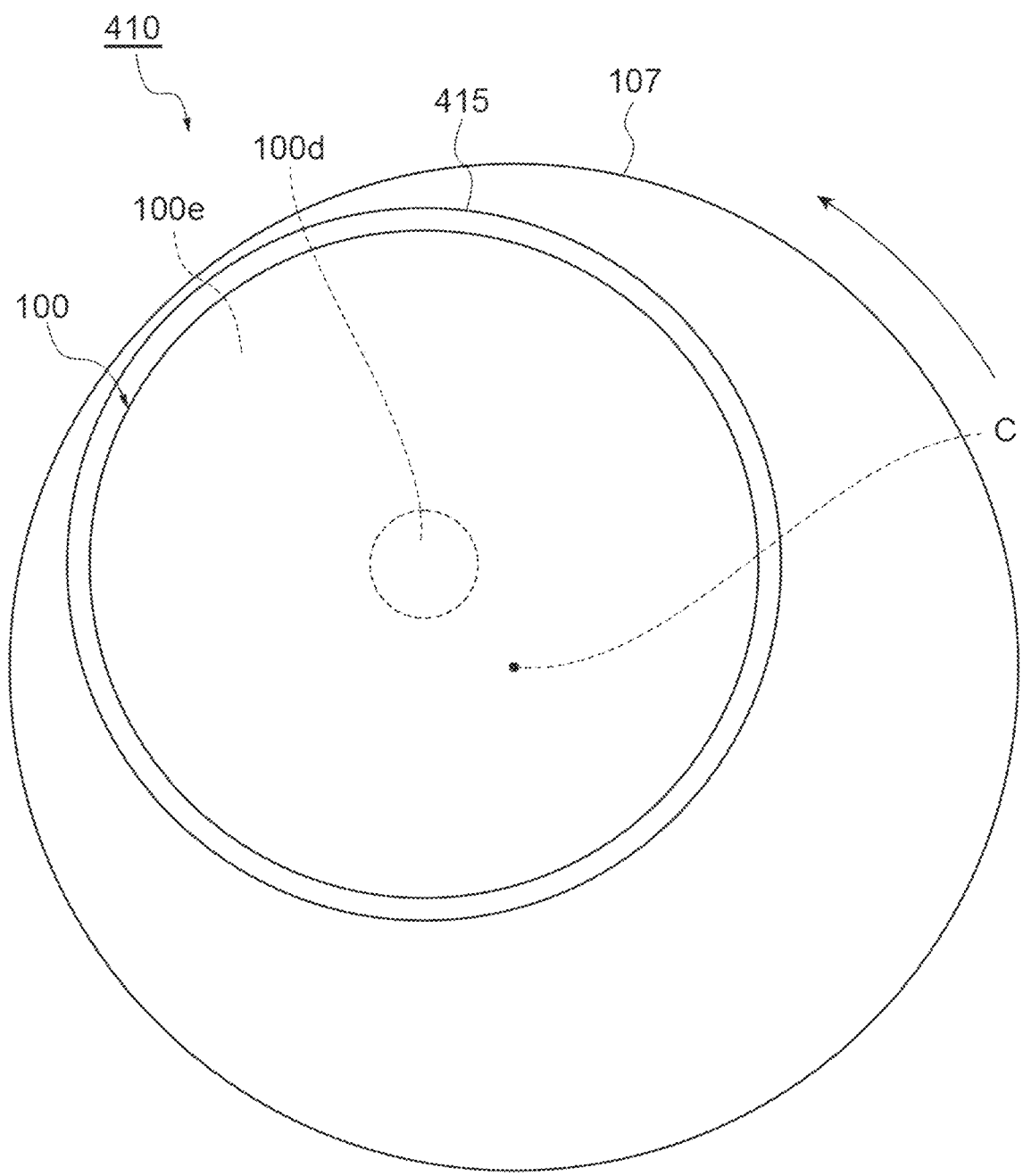
FIG. 23 is a plan view of a target illustrating a first peeling process according to a fourth embodiment.

As illustrated in FIG. 23, in a laser processing apparatus 410 according to the fourth embodiment, the stage 107 further includes an XY table 415. The XY table 415 is provided on the stage 107 and rotates integrally with the stage 107. The XY table 415 can move the target 100 placed thereon toward and away from the rotation axis C in the X and Y directions. The XY table 415 is not particularly limited, and various known XY tables may be used. The operation of the XY table 415 is controlled by the controller 9.

The target 100 includes a center region 100*d* set to be at the center of the target 100 and a main region 100*e* other than the center region 100*d* as viewed in the Z direction. The center region 100*d* is a circular region. The main region 100*e* is a region wider than the center region 100*d* and is an annular region surrounding the center region 100*d*. The center region 100*d* is a region that can be defined as follows. Specifically, when the target 100 rotates with the center region 100*d* position on the rotation axis C, the circumferential speed at the outermost position of the center region 100*d* is a circumferential speed at which a minimum required circumferential speed for the peeling processing cannot be achieved. For example, when the target is a 12 inch wafer, the center region 100*d* is a φ10 mm region. The center region 100*d* and the main region 100*e* are the same as those in fifth and sixth embodiments.

The controller 9 performs the first peeling process on the main region 100*e* with the center region 100*d* of the target 100 positioned on the rotation axis C. The controller 9 performs the first peeling process on the center region 100*d* with the main region 100*e* of the target 100 positioned on the rotation axis C. The first peeling process is a process of moving the first and the second focusing points P1 and P2 of the first and the second laser lights L1 and L2 emitted move in the X direction to move toward or away from each other, while rotating the stage 107 as described above.

An example of the first peeling process performed by the laser processing apparatus 410 according to the fourth embodiment will be described in detail.

First of all, the XY table 415 is driven to achieve a state where the main region 100*e* of the target 100 is positioned on the rotation axis C, that is, in a state where the center region 100*d* of the target 100 is separated from the rotation axis C. The stage 107 is rotated at a constant speed. The first and the second laser processing heads 10A and 10B move along the X-axis rail 108 to make the first and the second focusing points P1 and P2 move toward each other along the X direction.

Figure 24:
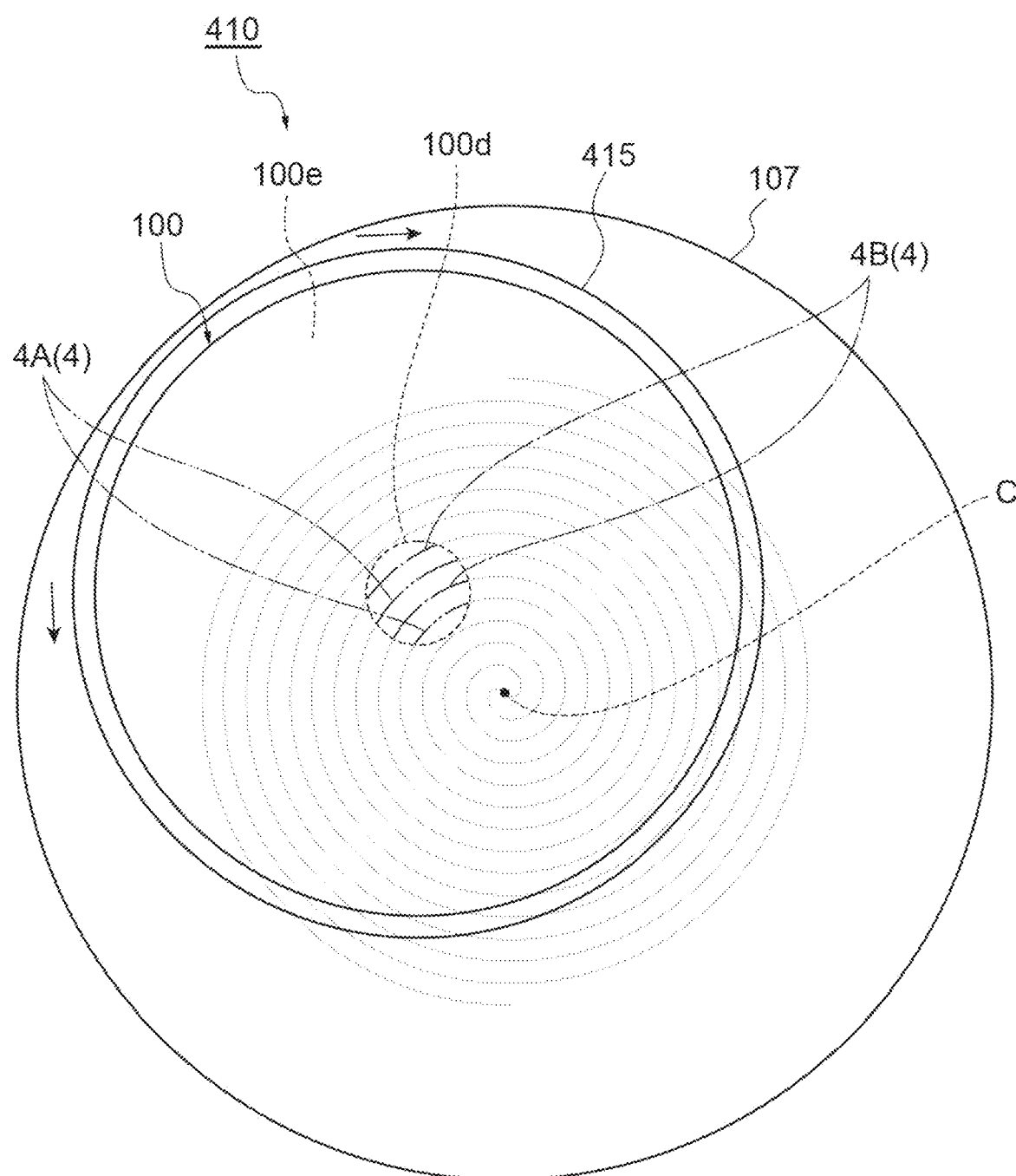
FIG. 24 is a plan view of the target continuing from FIG. 23.

At this time, when the first and the second focusing points P1 and P2 are positioned in the main region 100*e*, emission of the first and the second laser lights L1 and L2 from the first and the second laser processing heads 10A and 10B is performed. When the first and the second focusing points P1 and P2 are positioned in the center region 100*d*, emission of the first and the second laser lights L1 and L2 from the first and the second laser processing heads 10A and 10B is stopped. As a result, as illustrated in FIG. 24, in the center region 100*d*, the first and the second modified regions 4A and 4B are formed that have shapes as a part of a spiral shape around the position of the rotation axis C and extend to form a curved shape. In FIG. 24, a gray region of the spiral line indicates a trace of the first and the second focusing points P1 and P2 while the emission of the first and the second laser lights L1 and L2 is stopped.

Figure 25:
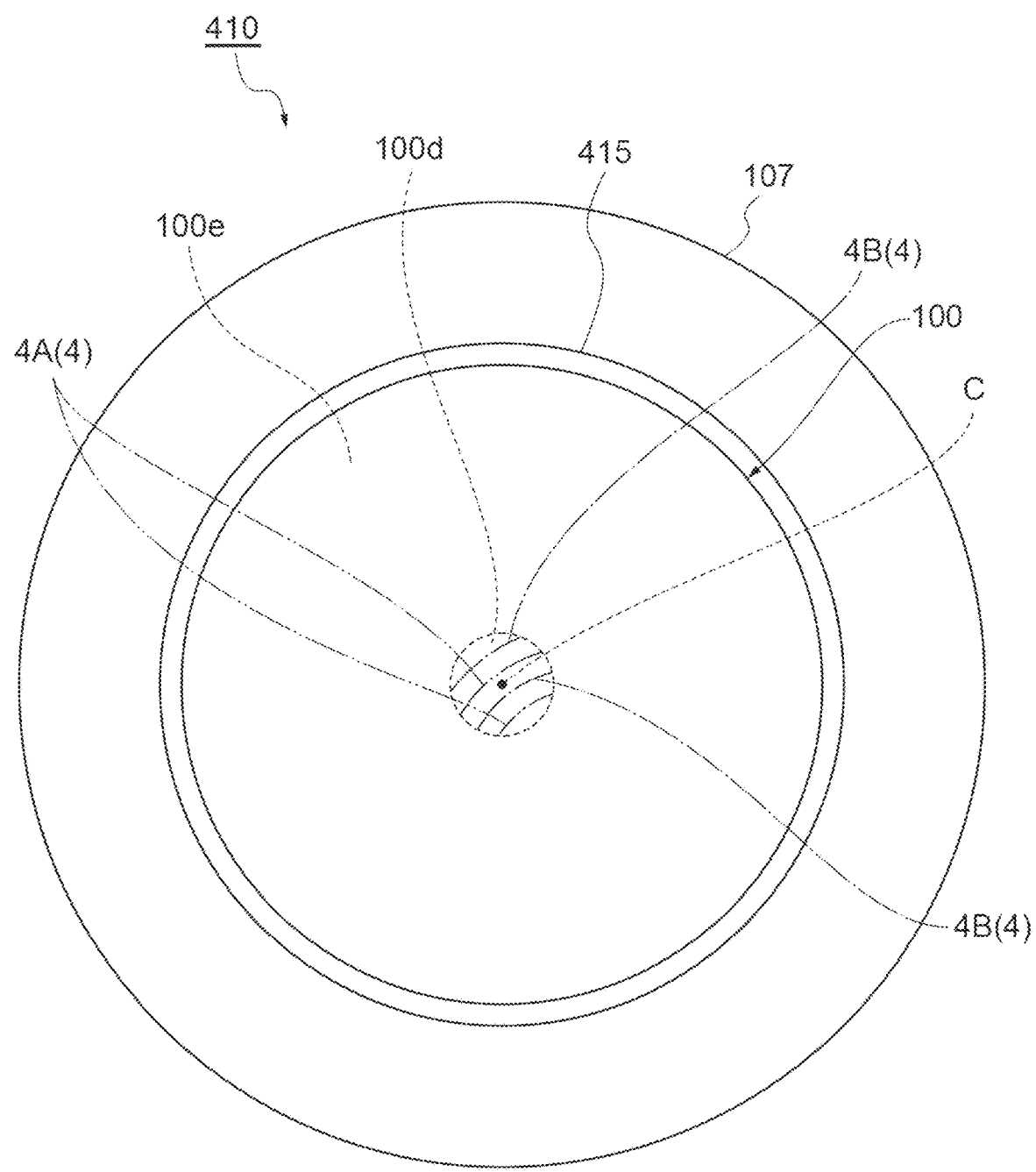
FIG. 25 is a plan view of the target continuing from FIG. 24.

Next, as illustrated in FIG. 25, the XY table 415 is driven to establish a state where the center region 100*d* of the target 100 is positioned on the rotation axis C, that is, a state where the center of the target 100 is position on the rotation axis C. The stage 107 is rotated at a constant speed. The first and the second laser processing heads 10A and 10B move along the X-axis rail 108 to make the first and the second focusing points P1 and P2 move toward each other along the X direction.

Figure 26:
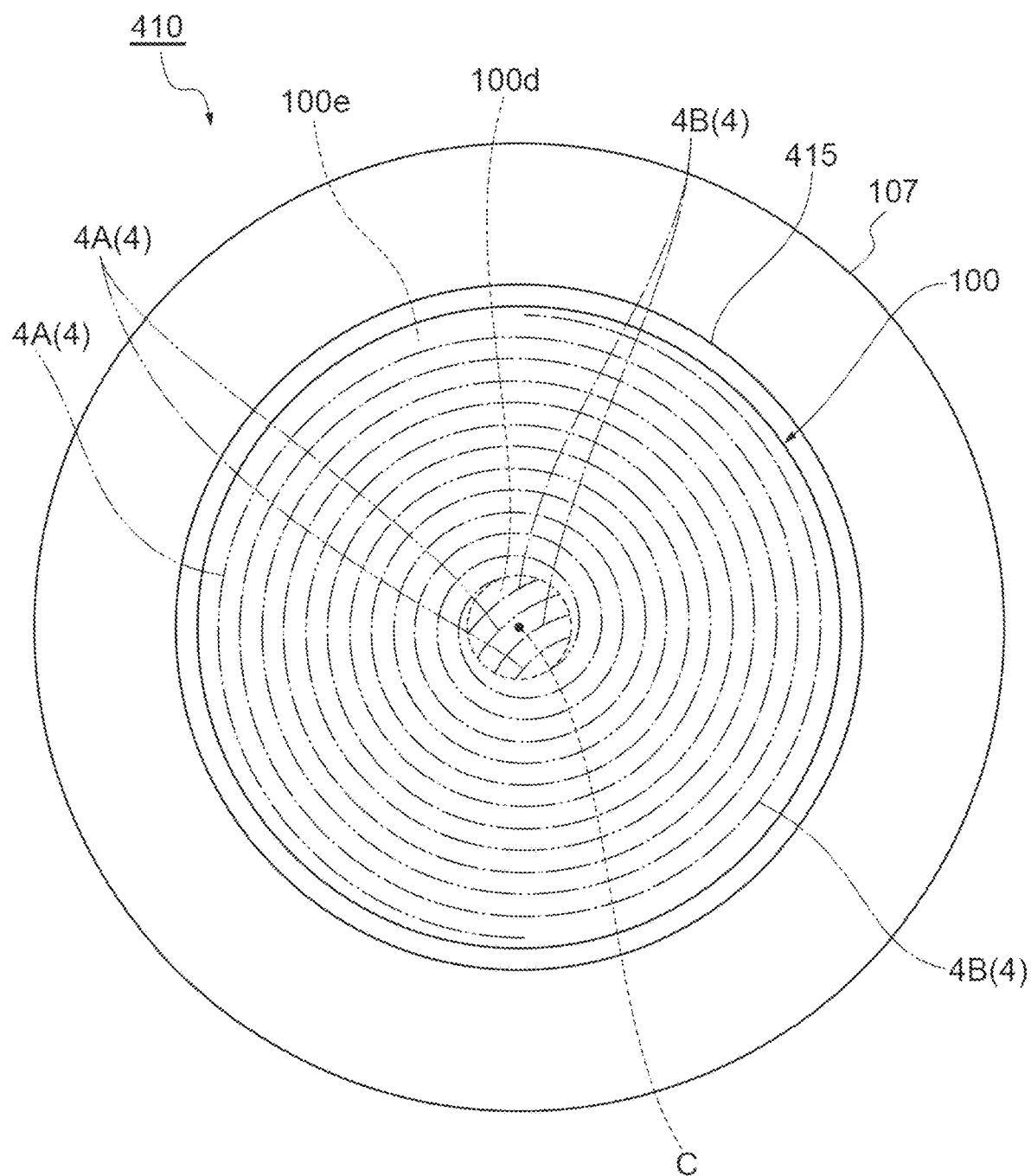
FIG. 26 is a plan view of the target continuing from FIG. 25.

At this time, when the first and the second focusing points P1 and P2 are positioned in the main region 100*e*, emission of the first and the second laser lights L1 and L2 from the first and the second laser processing heads 10A and 10B is performed. When the first and the second focusing points P1 and P2 are positioned in the center region 100*d*, emission of the first and the second laser lights L1 and L2 from the first and the second laser processing heads 10A and 10B is stopped. As a result, as illustrated in FIG. 26, in the main region 100*e*, the first and the second modified regions 4A and 4B that have a spiral shape around the position of the rotation axis C are formed.

As described above, also with the laser processing apparatus 410, more modified regions 4 can be formed simultaneously or in parallel, when performing various types of processing on the target 100, whereby better takt time can be achieved. Various processes can be efficiently performed on the target 100. Also with the laser processing apparatus 410, the trimming processing can be accurately performed.

A constant circumferential speed needs to be achieved to achieve a constant pitch between modified spots included in the modified region 4. The circumferential speed can be defined with the following formula.

$$\text{Circumferential speed} = (\text{rotation speed } N[\text{rpm}]/60) \cdot (\pi \cdot \text{diameter } D)$$

For example, when using the stage 107 having a maximum rotation speed of 500 rpm, the maximum circumferential speed of the target 100 of the 12-inch wafer can be set to 7850 mm/sec at the outer circumferential portion, which is sufficient for achieving the minimum required circumferential speed (for example, 800 mm/sec) for the peeling processing. In a φ30 mm range to an outer edge vicinity position of the target 100, the minimum circumferential speed can be achieved by increasing the rotation speed of the stage. In a φ10 mm range to an outer edge vicinity position of the target 100, the circumferential speed drops to or below the minimum circumferential speed, but this can be compensated by changing the processing condition such as the frequency of the first and the second laser lights L1 and L2. Still, there is a risk that the circumferential speed dramatically drops in the center region 100*d* (the φ10 mm range herein) of the target 100. Thus, even when the processing condition is changed, the circumferential speed might drop to or below the minimum circumferential speed, rendering achievement of a constant pitch of the modified spots included in the modified region 4 difficult, meaning that the modified spots might be formed too densely.

In view of this, in the laser processing apparatus 410, the first peeling process is performed on the main region 100*e* in a state where the center region 100*d* of the target 100 is positioned on the rotation axis C of the stage 107. The first peeling process is performed on the center region 100*d* with the main region 100*e* of the target 100 positioned on the rotation axis C of the stage 107. As a result, when the first peeling process is performed on the center region 100*d*, the target 100 is eccentric with respect to the rotation axis C. Thus, the device can be free of the above risk that the circumferential speed dramatically drops in the center region 100*d*. The modified spots in the modified region 4 formed in the center region 100*d* can be prevented from being too dense. In addition, it is possible to prevent the pitch of the modified spots in the modified region 4 from being short, which can increase the damage caused by the first and the second laser lights L1 and L2 transmitted through the target 100 (what is called escape light damage).

Fifth Embodiment

Next, a laser processing apparatus according to a fifth embodiment will be described. In the description of the fifth embodiment, the points different from those in the first embodiment will be described, and the description that is given in the first embodiment will not be redundantly given.

In a laser processing apparatus 500 according to a fifth embodiment, the controller 9 performs a first peeling process on the main region 100e. The controller 9 performs a second peeling process on at least the center region 100d to form the first modified region 4A along the virtual plane M1 in the target 100, by emitting the first laser light L1 without rotating the stage 107 and controlling the movement of the first focusing point P1. In the second peeling process, the first focusing point P1 is linearly moved to form the first modified region 4A extending linearly.

An example of the first peeling process performed by the laser processing apparatus 500 according to the fifth embodiment will be described in detail.

Figure 27:
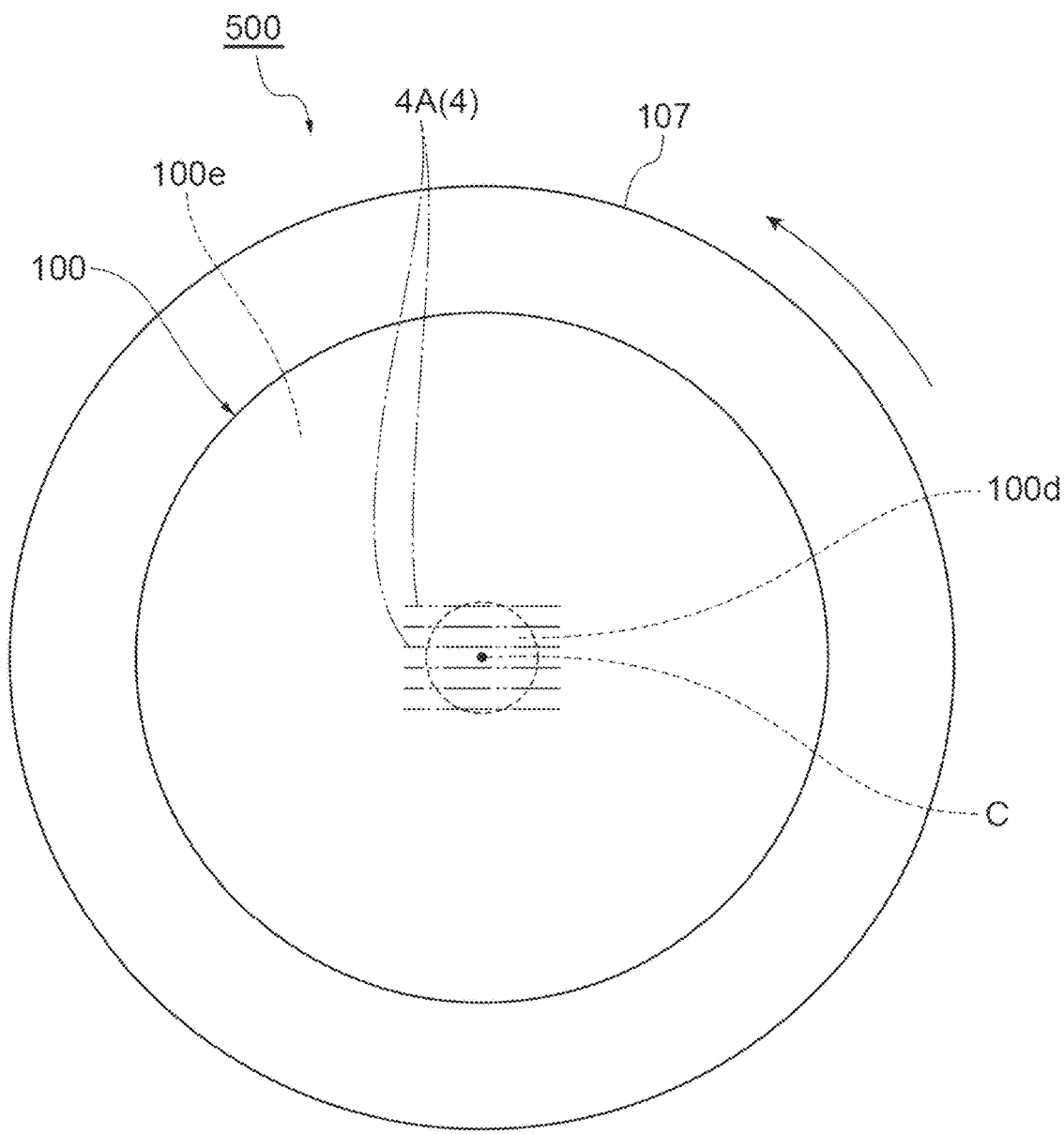
FIG. 27 is a plan view of a target illustrating peeling processing according to a fifth embodiment.

With the first focusing point P1 positioned on the virtual plane M1, the first laser light L1 is emitted along a plurality of lines set at least on the center region 100d without rotating the stage 107, and the first focusing point P1 is moved while the first laser light L1 is being emitted. The lines extend in the Y direction and in the X direction. As a result, as illustrated in FIG. 27, a plurality of linearly extending first modified regions 4A are formed in the center region 100d. The linear first modified region 4A may extend to a portion, in the main region 100e, in the periphery of the center region 100d.

Figure 28:
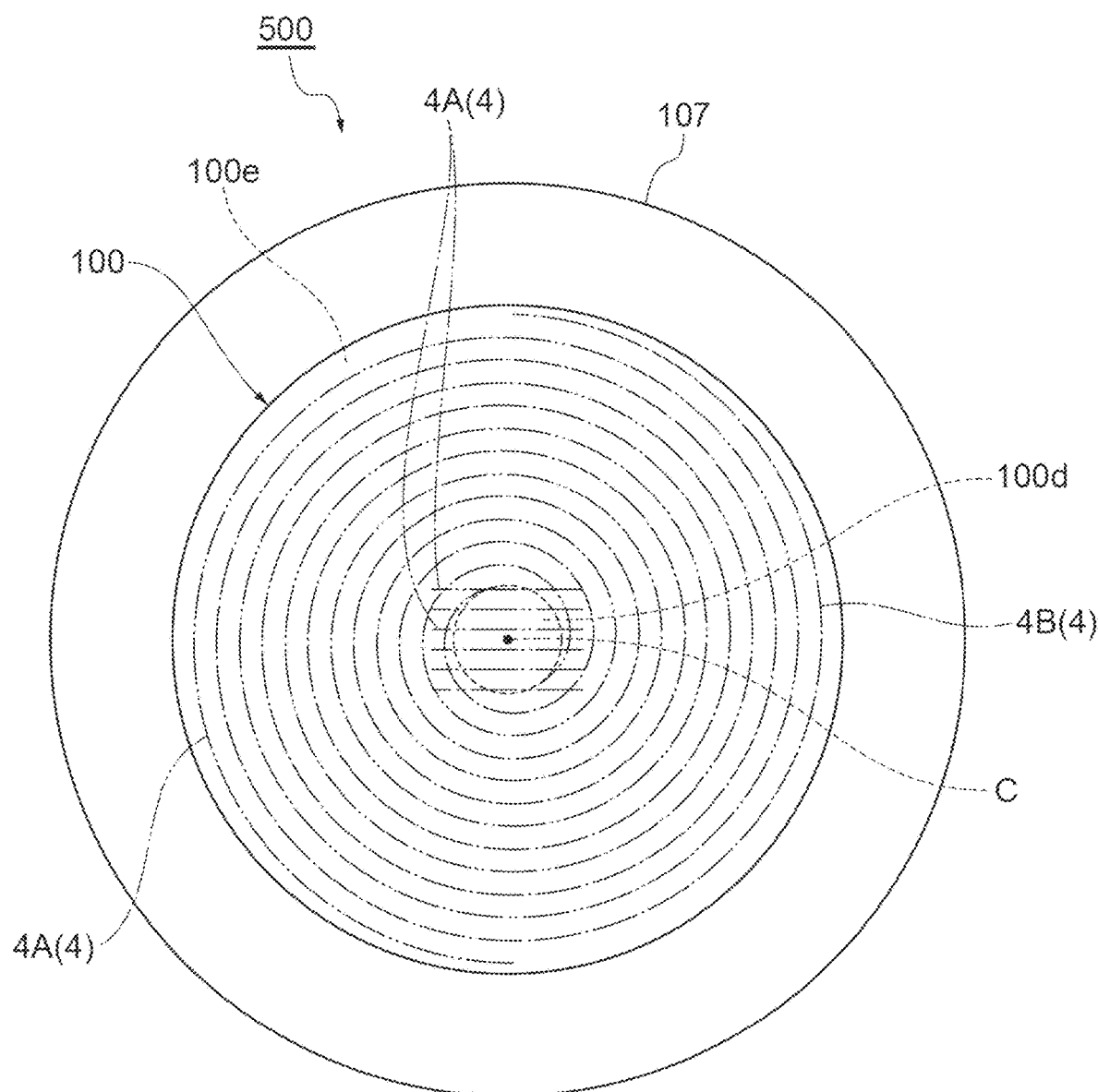
FIG. 28 is a plan view of the target continuing from FIG. 27.

Then, the stage 107 is rotated at a constant rotation speed, and the first and the second laser processing heads 10A and 10B move along the X-axis rail 108 to make the first and the second focusing points P1 and P2 move toward each other along the X direction. At this time, when the first and the second focusing points P1 and P2 are positioned in the main region 100e, emission of the first and the second laser lights L1 and L2 from the first and the second laser processing heads 10A and 10B is performed. When the first and the second focusing points P1 and P2 are positioned in the center region 100d, emission of the first and the second laser lights L1 and L2 from the first and the second laser processing heads 10A and 10B is stopped. As a result, as illustrated in FIG. 28, in the main region 100e, the first and the second modified regions 4A and 4B that have a spiral shape around the position of the rotation axis C are formed.

As described above, also with the laser processing apparatus 500, more modified regions 4 can be formed simultaneously or in parallel, when performing various types of processing on the target 100, whereby better takt time can be achieved. Various processes can be efficiently performed on the target 100. Also with the laser processing apparatus 500, the trimming processing can be accurately performed.

The laser processing apparatus 500 performs the first peeling process on the main region 100e. On at least the center region 100d, the second peeling process is performed to form the first modified region 4A along the virtual plane M1 in the target 100, by emitting the first laser light L1 without rotating the stage 107 and controlling the movement of the first focusing point P1. In the second peeling process, the first focusing point P1 is linearly moved to form the first modified region 4A extending linearly. In this case, a pitch between modified spots in the first modified region 4A formed in the center region 100d is controllable based on the processing condition such as a speed of moving the first focusing point P1 linearly, and a frequency of the first laser light L1. Thus, the modified spots formed in the center region 100d can be prevented from being too dense.

The controller 9 of the present embodiment may stop irradiating the center region 100d with the first and the second laser lights L1 and L2. Thus, the laser processing may be performed on the center region 100d. In this case, no modified region 4 is formed in the center region 100d, whereby the modified spots can be prevented from being too densely formed in the center region 100d.

Sixth Embodiment

Next, a laser processing apparatus according to a sixth embodiment will be described. In the description of the sixth embodiment, the points different from those in the first embodiment will be described, and the description that is given in the first embodiment will not be redundantly given.

Figure 29:
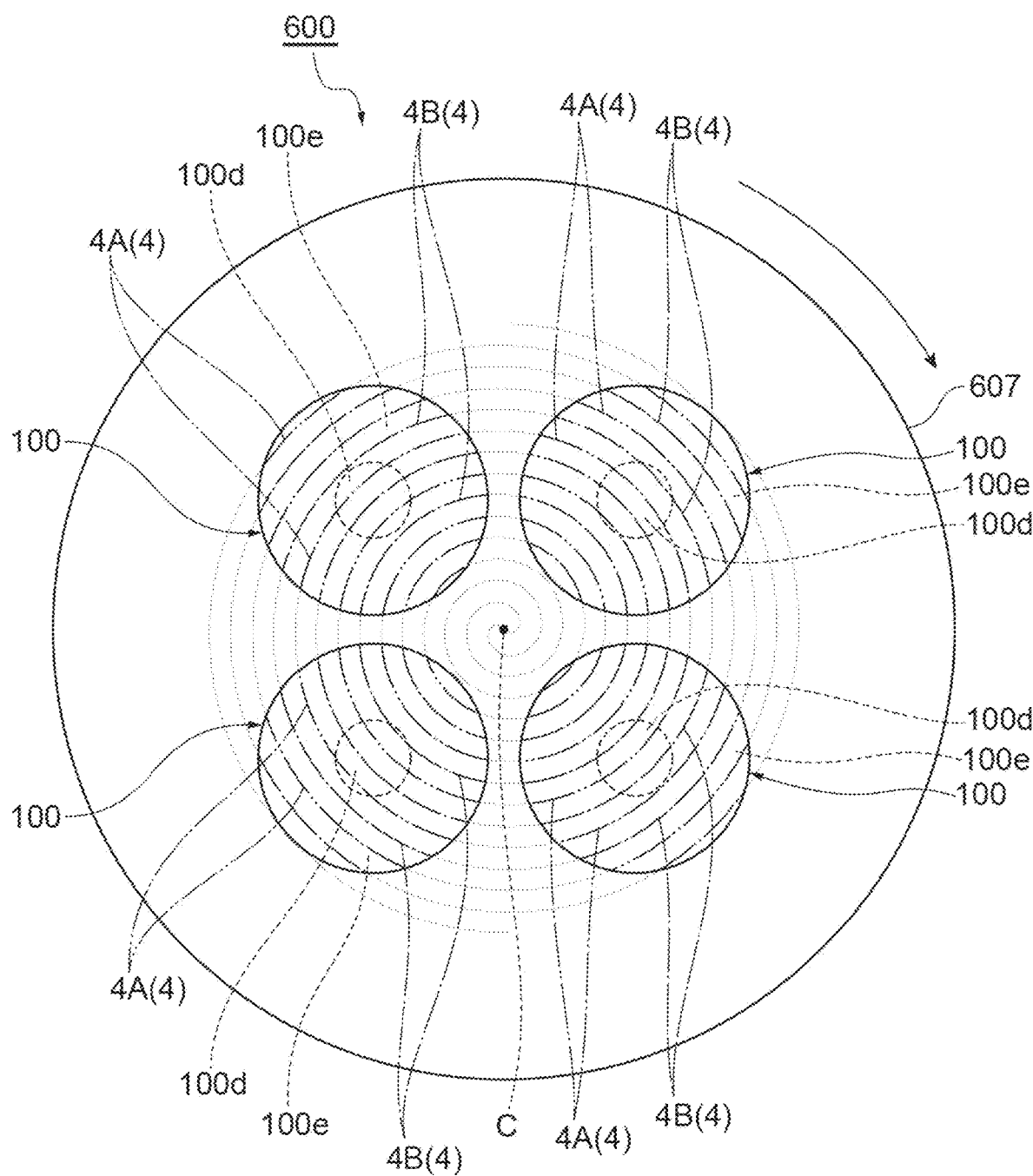
FIG. 29 is a plan view of a target illustrating peeling processing according to a sixth embodiment.

As illustrated in FIG. 29, in a laser processing apparatus 600 according to the sixth embodiment, the stage 107 (see FIG. 9) includes a stage 607. The stage 607 is a support portion. On the stage 607, a plurality of targets 100 are placed at positions not on the rotation axis C. Thus, the stage 607 is larger than the stage 107. On the stage 607, a plurality of targets 100 (four in the illustrated example) can be arranged so as not to be placed on a certain region including the position of the rotation axis C. On the stage 107, the plurality of targets 100 can be arranged at respective positions at the same distance from the position of the rotation axis C.

The controller 9 performs the first peeling process in a state where a plurality of targets 100 are placed on the stage 607 at positions not on the rotation axis C. The first peeling process is a process of moving the first and the second focusing points P1 and P2 of the first and the second laser lights L1 and L2 emitted move in the X direction to move toward or away from each other, while rotating the stage 107 as described above.

An example of an operation performed in the laser processing apparatus 600 according to the sixth embodiment when the first peeling process is performed will be described in detail.

First of all, a plurality of targets 100 are placed at position of the stage 107 not on the rotation axis C. The controller 9 performs the first peeling process in a state where the plurality of targets 100 are placed at positions not on the rotation axis C of the stage 107. Specifically, the stage 107 is rotated at a constant rotation speed, and the first and the second laser processing heads 10A and 10B move along the X-axis rail 108 to make the first and the second focusing points P1 and P2 move toward each other along the X direction. At this time, when the first and the second focusing points P1 and P2 are not positioned on the target 100, emission of the first and the second laser lights L1 and L2 from the first and the second laser processing heads 10A and 10B is stopped. When the first and the second focusing points P1 and P2 are positioned target 100, emission of the first and the second laser lights L1 and L2 from the first and the second laser processing heads 10A and 10B is performed.

As a result, in each of the plurality of targets 100, the first and the second modified regions 4A and 4B are formed that have shapes as a part of a spiral shape around the position of the rotation axis C and extend to form a curved shape. In FIG. 29, a gray region of the spiral line indicates a trace of the first and the second focusing points P1 and P2 while the emission of the first and the second laser lights L1 and L2 is stopped.

As described above, also with the laser processing apparatus 600, more modified regions 4 can be formed simultaneously or in parallel, when performing various types of processing on the target 100, whereby better takt time can be achieved. Various processes can be efficiently performed on the target 100. Also with the laser processing apparatus 600, the trimming processing can be accurately performed.

On the stage 107 in the laser processing apparatus 600, a plurality of targets 100 are placed at positions of the stage 107 not on the rotation axis C. This configuration is also free of the above risk that the circumferential speed dramatically drops in the center region 100d of the target 100, whereby the modified spots can be prevented from being too densely formed in the center region 100d.

Seventh Embodiment

Next, a laser processing apparatus according to a seventh embodiment will be described. In the description of the seventh embodiment, the points different from those in the first embodiment will be described, and the description that is given in the first embodiment will not be redundantly given.

Figure 30:
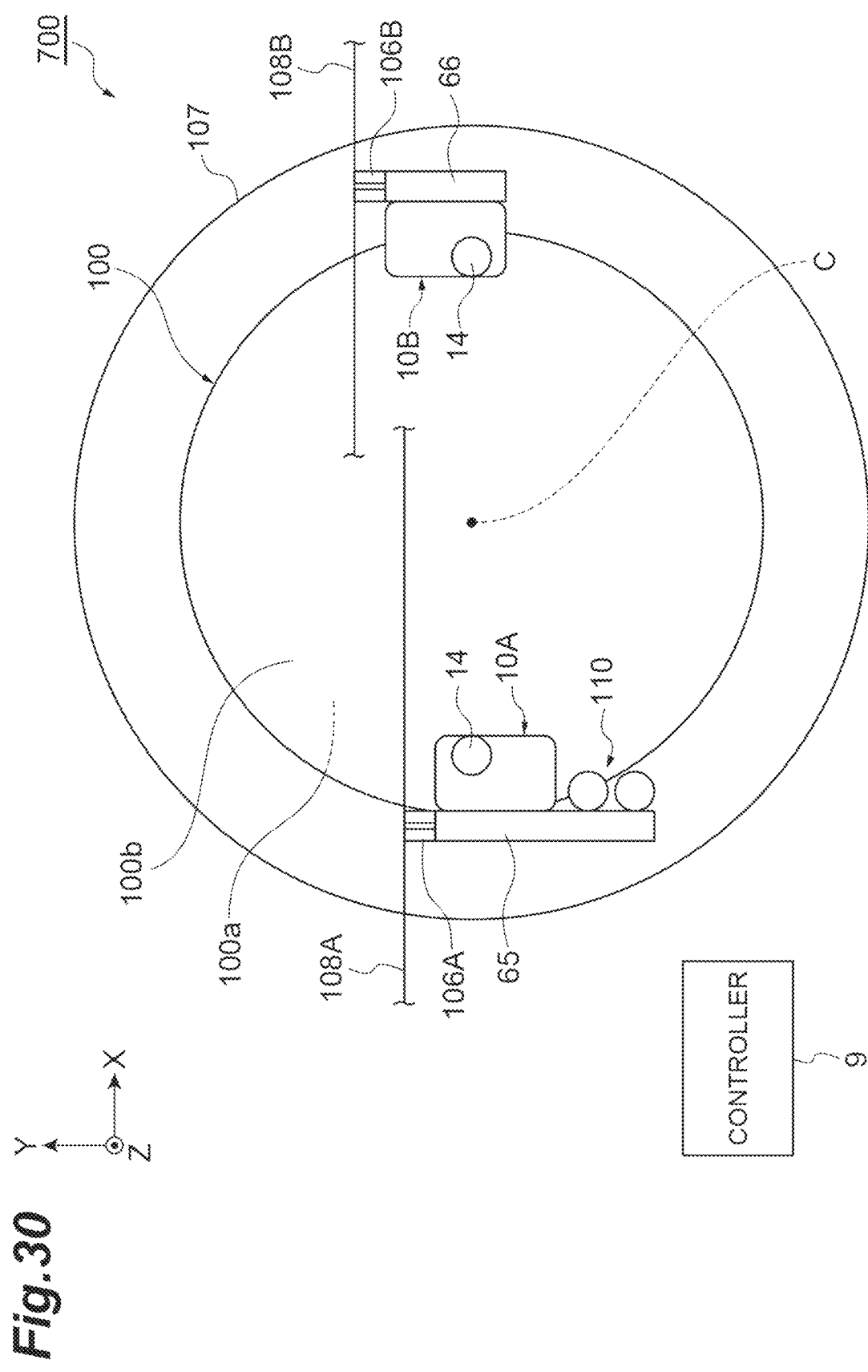
FIG. 30 is a plan view of a schematic configuration of a laser processing apparatus according to a seventh embodiment.

As illustrated in FIG. 30, a laser processing apparatus 700 according to the seventh embodiment includes a first and a second X-axis rail 108A and 108B instead of the X-axis rail 108 (see FIG. 9). The first X-axis rail 108A is a rail extending along the X direction. The first X-axis rail 108A is attached to the first Z-axis rail 106A. The first laser processing head 10A moves on the first X-axis rail 108A along the X direction so that the first focusing point P1 of the first laser light L1 moves along the X direction. The first laser processing head 10A moves on the first X-axis rail 108A along the X direction to make the first focusing point P1 (condensing unit 14) passes through or near the rotation axis C. The first X-axis rail 108A corresponds to the rail of the above movement mechanism 6 (see FIG. 1) or the above movement mechanism 300 (see FIG. 8). The first X-axis rail 108A serves as the first horizontal movement mechanism (horizontal movement mechanism).

The second X-axis rail 108B is a rail extending along the X direction. The second X-axis rail 108B is attached to the second Z-axis rail 106B. The second laser processing head 10B moves on the second X-axis rail 108B along the X direction so that the second focusing point P2 of the second laser light L2 moves along the X direction. The second laser processing head 10B moves on the second X-axis rail 108B along the X direction to make the second focusing point P2 (condensing unit 14) passes through or near the rotation axis C.

The second X-axis rail 108B corresponds to the rail of the above movement mechanism 6 (see FIG. 1) or the above movement mechanism 300 (see FIG. 8). The second X-axis rail 108B serves as the second horizontal movement mechanism (horizontal movement mechanism).

The first X-axis rail 108A extends from one side of the stage 107 in the X direction to a position more on the other side than the position of the rotation axis C. The second X-axis rail 108B extends from the other side of the stage 107 in the X direction to a position not more on the one side than the position of the rotation axis C. Thus, with this configuration, only the first laser processing head 10A, that is, the first focusing point P1 can be moved to the position of the rotation axis C of the stage 107 in the X direction. The first X-axis rail 108A and the second X-axis rail 108B are arranged to be shifted from each other in the Y direction. In the illustrated example, the internal structures of the first laser processing head 10A and the second laser processing head are not mirror symmetrical with each other about the rotation axis C but may be mirror symmetrical.

Also with the laser processing apparatus 700 according to the seventh embodiment, more modified regions 4 can be formed simultaneously or in parallel, when performing various types of processing on the target 100, whereby better takt time can be achieved. Various processes can be efficiently performed on the target 100. Also with the laser processing apparatus 700, the trimming processing can be accurately performed.

Eighth Embodiment

Next, a laser processing apparatus according to an eighth embodiment will be described. In the description of the eighth embodiment, the points different from those in the first embodiment will be described, and the description that is given in the first embodiment will not be redundantly given.

Figure 31:
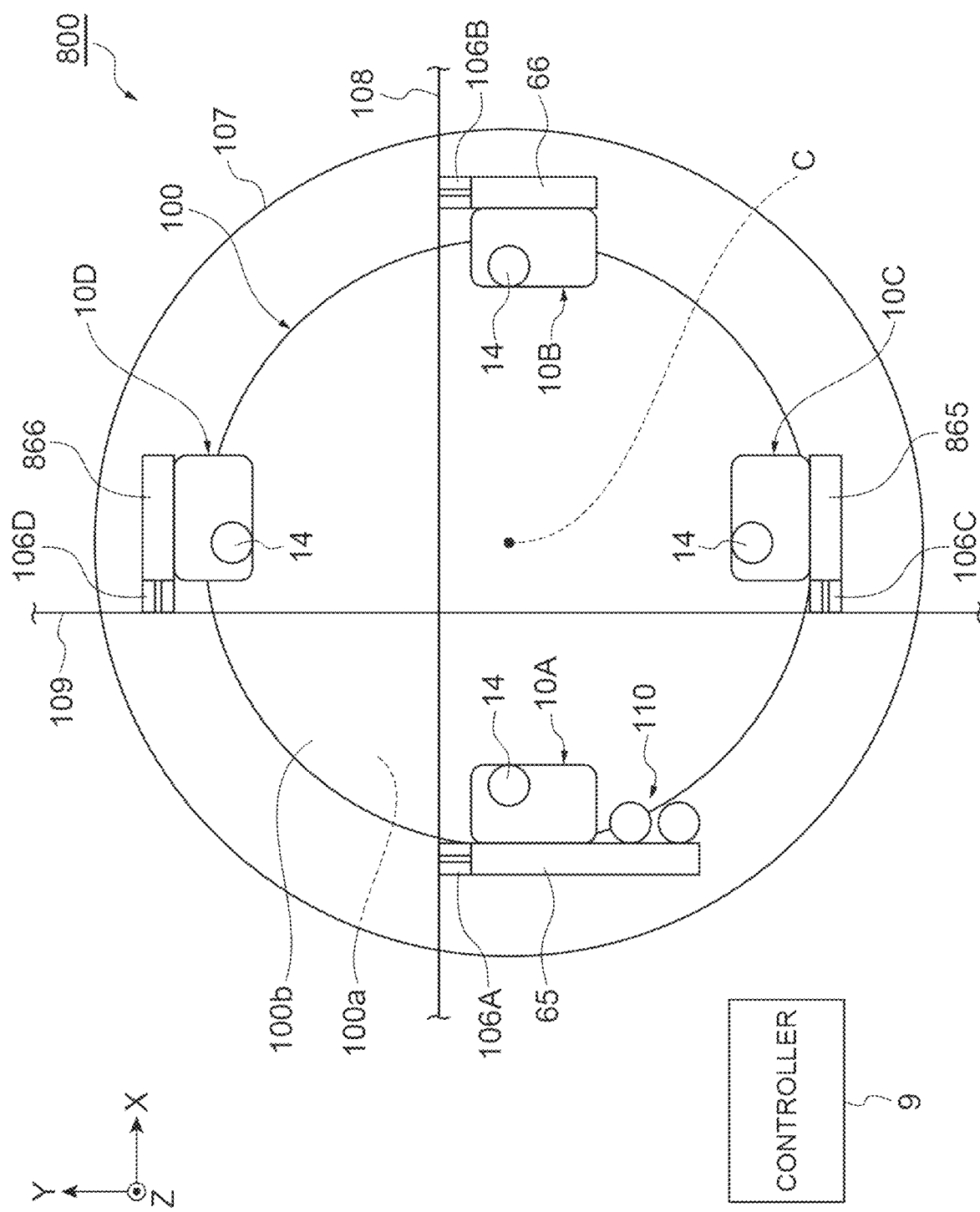
FIG. 31 is a plan view of a schematic configuration of a laser processing apparatus according to an eighth embodiment.
Figure 32:
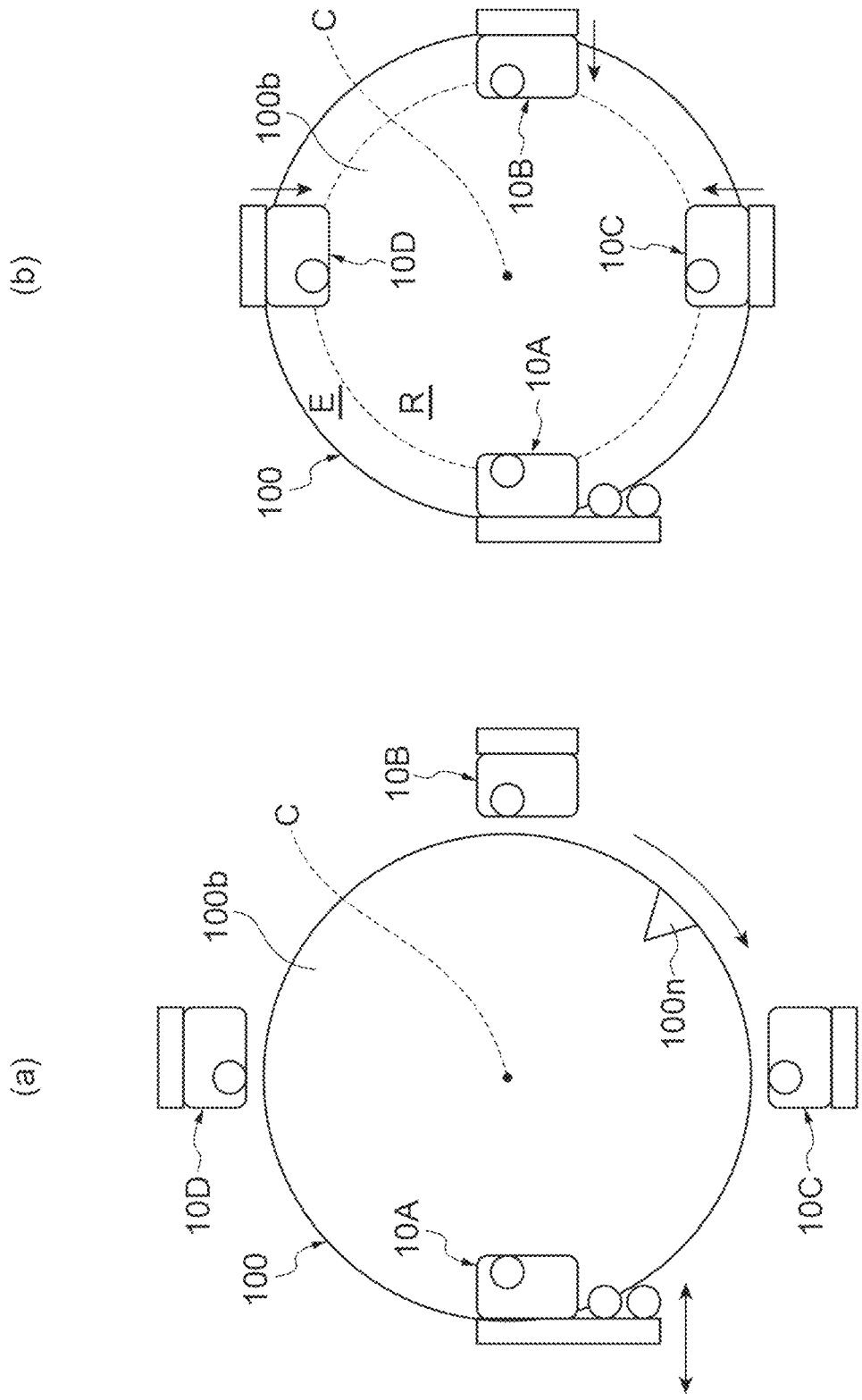
FIG. 32(a) is a plan view of a target illustrating a circumferential edge process according to the eighth embodiment.
FIG. 32(b) is a plan view of the target continuing from FIG. 32(a).

As illustrated in FIG. 31, a laser processing apparatus 800 according to the eighth embodiment includes third and fourth laser processing heads 10C and 10D, third and fourth Z-axis rails 106C and 106D, and a Y-axis rail 109.

The third laser processing head 10C irradiates the target 100 placed on the stage 107 with a third laser light L3 (see FIG. 33(c)) along the Z direction to form a third modified region 4C (see FIG. 33(a)) in the target 100. The third laser processing head 10C is attached to the third Z-axis rail 106C and the Y-axis rail 109. The third laser processing head 10C can be moved linearly in the Z direction along the third Z-axis rail 106C, by driving force of a known driving device such as a motor. The third laser processing head 10C can be moved linearly in the Y direction along the Y-axis rail 109, by driving force of a known driving device such as a motor.

The fourth laser processing head 10D irradiates the target 100 placed on the stage 107 with a fourth laser light L4 (see FIG. 33(c)) along the Z direction to form a fourth modified region 4D (see FIG. 33(a)) in the target 100. The fourth laser processing head 10D is attached to the fourth Z-axis rail 106D and the Y-axis rail 109. The fourth laser processing head 10D can be moved linearly in the Z direction along the fourth Z-axis rail 106D, by driving force of a known driving device such as a motor. The fourth laser processing head 10D can be moved linearly in the Y direction along the Y-axis rail 109, by driving force of a known driving device such as a motor. The internal structures of the third laser processing head 10C and the fourth laser processing head 10D are mirror symmetrical with each other about the rotation axis C.

The third Z-axis rail 106C is a rail extending along the Z direction. The third Z-axis rail 106C is attached to the third laser processing head 10C via an attachment portion 865 similar to the attachment portion 65. The third laser processing head 10C moves on the third Z-axis rail 106C along the Z direction so that a third focusing point P3 of the third laser light L3 (see FIG. 33(c)) moves along the Z direction. The third Z-axis rail 106C serves as a third vertical movement mechanism (vertical movement mechanism).

The fourth Z-axis rail 106D is a rail extending along the Z direction. The fourth Z-axis rail 106D is attached to the fourth laser processing head 10D via an attachment portion 866 similar to the attachment portion 66. The fourth laser processing head 10D moves on the fourth Z-axis rail 106D along the Z direction so that a fourth focusing point P4 (see FIG. 33(c)) of the fourth laser light L4 moves along the Z direction. The fourth Z-axis rail 106D serves as a fourth vertical movement mechanism (vertical movement mechanism).

The Y-axis rail 109 is a rail extending along the Y direction. The Y-axis rail 109 is attached to each of the third and the fourth Z-axis rails 106C and 106D. The third laser processing head 10C moves on the Y-axis rail 109 along the Y direction so that the third focusing point P3 of the third laser light L3 moves along the Y direction. The fourth laser processing head 10D moves on the Y-axis rail 109 along the Y direction so that the fourth focusing point P4 of the fourth laser light L4 moves along the Y direction. The third and the fourth laser processing heads 10C and 10D move on the Y-axis rail 109 to make the third and the fourth focusing points passes through or near the rotation axis C. The Y-axis rail 109 corresponds to a rail of the movement mechanism 400 (see FIG. 8). The Y-axis rail 109 serves as a horizontal movement mechanism (the third and the fourth horizontal movement mechanism). The X-axis rail 108 and the Y-axis rail 109 are installed at different height positions. For example, the X-axis rail 108 is installed on the lower side and the Y-axis rail 109 is installed on the upper side.

In the eighth embodiment, as illustrated in FIGS. 31, 32, and 33(a) to 33(c), a circumferential edge process performed by the controller 9 includes a second orbit process of irradiating the target 100 with the first to the fourth laser lights L1 to L4 respectively from the first to the fourth laser processing heads 10A to 10D while rotating the stage 107, to form an annular modified region 4 along the circumferential edge of the effective region R. In the second orbit process, the first to the fourth focusing points P1 to P4 of the first to the fourth laser lights L1 to L4 are positioned at the same positions in the Z direction, and starting and stopping of the first to the fourth laser lights L1 to L4 respectively from the first to the fourth laser processing heads 10A to 10D are controlled so that the first to the fourth modified regions 4A to 4D formed by the first to the fourth laser lights L1 to L4 emitted do not overlap with each other.

An example of an operation for performing the trimming processing in the laser processing apparatus 800 according to the eighth embodiment will be described in detail.

First of all, as illustrated in FIG. 32(a), the stage 107 is rotated and the first laser processing head 10A on which the alignment camera 110 is attached is moved along the X-axis rail 108 and the first Z-axis rail 106A by the controller 9, to make the alignment camera 110 positioned immediately above the alignment target 100n of the target 100, and make the alignment camera 110 focused on the alignment target 100n.

The alignment camera 110 captured an image. The 0 degree direction position of the target 100 is acquired by the controller 9 based on the image captured by the alignment camera 110. The diameter of the target 100 is acquired by the controller 9 based on the image captured by the alignment camera 110. The stage 107 is rotated by the controller 9 to position the target 100 at the reference position in the θ direction (the position where the processing position of the third laser processing head 10C (the position of the third focusing point P3) is the 0 degree position).

Then, the controller 9 performs the second orbit process. In the second orbit process, as illustrated in FIG. 32(b), the first and the second laser processing heads 10A and 10B move along the X-axis rail 108 to position the first and the second focusing points P1 and P2 at a predetermined trimming positions in the X direction. The third and the fourth laser processing heads 10C and 10D move along the Y-axis rail 109, to position the third and the fourth focusing points P3 and P4 at a predetermined trimming position in the Y direction. The first to the fourth laser processing heads 10A to 10D move along the first to the fourth Z-axis rails 106A to 106D in the Z direction, to position the first to the fourth focusing points P1 to P4 at the same position in the Z direction. For example, the predetermined trimming position is a position separated from the outer edge of the effective region R, that is, the outer circumference of the target 100 toward the inner side in the radial direction by a predetermined distance. In FIG. 32(b), the boundary between the effective region R and the removal region E is indicated by a broken line (the same applies to FIGS. 33(b) and 33(c)).

Next, rotation of the stage 107 starts as illustrated in FIGS. 33(a) to 33(c). The ranging sensor starts following the back surface 100b. The first to the fourth laser processing heads 10A to 10D start emitting the first to the fourth laser lights L1 to L4, when the rotation speed of the stage 107 becomes constant (constant speed), and when the target 100 is positioned at a reference position in the θ direction (0, 90, 180, or 270 degrees for example, where stable quality is achieved).

Figure 34:
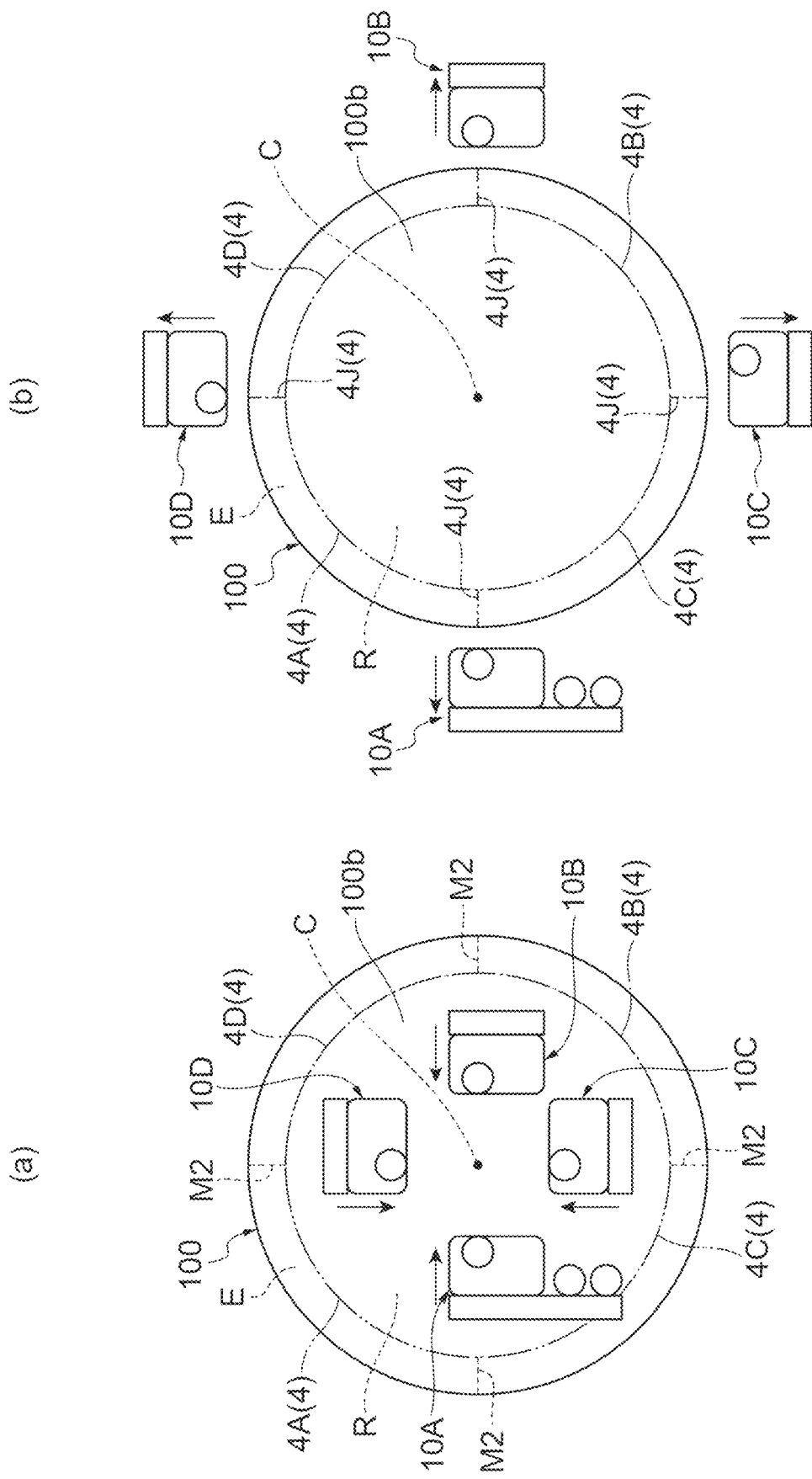
FIG. 34(a) is a plan view of a target illustrating a removal process according to the eighth embodiment.
FIG. 34(b) is a plan view of the target continuing from FIG. 34(a).

As illustrated in FIG. 34(a), when the stage 107 makes a quarter rotation from the start of the emission of the first to the fourth laser lights L1 to L4, the emission of the first to the fourth laser lights L1 to L4 stops. As a result, a single annular modified region 4 formed by the first to the fourth modified regions 4A to 4D connected with each other, along the circumferential edge of the effective region R. The ranging sensor stops, and the rotation of the stage 107 stops with the target 100 positioned at the reference position in the θ direction.

Then, the controller 9 performs the removal process of forming the modified region 4 in the removal region E (processing of cutting out the outer circumferential portion). In the removal process, the first to the fourth laser processing heads 10A to 10D move in the X and Y directions from the outer edge of the effective region R by an approach distance to a position on the inner side in the radial direction. The first to the fourth laser processing heads 10A to 10D move in the Z direction, to position the first to the fourth focusing points P1 to P4 at a position in the Z direction designated by the processing condition. The ranging sensor starts following the back surface 100b.

Figure 35:
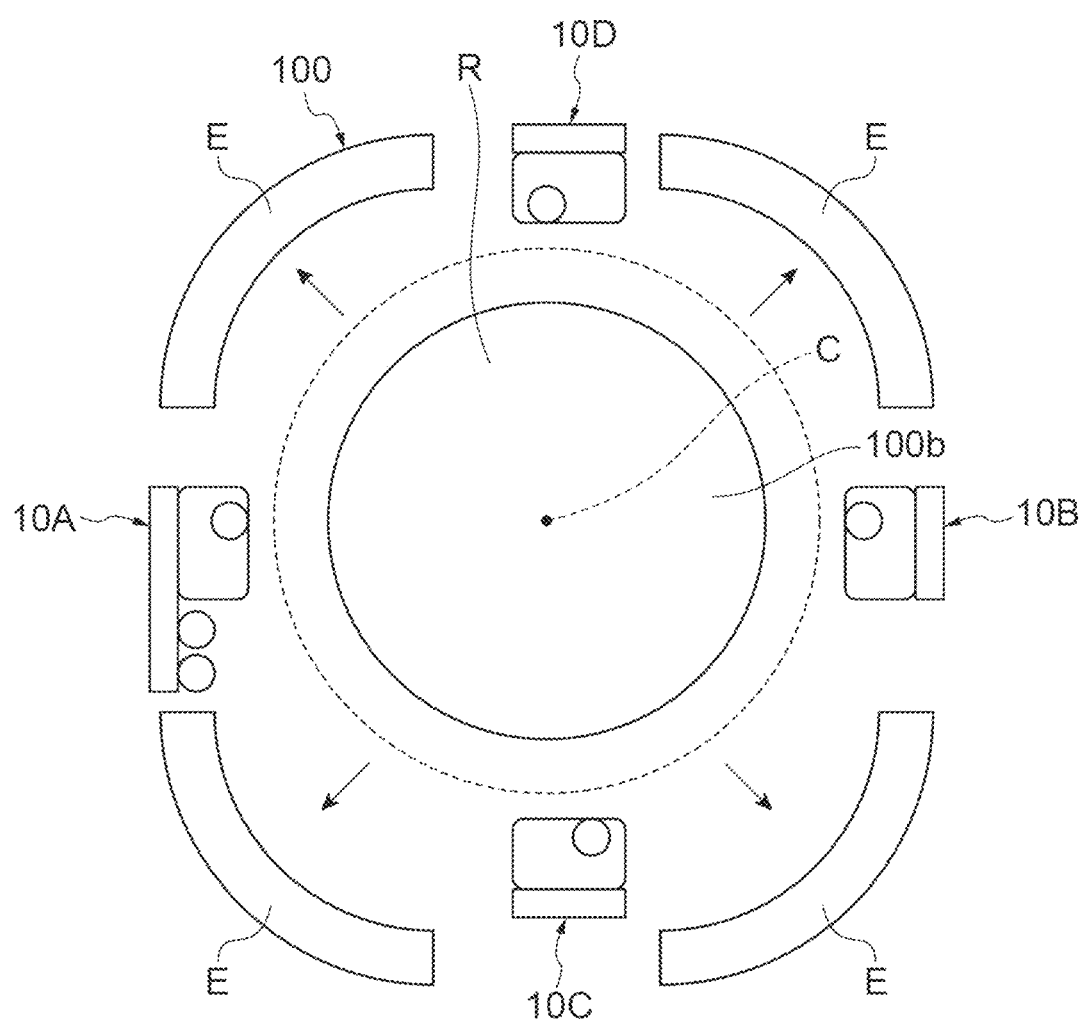
FIG. 35 is a plan view of the target continuing from FIG. 34(b).

The first and the second laser processing heads 10A and 10B move in the X direction and the third and the fourth laser processing heads 10C and 10D move in the Y direction with the rotation of the stage 107 stopped, to move the first to the fourth focusing points P1 to P4 move toward the outer side in the radial direction at a constant speed. At this time, when the first to the fourth focusing points P1 to P4 are located in the removal region E, the emission of the first to the fourth laser lights L1 to L4 is performed, and the emission of the first to the fourth laser lights L1 to L4 stops when the first to the fourth focusing points P1 to P4 is not positioned therein. Such scanning using the first to the fourth laser lights L1 to L4 is repeated a plurality of times while changing the positions of the first to the fourth focusing points P1 to P4 in the Z direction. As a result, as illustrated in FIG. 34(b), a modified region 4J is formed along a line M2 (see FIG. 34(a)) that divides the removal region E into four equal parts as viewed in the Z direction. Cracks extending along the line M2 and reaching at least one of the front surface 100a and the back surface 100b may extend from the modified region 4J formed. Then, as illustrated in FIG. 35, the removal region E is removed using a jig, air, or the like, with the modified regions 4A to 4D and 4J serving as boundaries.

As described above, also with the laser processing apparatus 800 according to the eighth embodiment, more modified regions 4 can be formed simultaneously or in parallel, when performing various types of processing on the target 100, whereby better takt time can be achieved. Various processes can be efficiently performed on the target 100. Also with the laser processing apparatus 800, the trimming processing can be accurately performed.

In the laser processing apparatus 800, with the second orbit process, the first to the fourth focusing points P1 to P4 are positioned at the same positions in the Z direction, and starting and stopping of the first to the fourth laser lights L1 to L4 respectively from the first to the fourth laser processing heads 10A to 10D are controlled so that the plurality of the modified regions 4 formed by the first to the fourth laser lights L1 to L4 emitted do not overlap with each other. As a result, the annular modified region 4 can be efficiently formed by using the first to the fourth laser processing heads 10A to 10D.

In particular, in the present embodiment, after emitting the laser lights respectively from the plurality of laser processing heads, the emission of the laser light stops when the stage 107 is rotated by 360 degrees/(the number of laser processing heads). One annular modified region 4 can be formed along the circumferential edge of the effective region R of the target 100, by connecting the plurality of modified regions 4 with each other. This connection between the modified regions 4 shall not be regarded as overlapping of the modified regions 4.

In the removal process by the laser processing apparatus 800, the emission of the first to the fourth laser lights L1 to L4 from the first to the fourth laser processing heads 10A to 10D start and stop, when the constant speed of the first to the fourth focusing points P1 to P4 is achieved. Thus, a constant pitch between a plurality of modified spots included in the modified region 4 formed by the removal process can be achieved.

In the removal process performed by the laser processing apparatus 800, the first to the fourth focusing points P1 to P4 move in a direction away from the center of the target 100. In this case, the subdivision of the removal region E described above can be specifically implemented. Note that in the removal process, the first to the fourth focusing points P1 to P4 may move in a direction toward the center of the target 100.

Figure 36:
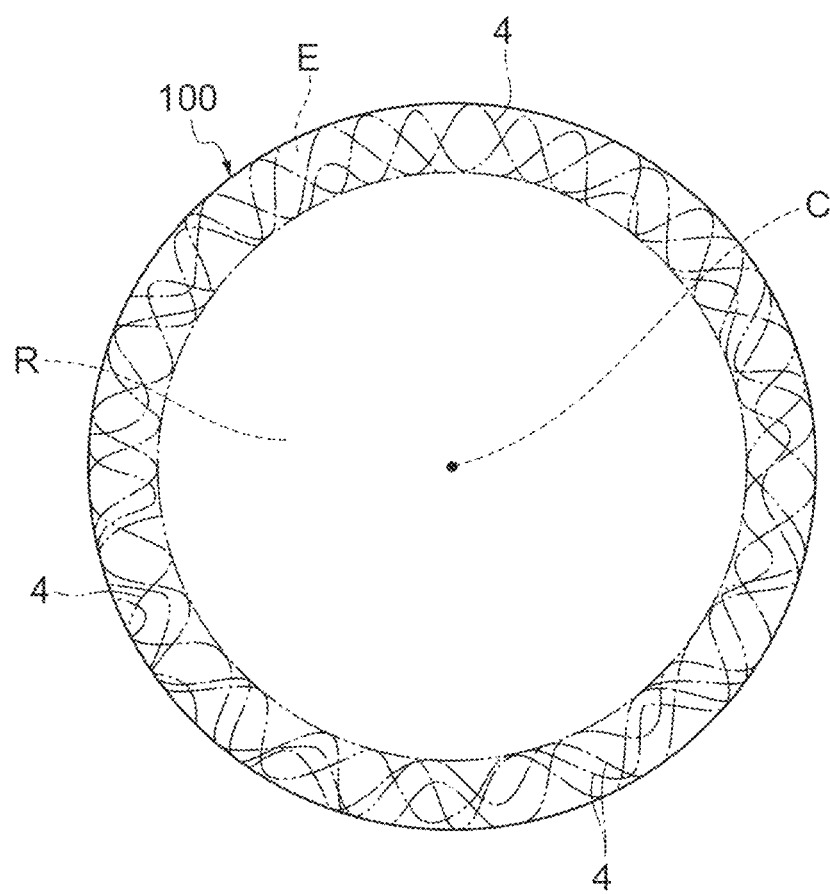
FIG. 36 is a plan view of a target illustrating a removal process according to a modification example.

In the removal process of the present embodiment, the modified region 4 is formed in the removal region E with the rotation of the stage 107 stopped, but the modified region 4 may be formed in the removal region E with the stage 107 rotating. As a result, the modified region 4 can be formed in the removal region E as illustrated in FIG. 36 for example. The removal region E can be subdivided, and debris can be blown off during subsequent grinding. By adjusting various conditions in the removal process, the debris can be controlled (debris control).

In the present embodiment, the X-axis rail 108 and the Y-axis rail 109 are installed. But this configuration should not be construed in a limiting sense, and first and second axes may be provided in any way as long as they intersect with each other as viewed in the Z direction. When the target 100 including silicon is formed, for example, the X-axis rail 108 and the Y-axis rail 109 intersecting with each other at a right angle may be provided as described above, for the sake of crystal orientation and cutting quality.

In the present embodiment, in addition to the X-axis rail 108 and the Y-axis rail 109, one or a plurality of horizontal axes for moving at least one of the first to the fourth laser processing heads 10A to 10D may be further provided. For example, in addition to the X-axis rail 108 (first axis) and the Y-axis rail 109 (second axis), a third axis may be provided to intersect with the X-axis rail 108 at 45 degrees.

In the present embodiment, only the first laser processing head 10A, that is, the first focusing point P1 is controlled to be movable to the position of the rotation axis C of the stage 107 in the X direction. However, this should not be construed in a limiting sense. For example, both of the first and the second laser processing heads 10A and 10B, and thus both of the first and the second focusing points P1 and P2 may be controlled to be movable to the position of the rotation axis C of the stage 107 in the X direction. In the present embodiment, the stage 107 may be configured to be movable in at least one of the X direction and the Y direction. In the present embodiment, the internal structures of the third laser processing head 10C and the fourth laser processing head 10D may be not be mirror symmetrical.

The shape of the beam at the first to the fourth focusing points P1 to P4 is not true circle, and is ellipse. Generally, when the modified region 4 is formed in the target 100 along a cleavage direction at an angle such as 0 or 90 degrees, the major axis direction of the ellipse related to the beam shape (hereinafter, also referred to as "ellipse major axis direction") matches the processing proceeding direction. When the modified region 4 is formed in a circumferential form, the ellipse major axis direction might be deviated from the cleavage direction depending on the angle or the like with respect to orientation flat, resulting in deteriorated processing quality. To suppress the deterioration of the processing quality, the processing may be performed with the ellipse major axis direction at an angle different from that of the processing proceeding direction. In this case, the ellipse major axis direction may be variable, or may be fixed to average the quality of the processing in all directions.

Ninth Embodiment

Next, a laser processing apparatus according to a ninth embodiment will be described. In the description of the ninth embodiment, the points different from those in the eighth embodiment will be described, and the description that is given in the eighth embodiment will not be redundantly given.

In the circumferential edge process of the ninth embodiment, the first laser light L1 is emitted with the first focusing point P1 of the first laser light L1 positioned at a first position in the Z direction while rotating the stage 107, and stops the emission of the first laser light L1 when the stage 107 makes a single turn after the emission of the first laser light L1 has started, whereby an annular modified region 4 is formed along the circumferential edge of the effective region R.

In the circumferential edge process, the second laser light L2 is emitted with the second focusing point P2 of the second laser light L2 positioned at a second position more on the laser light incident surface side than the first position in the Z direction while rotating the stage 107, and stops the emission of the second laser light L2 when the stage 107 makes a single turn after the emission of the second laser light L2 has started, whereby an annular modified region 4 is formed along the circumferential edge of the effective region R.

In the circumferential edge process, the third laser light L3 is emitted with the third focusing point P3 of the third laser light L3 positioned at a third position more on the laser light incident surface side than the second position in the Z direction while rotating the stage 107, and stops the emission of the third laser light L3 when the stage 107 makes a single turn after the emission of the third laser light L3 has started, whereby an annular modified region 4 is formed along the circumferential edge of the effective region R.

In the circumferential edge process, the fourth laser light L4 is emitted with the fourth focusing point P4 of the fourth laser light L4 positioned at a fourth position more on the laser light incident surface side than the third position in the Z direction while rotating the stage 107, and stops the emission of the fourth laser light L4 when the stage 107 makes a single turn after the emission of the fourth laser light L4 has started, whereby an annular modified region 4 is formed along the circumferential edge of the effective region R.

In the circumferential edge process, the second focusing point P2 is separated from the first focusing point P1 by 90 degrees in the forward rotation direction of the stage 107, the third focusing point P3 is separated from the second focusing point P2 by 90 degrees in the forward rotation direction of the stage 107, the fourth focusing point P4 is separated from the third focusing point P3 by 90 degrees in the forward rotation direction of the stage 107, and the first focusing point P1 is separated from the fourth focusing point P4 by 90 degrees in the forward rotation direction of the stage 107.

Figure 37:
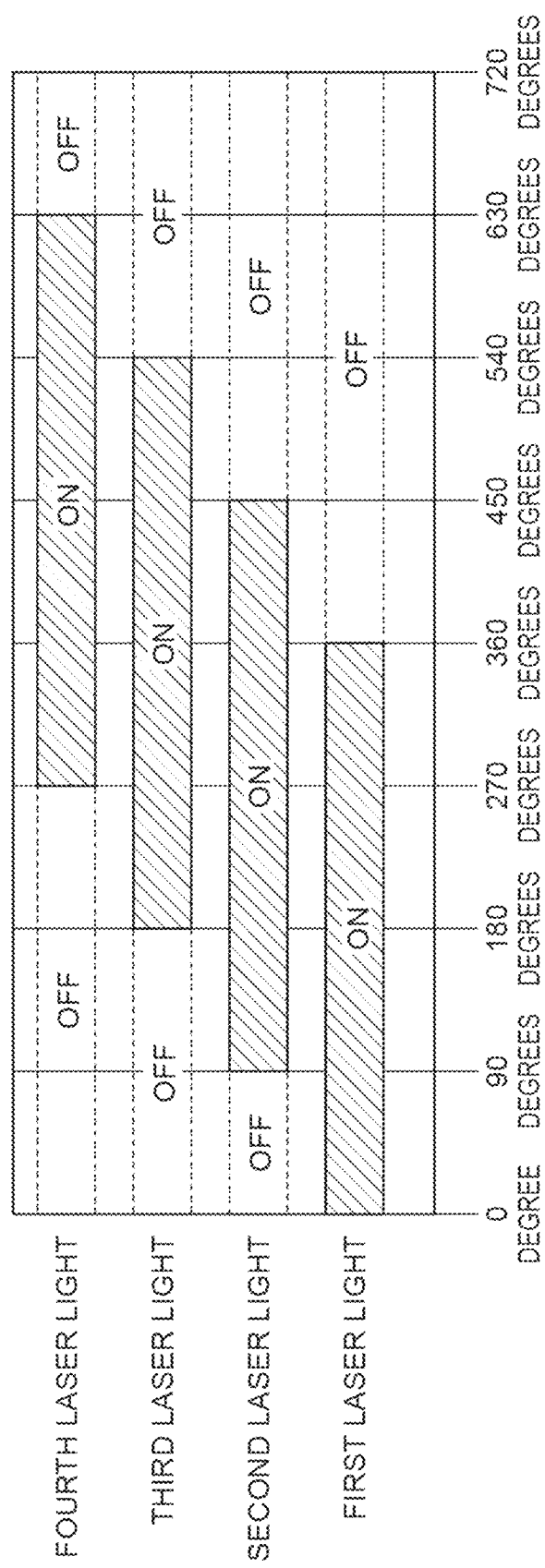
FIG. 37 is a graph illustrating timings at which first to fourth laser lights are emitted and stopped in a circumferential edge process according to ninth embodiment.

In the circumferential edge process, as illustrated in FIG. 37, the second laser light L2 starts to be emitted when the stage 107 rotates by 90 degrees after the emission of the first laser light L1 has started. In the circumferential edge process, the third laser light L3 starts to be emitted when the stage 107 rotates by 90 degrees after the emission of the second laser light L2 has started. In the circumferential edge process, the fourth laser light L4 starts to be emitted when the stage 107 rotates by 90 degrees after the emission of the third laser light L3 has started.

An operation for the trimming processing in the laser processing apparatus according to the ninth embodiment is different from that in the eighth embodiment in the following points. Specifically, the controller 9 moves the first to the fourth laser processing heads 10A to 10D along the first to the fourth Z-axis rails 106A to 106D, so that the first to the fourth focusing points P1 to P4 in the Z direction are positioned farther from the laser light incident surface (back surface 100b) in this order in the Z direction. The first laser processing head 10A starts emitting the first laser light L1, when the stage 107 starts rotating and the rotation speed of the stage 107 becomes constant (constant speed), and when the target 100 is positioned at a reference position in the θ direction. The second laser light L2 starts to be emitted when the stage 107 rotates by 90 degrees after the emission of the first laser light L1 has started. The third laser light L3 starts to be emitted when the stage 107 rotates by 90 degrees after the emission of the second laser light L2 has started. The third laser light L3 starts to be emitted when the stage 107 rotates by 90 degrees after the emission of the third laser light L3 has started.

As described above, also with the laser processing apparatus according to the ninth embodiment, more modified regions 4 can be formed simultaneously or in parallel, when performing various types of processing on the target 100, whereby better takt time can be achieved. Various processes can be efficiently performed on the target 100. Also with the laser processing apparatus according to the ninth embodiment, the trimming processing can be accurately performed.

The circumferential edge process performed by the laser processing apparatus of the ninth embodiment, includes processing in which the first laser light L1 is emitted with the first focusing point P1 positioned at the first position in the Z direction while rotating the stage 107, and stops the emission of the first laser light L1 when the stage 107 makes a single turn after the emission of the first laser light L1 has started, whereby an annular modified region 4 is formed along the circumferential edge of the effective region R. The circumferential edge process includes processing in which the second laser light L2 is emitted with the second focusing point P2 positioned at the second position more on the back surface 100b side than the first position while rotating the stage 107, and the emission of the second laser light L2 stops when the stage 107 makes a single turn after the emission of the second laser light L2 has started, to form the annular modified region 4 along the circumferential edge of the effective region R. The second focusing point P2 is separated from the first focusing point P1 by a predetermined angle in the forward θ direction (90 degrees herein), and the emission of the second laser light L2 starts after the stage 107 has rotated by a predetermined angle after the emission of the first laser light L1 has started. As a result, when the annular modified regions 4 are formed at a plurality of different positions in the Z direction, the existence of the modified regions 4 on the back surface 100b side that is the laser light incident surface can be prevented from adversely affecting the formation of the modified region 4 on the front surface 100a side opposite to the laser light incident surface.

Tenth Embodiment

Next, a laser processing apparatus according to a tenth embodiment will be described. In the description of the tenth embodiment, the points different from those in the first embodiment will be described, and the description that is given in the first embodiment will not be redundantly given.

Figure 38:
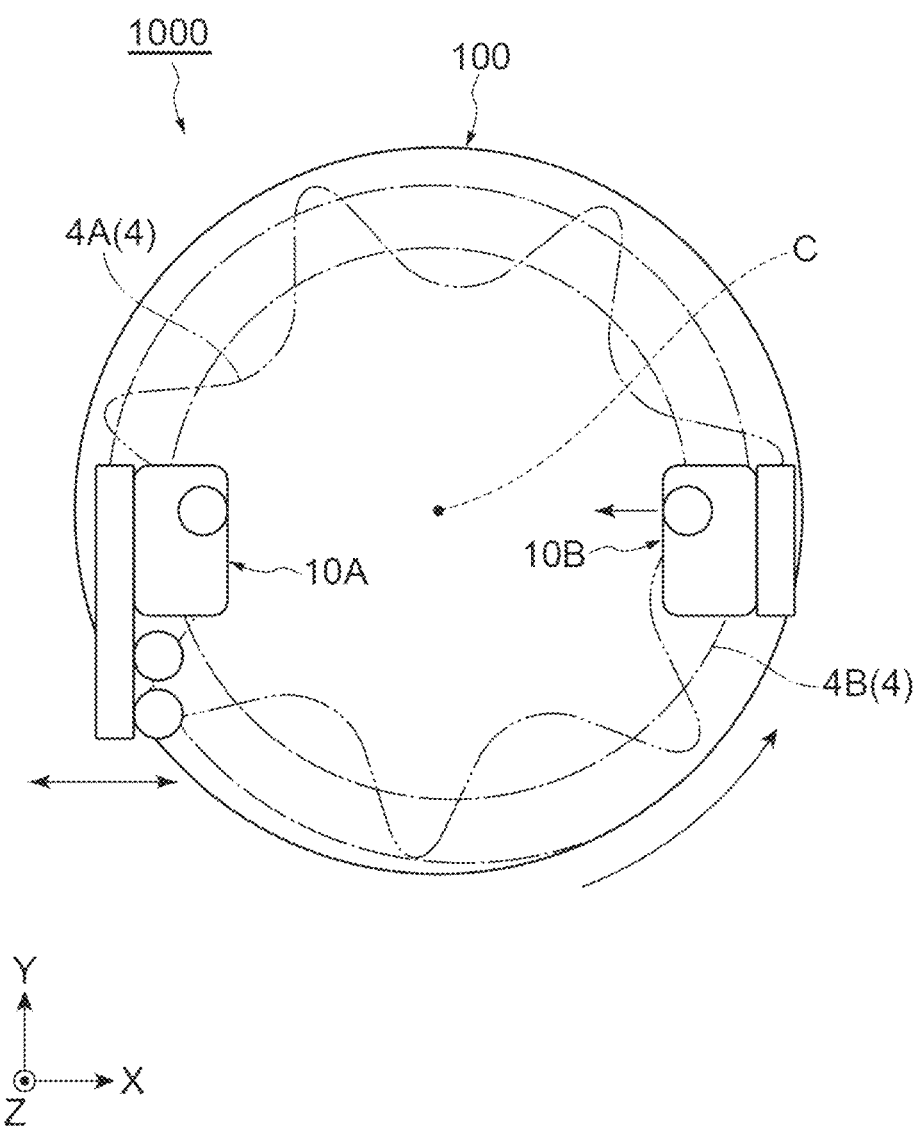
FIG. 38 is a plan view of a target illustrating a first peeling process according to a tenth embodiment.

In a first peeling process performed by the controller 9 in the tenth embodiment, as illustrated in FIG. 38, the first focusing point P1 is repeatedly moved in a reciprocating manner in one direction and the other direction in the X direction while rotating the stage 107, whereby the first modified region 4A extending in a wavy form along the rotation direction of the stage 107 is formed. In the first peeling process, the second focusing point P2 moves in one direction in the X direction while rotating the stage 107, whereby the second modified region 4B having a spiral shape around the position of the rotation axis C and intersecting with the first modified region 4A.

An example of the first peeling process performed by the laser processing apparatus 1000 according to the tenth embodiment will be described in detail.

First of all, the first and the second laser processing heads 10A and 10B are moved along the X-axis rail 108 to position the first and the second focusing points P1 and P2 at predetermined peeling start positions in the X direction. For example, the predetermined peeling start position is a predetermined position in an outer circumferential portion of the target 100. Then, the rotation of the stage 107 starts. The first and the second laser processing heads 10A and 10B start emitting the first and the second laser lights L1 and L2 when a constant rotation speed of the stage 107 is achieved. The first laser processing head 10A move along the X-axis rail 108 in a reciprocating manner, to make the first focusing point P1 reciprocate in the X direction within a predetermined range. The second laser processing head 10B moves along the X-axis rail 108 so that the second focusing point P2 approaches the position of the rotation axis C in the X direction.

Figure 10:
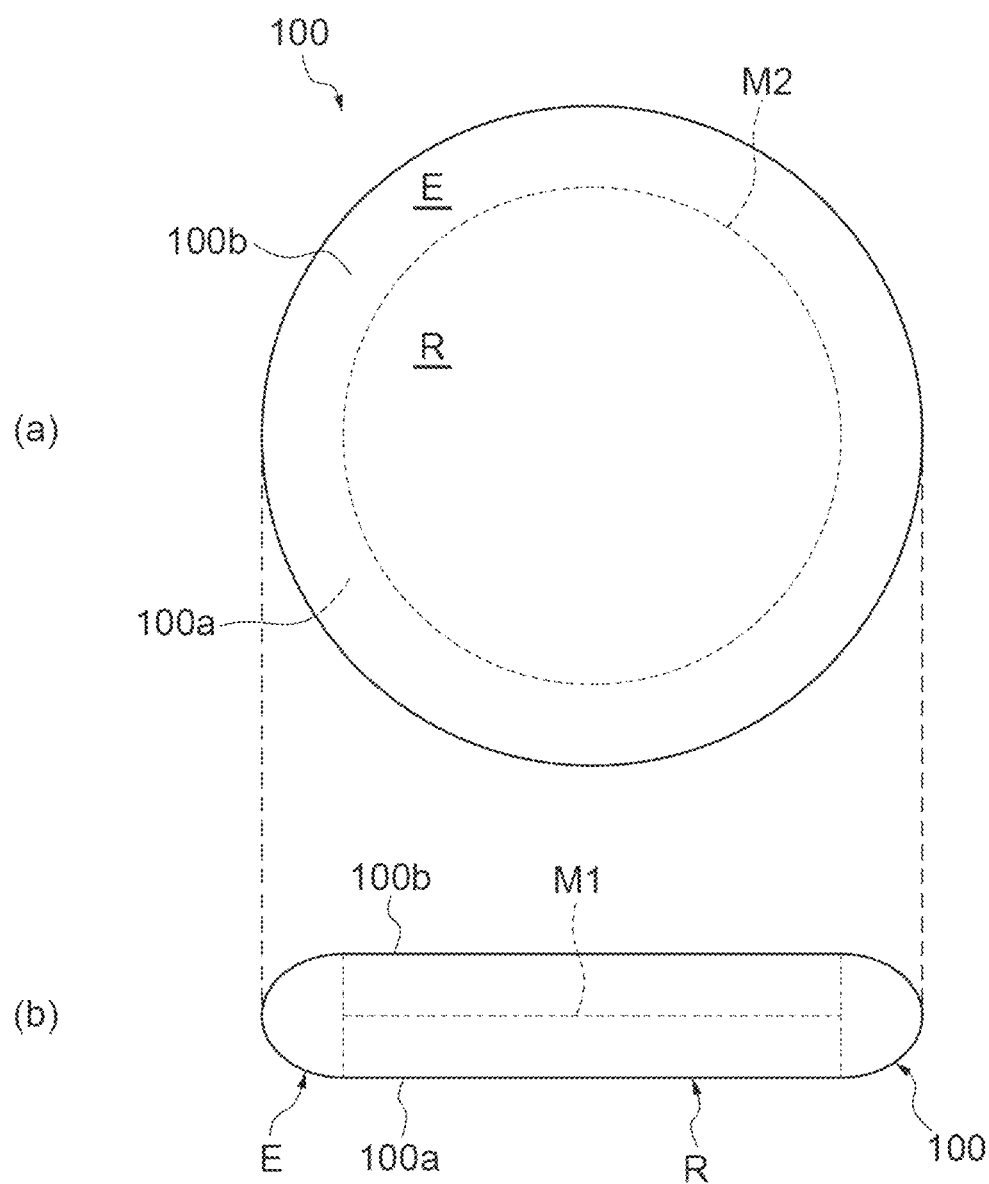
FIG. 10(a) is a plan view of an example of a target.
FIG. 10(b) is a side view of the target illustrated in FIG. 10(a).

With the above configuration, the first modified region 4A extending in a wavy form along the rotation direction of the stage 107, and the second modified region 4B having a spiral shape around the position of the rotation axis C and intersecting with the first modified region 4A are formed in the target 100 along the virtual plane M1 as viewed in the Z direction (see FIG. 10).

As described above, also with the laser processing apparatus 1000 according to the tenth embodiment, more modified regions 4 can be formed simultaneously or in parallel, when performing various types of processing on the target 100, whereby better takt time can be achieved. Various processes can be efficiently performed on the target 100. Also with the laser processing apparatus 1000, the trimming processing can be accurately performed.

With the laser processing apparatus 1100, the first modified region 4A extending in a wavy form along the θ direction and the second modified region 4B having a spiral shape and intersecting with the first modified region 4A can be formed along the virtual plane M1 through the first peeling process. As a result, a part of the target 100 can be peeled with the first and the second modified regions 4A and 4B serving as boundaries. The efficient peeling processing can be specifically implemented.

Eleventh Embodiment

Next, a laser processing apparatus according to an eleventh embodiment will be described. In the description of the eleventh embodiment, the points different from those in the first embodiment will be described, and the description that is given in the first embodiment will not be redundantly given.

In the laser processing apparatus 1100 according to the eleventh embodiment, the first laser processing head 10A is arranged to be shifted in the Y direction with respect to the rotation axis C, so that the position of the first focusing point P1 is separated from the rotation axis C in the Y direction. Such an arrangement can be implemented with a Y-axis rail for moving the first laser processing head 10A in the Y direction further provided for example. Alternatively, such an arrangement can be implemented, for example, by changing the fixed Y direction position of the X-axis rail 108 (see FIG. 9) for moving the first laser processing head 10A in the X direction.

Figure 39:
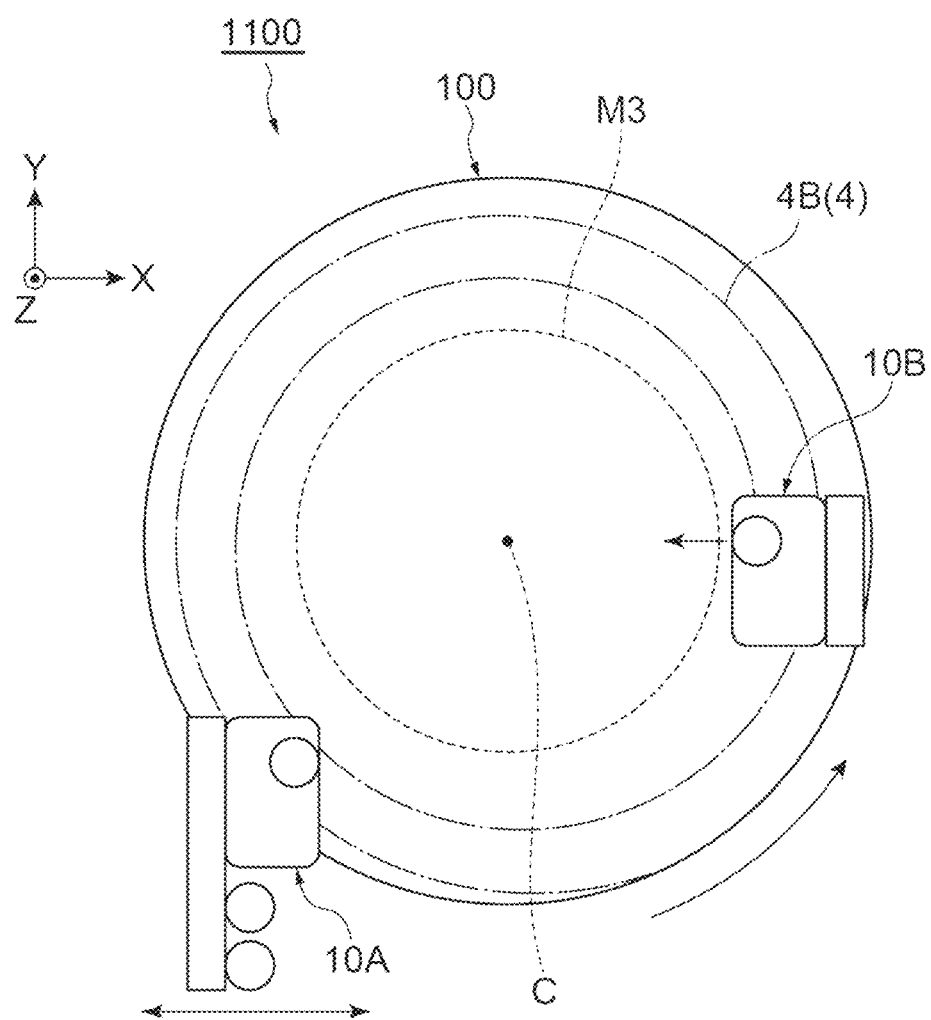
FIG. 39 is a plan view of a target illustrating a first peeling process according to an eleventh embodiment.

In the first peeling process performed by the controller 9 in the eleventh embodiment, the first focusing point P1 moves in a reciprocating manner in the X direction along a tangent of a virtual circle M3 concentric with the target 100 as viewed in the Z direction while rotating the stage 107 as illustrated in FIG. 39 to form the first modified region. In the first peeling process, the second focusing point P2 moves in one direction in the X direction while rotating the stage 107, whereby the second modified region 4B having a spiral shape around the position of the rotation axis C and intersecting with the first modified region.

An example of the first peeling process performed by the laser processing apparatus 1100 according to the eleventh embodiment will be described in detail.

First of all, the first and the second laser processing heads 10A and 10B are moved along the X-axis rail 108 to position the first and the second focusing points P1 and P2 at predetermined peeling start positions in the X direction. For example, the predetermined peeling start position is a predetermined position in an outer circumferential portion of the target 100. Then, the rotation of the stage 107 starts. The first and the second laser processing heads 10A and 10B start emitting the first and the second laser lights L1 and L2 when a constant rotation speed of the stage 107 is achieved. The first laser processing head 10A moves in a reciprocating manner along the X-axis rail 108 to move the first focusing point P1 in a reciprocating manner in the X direction along the tangent of the virtual circle M3. The second laser processing head 10B moves along the X-axis rail 108 toward the rotation axis C so that the second focusing point P2 approaches the position of the rotation axis C in the X direction. With the above configuration, the first modified region (not illustrated) extending in a curved form in contact with the virtual circle M3 at a portion more on the outer circumference side than the virtual circle M3 of the target 100 as viewed in the Z direction, and the second modified region 4B having a spiral shape around the position of the rotation axis C and intersecting with the first modified region are formed along the virtual plane M1 (see FIG. 10) in the target 100.

As described above, also with the laser processing apparatus 1100 according to the eleventh embodiment, more modified regions 4 can be formed simultaneously or in parallel, when performing various types of processing on the target 100, whereby better takt time can be achieved. Various processes can be efficiently performed on the target 100. Also with the laser processing apparatus 1100, the trimming processing can be accurately performed.

In the laser processing apparatus 1100, through the first peeling process, the first modified region in a curved form in contact with the virtual circle M3 at a portion more on the outer circumference side than the virtual circle M3, and the second modified region 4B having a spiral shape and intersecting with the first modified region are formed along the virtual plane M1. Thus, a part of the target 100 can be peeled with these modified regions 4 serving as boundaries. The efficient peeling processing can be specifically implemented.

Twelfth Embodiment

Next, a laser processing apparatus according to a twelfth embodiment will be described. In the description of the twelfth embodiment, the points different from those in the first embodiment will be described, and the description that is given in the first embodiment will not be redundantly given.

In the laser processing apparatus 1200 according to the twelfth embodiment, the first laser processing head 10A is arranged to be shifted on one side in the Y direction with respect to the rotation axis C, so that the position of the first focusing point P1 is separated from the rotation axis C toward one side in the Y direction. Such an arrangement can be implemented with a Y-axis rail for moving the first laser processing head 10A in the Y direction further provided for example. Alternatively, such an arrangement can be implemented, for example, by changing the fixed Y direction position of the X-axis rail 108 (see FIG. 9) for moving the first laser processing head 10A in the X direction.

In the laser processing apparatus 1200 according to the twelfth embodiment, the second laser processing head 10B is arranged to be shifted on other side in the Y direction with respect to the rotation axis C, so that the position of the second focusing point P2 is separated from the rotation axis C toward the other side in the Y direction. Such an arrangement can be implemented with a Y-axis rail for moving the second laser processing head 10B in the Y direction further provided for example. Alternatively, such an arrangement can be implemented, for example, by changing the fixed Y direction position of the X-axis rail 108 (see FIG. 9) for moving the second laser processing head 10B in the X direction.

Figure 40:
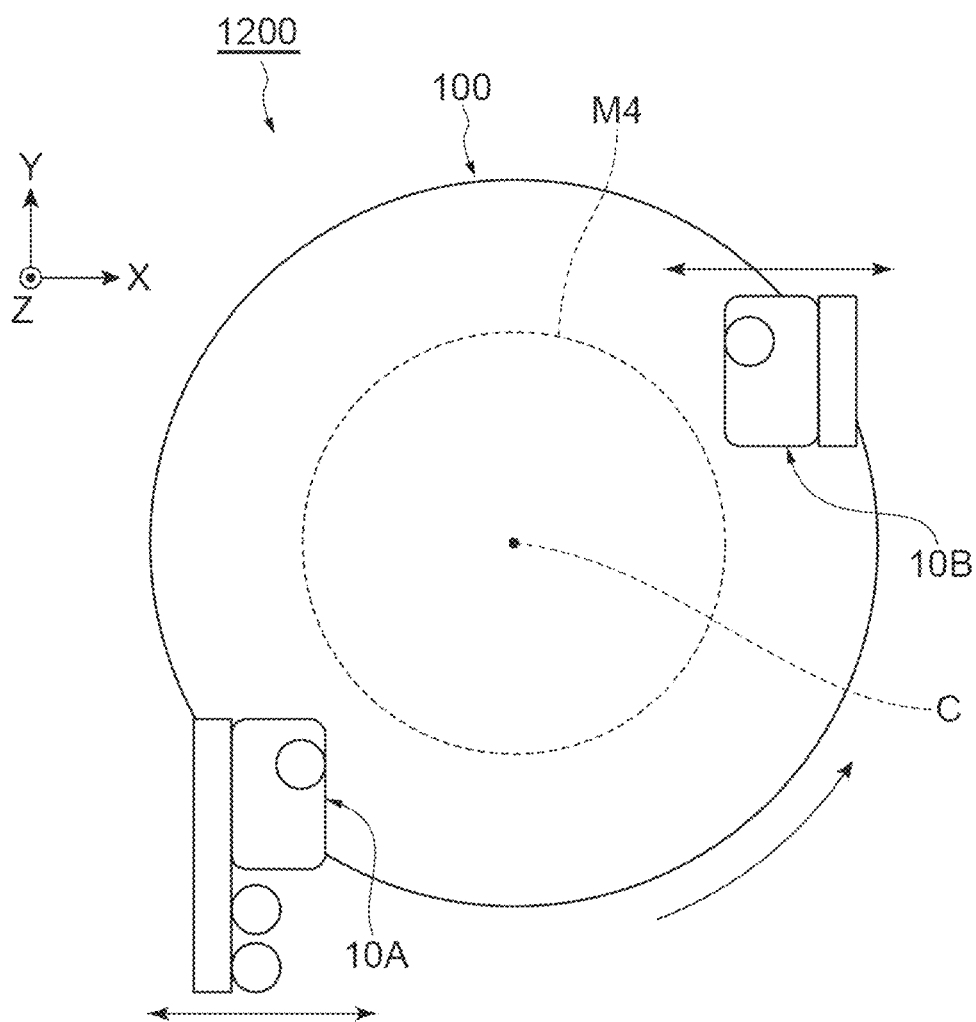
FIG. 40 is a plan view of a target illustrating a first peeling process according to a twelfth embodiment.

In the first peeling process performed by the controller 9 in the twelfth embodiment, the first focusing point P1 moves in a reciprocating manner in the X direction along a tangent of a virtual circle M4 concentric with the target 100 as viewed in the Z direction while rotating the stage 107 as illustrated in FIG. 40 to form the first modified region. In the first peeling process, the second focusing point P2 moves in a reciprocating manner in the X direction along the tangent of the virtual circle M4 while rotating the stage 107, to form the second modified region.

An example of the first peeling process performed by the laser processing apparatus 1200 according to the twelfth embodiment will be described in detail.

First of all, the first and the second laser processing heads 10A and 10B are moved along the X-axis rail 108 to position the first and the second focusing points P1 and P2 at predetermined peeling start positions in the X direction. For example, the predetermined peeling start position is a predetermined position in an outer circumferential portion of the target 100. Then, the rotation of the stage 107 starts. The first and the second laser processing heads 10A and 10B start emitting the first and the second laser lights L1 and L2 when a constant rotation speed of the stage 107 is achieved. The first laser processing head 10A moves in a reciprocating manner along the X-axis rail 108 to move the first focusing point P1 in a reciprocating manner in the X direction along the tangent of the virtual circle M4. The second laser processing head 10B moves in a reciprocating manner along the X-axis rail 108 to move the second focusing point P2 in a reciprocating manner in the X direction along the tangent of the virtual circle M4. With the above configuration, the first and the second modified regions (not illustrated) extending in a curved form in contact with the virtual circle M4 at a portion more on the outer circumference side than the virtual circle M4 of the target 100 as viewed in the Z direction are formed along the virtual plane M1 (see FIG. 10) in the target 100.

As described above, also with the laser processing apparatus 1200 according to the twelfth embodiment, more modified regions 4 can be formed simultaneously or in parallel, when performing various types of processing on the target 100, whereby better takt time can be achieved. Various processes can be efficiently performed on the target 100. Also with the laser processing apparatus 1200, the trimming processing can be accurately performed.

In the laser processing apparatus 1200, through the first peeling process, the first and the second modified regions in a curved form in contact with the virtual circle M4 at a portion more on the outer circumference side than the virtual circle M4 are formed along the virtual plane M1. Thus, a part of the target 100 can be peeled with these modified regions serving as boundaries. The efficient peeling processing can be specifically implemented.

Thirteenth Embodiment

Next, a laser processing apparatus according to a thirteenth embodiment will be described. In the description of the thirteenth embodiment, the points different from those in the eighth embodiment will be described, and the description that is given in the eighth embodiment will not be redundantly given.

Figure 41:
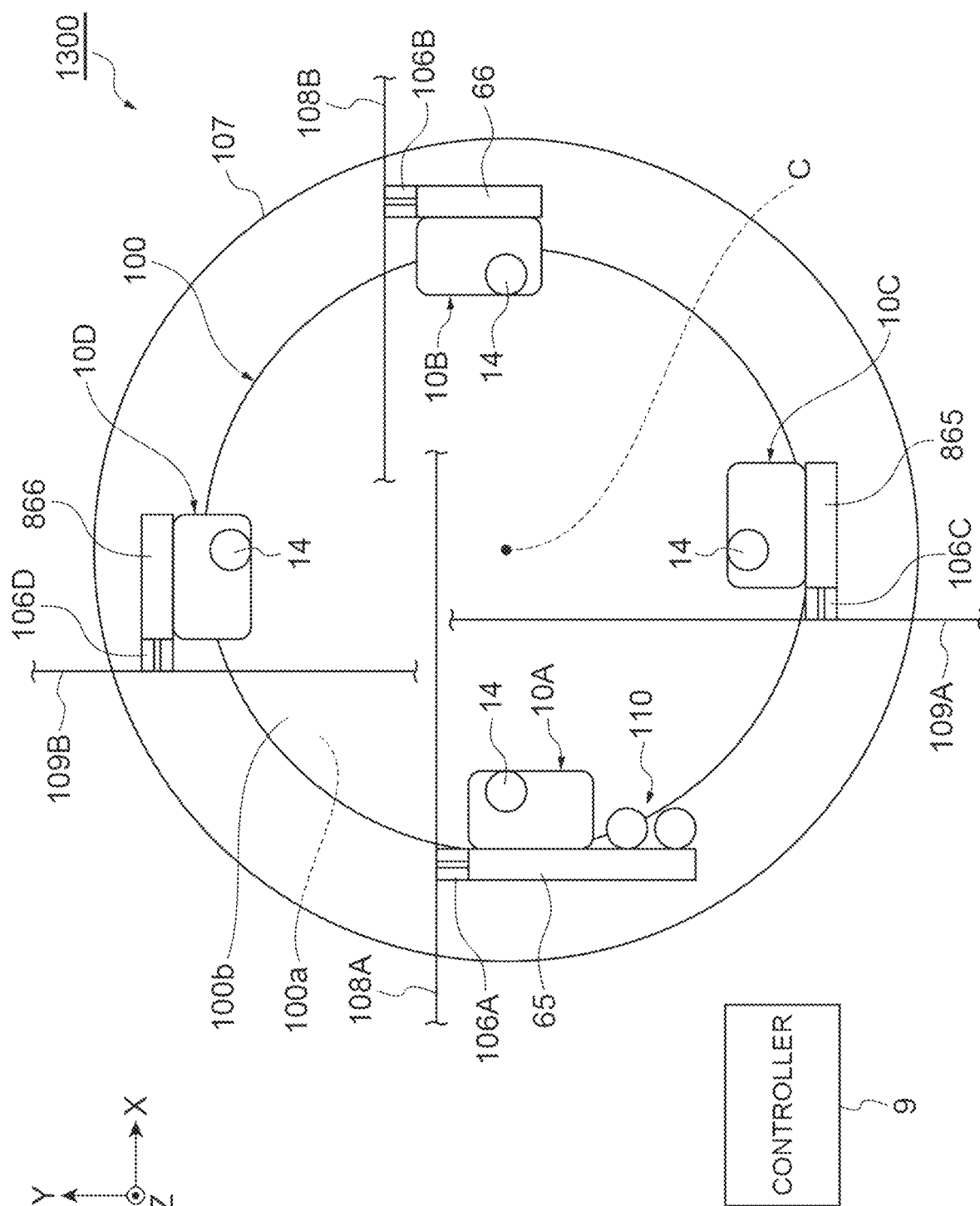
FIG. 41 is a plan view of a schematic configuration of a laser processing apparatus according to a thirteenth embodiment.

As illustrated in FIG. 41, a laser processing apparatus 1300 according to the thirteenth embodiment includes first and second X-axis rails 108A and 108B instead of the X-axis rail 108. The first X-axis rail 108A is a rail extending along the X direction. The first X-axis rail 108A is attached to the first Z-axis rail 106A. The first laser processing head 10A moves on the first X-axis rail 108A along the X direction so that the first focusing point P1 of the first laser light L1 moves along the X direction. The first laser processing head 10A moves on the first X-axis rail 108A along the X direction to make the first focusing point P1 (condensing unit 14) passes through or near the rotation axis C. The first X-axis rail 108A serves as the first horizontal movement mechanism (horizontal movement mechanism).

The second X-axis rail 108B is a rail extending along the X direction. The second X-axis rail 108B is attached to the second Z-axis rail 106B. The second laser processing head 10B moves on the second X-axis rail 108B along the X direction so that the second focusing point P2 of the second laser light L2 moves along the X direction. The second laser processing head 10B moves on the second X-axis rail 108B along the X direction to make the second focusing point P2 (condensing unit 14) passes through or near the rotation axis C. The second X-axis rail 108B serves as the second horizontal movement mechanism (horizontal movement mechanism).

The laser processing apparatus 1300 according to the thirteenth embodiment includes first and second Y-axis rails 109A and 109B instead of the Y-axis rail 109. The first Y-axis rail 109A is a rail extending along the Y direction. The first Y-axis rail 109A is attached to the third Z-axis rail 106C. The third laser processing head 10C moves on the first Y-axis rail 109A along the Y direction so that the third focusing point P3 of the third laser light L3 moves along the Y direction. The third laser processing head 10C moves on the first Y-axis rail 109A along the Y direction to make the third focusing point P3 (condensing unit 14) pass through or near the rotation axis C. The first Y-axis rail 109A corresponds to a rail of the movement mechanism 400. The first Y-axis rail 109A serves as a third horizontal movement mechanism (horizontal movement mechanism).

The second Y-axis rail 109B is a rail extending in the Y direction. The second Y-axis rail 109B is attached to the fourth Z-axis rail 106D. The fourth laser processing head 10D moves on the second Y-axis rail 109B along the Y direction so that the fourth focusing point P4 of the fourth laser light L4 moves along the Y direction. The fourth laser processing head 10D moves on the second Y-axis rail 109B along the Y direction to make the fourth focusing point P4 (condensing unit 14) passes through or near the rotation axis C. The second Y-axis rail 109B corresponds to a rail of the movement mechanism 400. The second Y-axis rail 109B serves as a fourth horizontal movement mechanism (horizontal movement mechanism).

The first X-axis rail 108A extends from one side of the stage 107 in the X direction to a position more on the other side than the position of the rotation axis C. The second X-axis rail 108B extends from the other side of the stage 107 in the X direction to a position not more on the one side than the position of the rotation axis C. The first Y-axis rail 109A extends from one side of the stage 107 in the Y direction to a position more on the other side than the position of the rotation axis C. The second Y-axis rail 109B extends from the other side of the stage 107 in the Y direction to a position not more on the one side than the position of the rotation axis C.

The first X-axis rail 108A and the second X-axis rail 108B are arranged to be shifted from each other in the Y direction. The first Y-axis rail 109A and the second Y-axis rail 109B are arranged to be shifted from each other in the X direction. In the illustrated example, the internal structures of the first laser processing head 10A and the second laser processing head 10B are not mirror symmetrical with each other about the rotation axis C but may be mirror symmetrical. The internal structures of the third laser processing head 10C and the fourth laser processing head 10D are not mirror symmetrical with each other about the rotation axis C but may be mirror symmetrical.

As described above, also with the laser processing apparatus 1300 according to the thirteenth embodiment, more modified regions 4 can be formed simultaneously or in parallel, when performing various types of processing on the target 100, whereby better takt time can be achieved. Various processes can be efficiently performed on the target 100. Also with the laser processing apparatus 1300, the trimming processing can be accurately performed.

Fourteenth Embodiment

Next, a laser processing apparatus according to a fourteenth embodiment will be described. In the description of the fourteenth embodiment, the points different from those in the first embodiment will be described, and the description that is given in the first embodiment will not be redundantly given.

Figure 42:
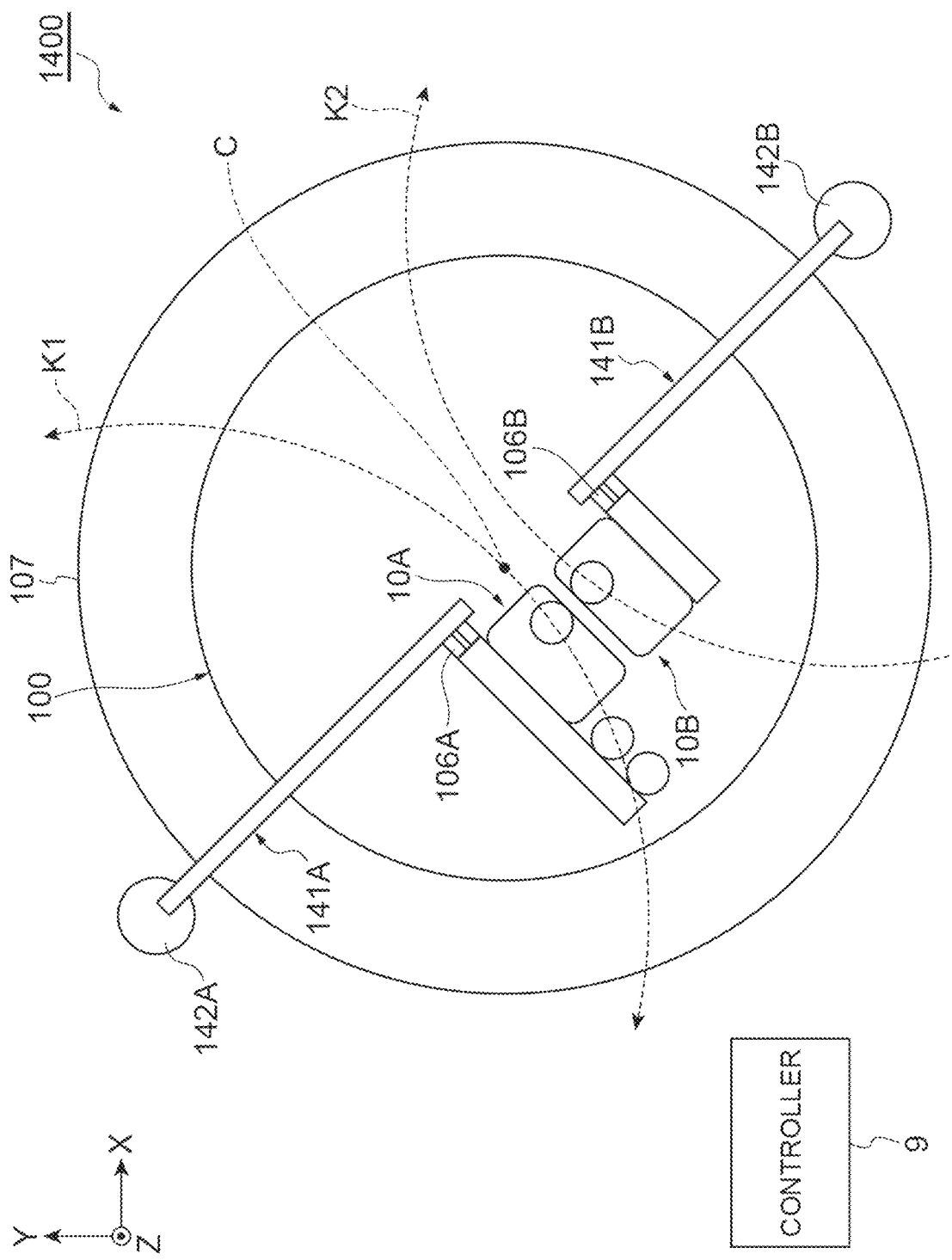
FIG. 42 is a plan view of a schematic configuration of a laser processing apparatus according to a fourteenth embodiment.

As illustrated in FIG. 42, the laser processing apparatus 1400 according to the fourteenth embodiment includes first and second rotation arms 141A and 141B, instead of the X-axis rail 108. The first rotation arm 141A has a distal end side attached to the first Z-axis rail 106A. The first rotation arm 141A has a base end side fixed to a shaft 142A along the Z direction provided outside the stage 107. The first rotation arm 141A is rotated about the shaft 142A by the driving force from a known driving device such as a motor. The first rotation arm 141A moves the first laser processing head 10A along an arcuate trajectory K1 to move the first focusing point P1 along the trajectory K1 in a rotation direction about the shaft 142A. The trajectory K1 passes through or near the rotation axis C. The first rotation arm 141A serves as the first horizontal movement mechanism (horizontal movement mechanism).

The second rotation arm 141B has a distal end side attached to the second Z-axis rail 106B. The second rotation arm 141B has a base end side fixed to a shaft 142B along the Z direction provided outside the stage 107. The second rotation arm 141B is rotated about the shaft 142B by the driving force from a known driving device such as a motor. The second rotation arm 141B moves the second laser processing head 10B along an arcuate trajectory K2 to move the second focusing point P2 along the trajectory K2 in a rotation direction about the shaft 142B. The trajectory K2 does not pass through or near the rotation axis C. The second rotation arm 141B serves as the second horizontal movement mechanism (horizontal movement mechanism).

As described above, also with the laser processing apparatus 1400 according to the fourteenth embodiment, more modified regions 4 can be formed simultaneously or in parallel, when performing various types of processing on the target 100, whereby better takt time can be achieved. Various processes can be efficiently performed on the target 100. Also with the laser processing apparatus 1400, the trimming processing can be accurately performed.

As described above, one aspect of the present invention is not limited to the above-described embodiment.

In the embodiments described above, the back surface 100b of the target 100 is the laser light incident surface, but the laser light incident surface may be the front surface 100a of the target 100. In the embodiments described above, the modified region 4 may be a crystallization region, a recrystallization region, or a gettering region formed in the target 100 for example. The crystal region is a region that maintains the structure of the target 100 before being processed. The recrystallization region is a region that is once evaporated, converted into plasma, or melted, and then solidified as a single crystal or polycrystal when resolidified. The gettering region is a region that exerts a gettering effect of collecting and capturing impurities such as heavy metals, and may be formed continuously or intermittently. For example, the processing apparatus may be applied to a process such as ablation.

In the embodiments described above, pitches of the first and the second modified spots SA and SB may vary in the peeling processing as described above. An example of such a case will be described below.

For example, the controller 9 may perform the first peeling process described above on the main region 100e to achieve a constant first pitch as the pitch. The controller 9 performs a third peeling process on the center region 100d to form at least one of the first and the second modified regions 4A and 4B along the virtual plane M1 in the target 100, with the pitch being shorter than the first pitch, by controlling movement of at least one of the first and the second focusing points P1 and P2 while irradiating the target 100 with at least one of the first and the second laser lights L1 and L2 with the stages 107 and 607 rotated or not rotated.

As a result, in the center region 100d, process control can be implemented with a pitch shorter than that in the main region 100e. The efficient peeling processing can be specifically implemented. The constant pitch includes a pitch varying within a predetermined error range.

For example, in the above third peeling process, at least one of the first and the second modified regions 4A and 4B may be formed in the center region 100d without the pitch between a plurality of modified spots included being constant. In this case, the peeling processing can be specifically implemented without requiring a control for making the pitch constant to be performed on the center region 100d. The pitch not being constant includes a pitch that is not of constant value (determined value), and includes a pitch varying within a range beyond an error range of the determined value. It is a matter of course that in the above third peeling process, at least one of the first and the second modified regions 4A and 4B may be formed in the center region 100d with the pitch being constant.

For example, the controller 9 can change the rotation speed of the stages 107 and 607 from the minimum rotation speed to the maximum rotation speed. The controller 9 may perform the first peeling process on the center region 100d, by emitting the first and the second laser lights L1 and L2 while rotating the stages 107 and 607 at the maximum rotation speed. The controller 9 may perform the first peeling process on the main region 100e, by emitting the first and the second laser lights L1 and L2 while rotating the stages 107 and 607 with the rotation speed gradually increasing as the first and the second focusing points P1 and P2 approaches the center region 100d. Also in this case, the efficient peeling processing can be specifically implemented.

As described above, the circumferential edge process is a process in the trimming processing. As described above, the trimming processing is processing of removing a region extending inward by a predetermined distance from a wafer edge (outer edge). As described above, the circumferential edge process is a process for removing an unnecessary portion in the target 100. As described above, in the circumferential edge process, the emission of the laser light from the laser processing head starts after the horizontal movement mechanism has been driven to position the focusing point at a position on the inner side of the outer edge of the target 100, but specific aspects thereof are not limited in any manner. For example, the image by the alignment camera 110 is captured while the laser processing head is moved in the X direction by the horizontal movement mechanism. Based on the timing when it is recognized that the focusing point is positioned on the outer edge (edge) of the target 100 based on the captured image, the laser processing head is continuously moved in the X direction by the horizontal movement mechanism, and the movement is stopped when the focusing point is positioned on the circumferential edge of the effective region R. Then, the emission of the laser light from the laser processing head is started. In this manner, the trimming processing according to one aspect is implemented.

As described above, the circumferential edge process may include a process (first orbit process, for example) of achieving a state where the emission of the laser light is stopped at least when the support portion makes a single turn after the emission of the laser light has started. In this manner, the trimming processing according to one aspect is implemented. The state where the emission of the laser light is stopped is a state in which the target 100 is not irradiated with the laser light. Here, only when the support portion makes a single turn, the state where the emission is stopped is achieved. If the support portion does not make a single turn or makes more than a single turn, this may be the state where the emission is stopped or the laser light is emitted.

As described above, the controller 9 is configured to be capable of having information on the position of the circumferential edge of the effective region R in the target 100 set, but specific aspects thereof are not limited in any manner. For example, the width of the removal region E as information on the position of the circumferential edge of the effective region R may be input to the controller 9 by the user via the input unit and set. Furthermore, for example, at the time of alignment, the width of the removal region E as information on the position of the circumferential edge of the effective region R may be automatically set in the controller 9 based on the image captured by the alignment camera 110. In this manner, the trimming processing according to one aspect is implemented.

The configurations in the embodiments and the modification examples described above are not limited to the materials and shapes described above, and various materials and shapes may be applied. The configurations in the embodiments or the modification examples described above can be randomly applied to the configuration in another embodiment or modification examples.

REFERENCE SIGNS LIST 4 modified region
4A first modified region (modified region)
4B second modified region (modified region)
4C third modified region (modified region)
4D fourth modified region (modified region)
4J modified region
9 controller
10A first laser processing head
100 target
100d center region
100e main region
101, 410, 500, 600, 700, 800, 1000, 1100, 1200, 1300, 1400 laser processing apparatus
106A First Z-axis rail (first vertical movement mechanism, vertical movement mechanism)
106B Second Z-axis rail (second vertical movement mechanism, vertical movement mechanism)
107, 607 stage (support portion)
108 X-axis rail (first horizontal movement mechanism, second horizontal movement mechanism, horizontal movement mechanism)
109 Y-axis rail (horizontal movement mechanism)
G1 first region
G2 second region
C rotation axis (axis)
E removal region
L1 first laser light (laser light)
L2 second laser light (laser light)
M1 virtual plane
P1 first focusing point (focusing point)
P2 second focusing point (focusing point)
R effective region
SA first modified spot (modified spot)
SB second modified spot (modified spot)

The invention claimed is:

1. A laser processing apparatus comprising:
a support portion on which a target is placed, the support portion being rotatable about an axis along a vertical direction;
a laser processing head configured to irradiate the target placed on the support portion with a laser light, to form a modified region in the target;
a vertical movement mechanism configured to move at least one of the support portion and the laser processing head to move a focusing point of the laser light along the vertical direction;
a horizontal movement mechanism configured to move at least one of the support portion and the laser processing head to move the focusing point along a horizontal direction; and
a controller configured to control, based on rotation information on a rotation amount of the support portion, rotation of the support portion, emission of the laser light from the laser processing head, and movement of the focusing point, wherein
the controller performs a circumferential edge process in which starting and stopping of the emission of the laser light from the laser processing head is controlled based on the rotation information with the focusing point positioned at a position along a circumferential edge of an effective region in the target while rotating the support portion, to form the modified region along the circumferential edge of the effective region in the target, the circumferential edge process being a process in trimming processing.

2. The laser processing apparatus according to claim 1, wherein in the circumferential edge process, the emission of the laser light from the laser processing head starts after the horizontal movement mechanism has been driven to position the focusing point at a position on an inner side of an outer edge of the target.

3. The laser processing apparatus according to claim 1, wherein the circumferential edge process includes a process of achieving a state where the emission of the laser light is stopped at least when the support portion makes a single turn after the emission of the laser light has started.

4. The laser processing apparatus according to claim 1, wherein the controller is configured to be capable of setting information on a position of the circumferential edge of the effective region in the target.

5. The laser processing apparatus according to claim 1, wherein in the circumferential edge process, the emission of the laser light from the laser processing head is started and stopped in a state where a rotation speed of the support portion is constant.

6. The laser processing apparatus according to claim 1, wherein the circumferential edge process includes a first orbit process in which the laser light is emitted with the focusing point of the laser light positioned at a predetermined position in the vertical direction while rotating the support portion, and the emission of the laser light stops when the support portion makes a single turn after the emission of the laser light has started, to form the modified region in an annular shape along the circumferential edge of the effective region.

7. The laser processing apparatus according to claim 6, wherein the first orbit process includes at least one of a first process of forming the modified region in an annular shape along a circumferential edge of the effective region on an opposite side of a laser light incident side in the vertical direction, and a second process of forming the modified region in an annular shape along a circumferential edge of the effective region on the laser light incident side in the vertical direction.

8. The laser processing apparatus according to claim 6, wherein the circumferential edge process includes a helix process in which the focusing point is moved in the vertical direction while rotating the support portion, to form the modified region in a helical shape along a circumferential edge between one side and another side of the effective region in the vertical direction.

9. The laser processing apparatus according to claim 6, wherein
the laser processing head includes a plurality of the laser processing heads,
the circumferential edge process includes a second orbit process of irradiating the target with the laser light from each of the plurality of laser processing heads while rotating the support portion, to form the modified region in an annular shape along the circumferential edge of the effective region, and
in the second orbit process, the focusing points of the plurality of laser lights are positioned at a same position in the vertical direction, and starting and stopping of emission of the laser lights from the plurality of laser processing heads are controlled to avoid overlapping of a plurality of the modified regions formed by the emission of the plurality of laser lights.

10. The laser processing apparatus according to claim 6, wherein
the laser processing head includes a plurality of the laser processing heads,
the plurality of laser processing heads at least include a first laser processing head configured to irradiate the target with a first laser light and a second laser processing head configured to irradiate the target with a second laser light,
the circumferential edge process includes:
a process of emitting the first laser light with a first focusing point of the first laser light positioned at a first position in the vertical direction while rotating the support portion, and of stopping the emission of the first laser light when the support portion makes a single turn after the emission of the first laser light has started, to form the modified region in an annular shape along the circumferential edge of the effective region; and
a process of emitting the second laser light with a second focusing point of the second laser light positioned at a second position, more on a laser light incident surface side than the first position, in the vertical direction while rotating the support portion, and stopping the emission of the second laser light when the support portion makes a single turn after the emission of the second laser light has started, to form the modified region in an annular shape along the circumferential edge of the effective region,
the second focusing point of the second laser light is separated from the first focusing point of the first laser light, by a predetermined angle in a forward direction in a rotation direction of the support portion, and
the emission of the second laser light starts after the support portion has rotated by the predetermined angle after the emission of the first laser light has started.

11. The laser processing apparatus according to claim 1, wherein the controller performs a removal process of irradiating a removal region in the target more on an outer side than the effective region with the laser light and moving the focusing point of the laser light without rotating the support portion, to form the modified region in the removal region.

12. The laser processing apparatus according to claim 1, wherein the controller performs a removal process of irradiating a removal region in the target more on an outer side than the effective region with the laser light and moving the focusing point of the laser light while rotating the support portion, to form the modified region in the removal region.

13. The laser processing apparatus according to claim 11, wherein in the removal process, the emission of the laser light from the laser processing head is started and stopped in a state where a movement speed of the focusing point of the laser light is constant.

14. The laser processing apparatus according to claim 11, wherein in the removal process, the focusing point of the laser light is moved in a direction away from or toward a center of the target.

* * * * *